United States Patent
Kim et al.

(10) Patent No.: US 11,600,639 B2
(45) Date of Patent: Mar. 7, 2023

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Young-Hun Kim, Seoul (KR); Jae-Seok Yang, Hwaseong-si (KR); Hae-Wang Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/087,321

(22) Filed: Nov. 2, 2020

(65) Prior Publication Data

US 2021/0074729 A1    Mar. 11, 2021

Related U.S. Application Data

(63) Continuation of application No. 16/270,214, filed on Feb. 7, 2019, now abandoned.

(30) Foreign Application Priority Data

Aug. 2, 2018 (KR) .......................... 10-2018-0090472

(51) Int. Cl.
*H01L 27/118* (2006.01)
*H01L 21/8238* (2006.01)
*H01L 27/02* (2006.01)

(52) U.S. Cl.
CPC .................. *H01L 27/11807* (2013.01); *H01L 21/823814* (2013.01); *H01L 21/823878* (2013.01); *H01L 27/0207* (2013.01); *H01L 2027/11829* (2013.01); *H01L 2027/11861* (2013.01); *H01L 2027/11864* (2013.01); *H01L 2027/11881* (2013.01)

(58) Field of Classification Search
CPC ..... H01L 21/823814; H01L 21/823878; H01L 27/11807; H01L 27/0207; H01L 2027/11829; H01L 2027/11861; H01L 2027/11864; H01L 2027/11881
See application file for complete search history.

(56) References Cited

U.S. PATENT DOCUMENTS

| | | | |
|---|---|---|---|
| 7,157,768 B2 | 1/2007 | Hofmann et al. | |
| 7,352,037 B2 | 4/2008 | Kim et al. | |
| 7,723,780 B2 | 5/2010 | Kakoschke et al. | |
| 8,581,003 B2 | 11/2013 | Kawa et al. | |

(Continued)

FOREIGN PATENT DOCUMENTS

KR    10-2017-0042088    4/2017

*Primary Examiner* — Jay C Kim
(74) *Attorney, Agent, or Firm* — F. Chau & Associates, LLC

(57) ABSTRACT

A semiconductor device includes a substrate having cell areas and power areas that are alternately arranged in a second direction. Gate structures extend in the second direction. The gate structures are spaced apart from each other in a first direction perpendicular to the second direction. Junction layers are arranged at both sides of each gate structure. The junction layers are arranged in the second direction such that each of the junction layer has a flat portion that is proximate to the power area. Cutting patterns are arranged in the power areas. The cutting patterns extend in the first direction such that each of the gate structures and each of the junction layers in neighboring cell areas are separated from each other by the cutting pattern.

19 Claims, 86 Drawing Sheets

(56) References Cited

U.S. PATENT DOCUMENTS

| | | |
|---|---|---|
| 8,911,736 B2 | 12/2014 | Zang et al. |
| 9,331,074 B1 | 5/2016 | Chang et al. |
| 9,373,641 B2 | 6/2016 | Anderson et al. |
| 9,520,482 B1 | 12/2016 | Chang et al. |
| 9,601,567 B1 | 3/2017 | Hsieh |
| 9,653,579 B2 | 5/2017 | Liu et al. |
| 9,704,860 B1 | 7/2017 | Balakrishnan et al. |
| 9,806,106 B2 | 10/2017 | Myung et al. |
| 9,826,975 B2 | 11/2017 | Song et al. |
| 9,837,437 B2 | 12/2017 | Baek et al. |
| 9,904,758 B2 | 2/2018 | Berzins et al. |
| 9,905,561 B2 | 2/2018 | Kim et al. |
| 9,947,592 B2 | 4/2018 | Deng et al. |
| 9,984,076 B2 | 5/2018 | Yu et al. |
| 9,966,376 B2 | 8/2018 | Kim et al. |
| 10,083,961 B2 | 9/2018 | Bergendahl et al. |
| 10,090,402 B1 | 10/2018 | Park et al. |
| 10,115,722 B2 | 10/2018 | Oh et al. |
| 10,176,995 B1 | 1/2019 | Wu et al. |
| 10,269,802 B2 | 4/2019 | Lin |
| 10,319,720 B2 | 6/2019 | Choi et al. |
| 10,354,997 B2 | 7/2019 | Fan et al. |
| 10,373,879 B2 | 8/2019 | Yu et al. |
| 10,483,389 B2 | 11/2019 | Yen et al. |
| 10,490,458 B2 | 11/2019 | Perng et al. |
| 10,497,778 B2 | 12/2019 | Ching et al. |
| 10,504,798 B2 | 12/2019 | Xie et al. |
| 10,505,546 B2 | 12/2019 | Song et al. |
| 10,553,692 B2 | 2/2020 | Zhou |
| 10,553,700 B2 | 2/2020 | Bao et al. |
| 10,607,696 B2 | 3/2020 | Ragnarsson et al. |
| 10,636,886 B2 | 4/2020 | Jo et al. |
| 2012/0012937 A1 | 1/2012 | Chew et al. |
| 2014/0319623 A1 | 10/2014 | Tsai et al. |
| 2016/0058181 A1 | 3/2016 | Anderson et al. |
| 2016/0133632 A1 | 5/2016 | Park et al. |
| 2016/0181425 A1 | 6/2016 | Bai et al. |
| 2016/0233298 A1 | 8/2016 | Webb et al. |
| 2016/0247728 A1 | 8/2016 | You et al. |
| 2016/0300948 A1 | 10/2016 | Yang et al. |
| 2016/0335183 A1 | 11/2016 | Yuan et al. |
| 2017/0062403 A1 | 3/2017 | Song et al. |
| 2017/0084723 A1 | 3/2017 | Greene et al. |
| 2017/0133379 A1 | 5/2017 | Kim et al. |
| 2017/0148682 A1 | 5/2017 | Basker et al. |
| 2017/0229456 A1 | 8/2017 | Sharma et al. |
| 2018/0261514 A1 | 9/2018 | Xie et al. |
| 2019/0165137 A1 | 5/2019 | Chen et al. |
| 2019/0189452 A1 | 6/2019 | Chung et al. |
| 2019/0393205 A1 | 12/2019 | Lee et al. |
| 2020/0043945 A1 | 2/2020 | Kim et al. |

SEMICONDUCTOR DEVICE AND METHOD OF MANUFACTURING THE SAME

CROSS-REFERENCE TO RELATED APPLICATIONS

This application is a Continuation of co-pending U.S. patent application Ser. No. 16/270,214, filed on Feb. 7, 2019, which claims priority under 35 U.S.C § 119 to Korean Patent Application No. 10-2018-0090472, filed on Aug. 2, 2018 in the Korean Intellectual Property Office, the disclosure of which is incorporated by reference herein in its entirety

TECHNICAL FIELD

The present disclosure relates to a semiconductor device, and more particularly, to a semiconductor device and a method of manufacturing the same.

DISCUSSION OF THE RELATED ART

A logic device is a semiconductor device designed to perform a particular task. A logic device may be designed by combining a plurality of ready-made standard cells that each perform a limited number of logic functions.

Each standard cell is an integrated circuit (IC) module that may be optimized for specific requirements and functions. Standard cells may include a basic cell such as a boolean logic function (e.g. AND, OR, NOR, inverters), a complex cell having a plurality of basic cells such as an OAI cell (OR/AND/inverter) and an AOI cell (AND/OR/inverter), and a storage element such as a master-slave flip flop and a latch. The logic device is made up of the basic cell, the complex cell, and the storage element that are optimally selected to perform a specific function.

Over time, the size of the standard cell has been reduced and the degree of integration of the standard cell has been increased. Accordingly, the density of the logic device has been increased. For example, the fin FET and the buried transistor structure have been applied to the standard cell for minimizing the short channel effect and providing various other process improvements such as to line edge roughness (LER). The LER may prevent an electric short between neighboring patterns in spite of the reduction of the critical dimension (CD).

For example, some of the circuit lines of the recent standard cells tend to extend to the power area from the cell area, so that the integrated circuits are arranged in a portion of the power area and in the cell area and the density of the circuit lines are increased within the same size of the standard cell.

However, since the neighboring cells are electrically separated by the power area, the reduction of the power area tends to cause an electric short between the neighboring cells. Accordingly, standard cells of a reduced size may be more susceptible to electric short between the neighboring cells therein.

SUMMARY

A semiconductor device includes a substrate having a plurality of cell areas and a plurality of power areas such that each of the plurality of cell areas are alternately arranged with each of the plurality of power areas, in a second direction. A plurality of gate structures extends in the second direction. Each of the plurality of gate structures is spaced apart from each other in a first direction that is substantially perpendicular to the second direction. A plurality of junction layers is arranged at both sides of each of the plurality of gate structures and is arranged in the second direction in such a configuration that each of the plurality of junction layer has a flat portion that is proximate to the power area. A plurality of cutting patterns is arranged in the plurality of power areas and the plurality of cutting patterns extends in the first direction such that each of the plurality of gate structures and each of the plurality of junction layers in neighboring cell areas of the plurality of cell areas are separated from each other by the cutting pattern.

A method of manufacturing a semiconductor device includes forming a plurality of active fins in at least a pair of cell areas extending in a first direction. The pair of cell areas are separated from each other by a power area. A plurality of dummy gate structures and a plurality of gap fill patterns are formed to a line shape extending in a second direction, substantially perpendicular to the first direction, such that each of the plurality of dummy gate structures and each of the plurality of gap fill patterns covers the plurality of active fins, alternately with respect to each other in the first direction. A cutting pattern is formed in the power area in a line shape extending in the first direction such that the plurality of dummy gate structures and the plurality of gap fill patterns are separated from each other by a unit of a cell area of the at least the pair of cell areas. A junction layer is formed in a gap space between neighboring dummy gate structures, of the plurality of dummy gate structures, such that the junction layer makes contact with the plurality of active fins in the at least the pair of cell areas and has a flat portion making contact with the cutting pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
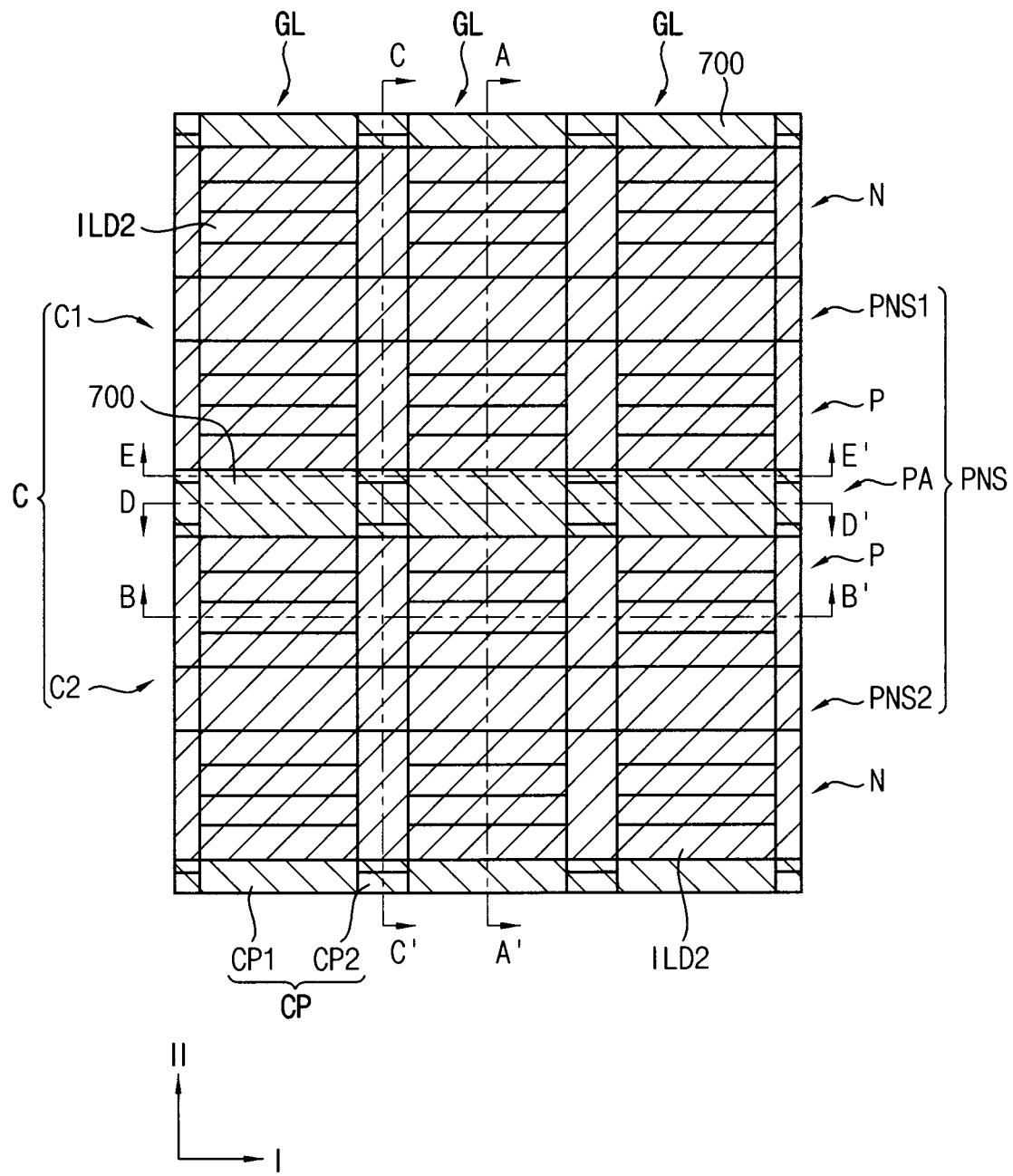
FIG. 1 is a plan view illustrating a semiconductor device in accordance with an exemplary embodiment of the present inventive concept.

Reference will now be made to exemplary embodiments, which are illustrated in the accompanying drawings, wherein like reference numerals may refer to like components throughout the specification and the drawings.

FIG. 1 is a plan view illustrating a semiconductor device in accordance with an exemplary embodiment of the present inventive concept. FIGS. 2A to 2E are cross sectional views cut along lines A-A', B-B', C-C', D-D' and E-E' of the semiconductor device in FIG. 1, respectively.

Figure 2A:
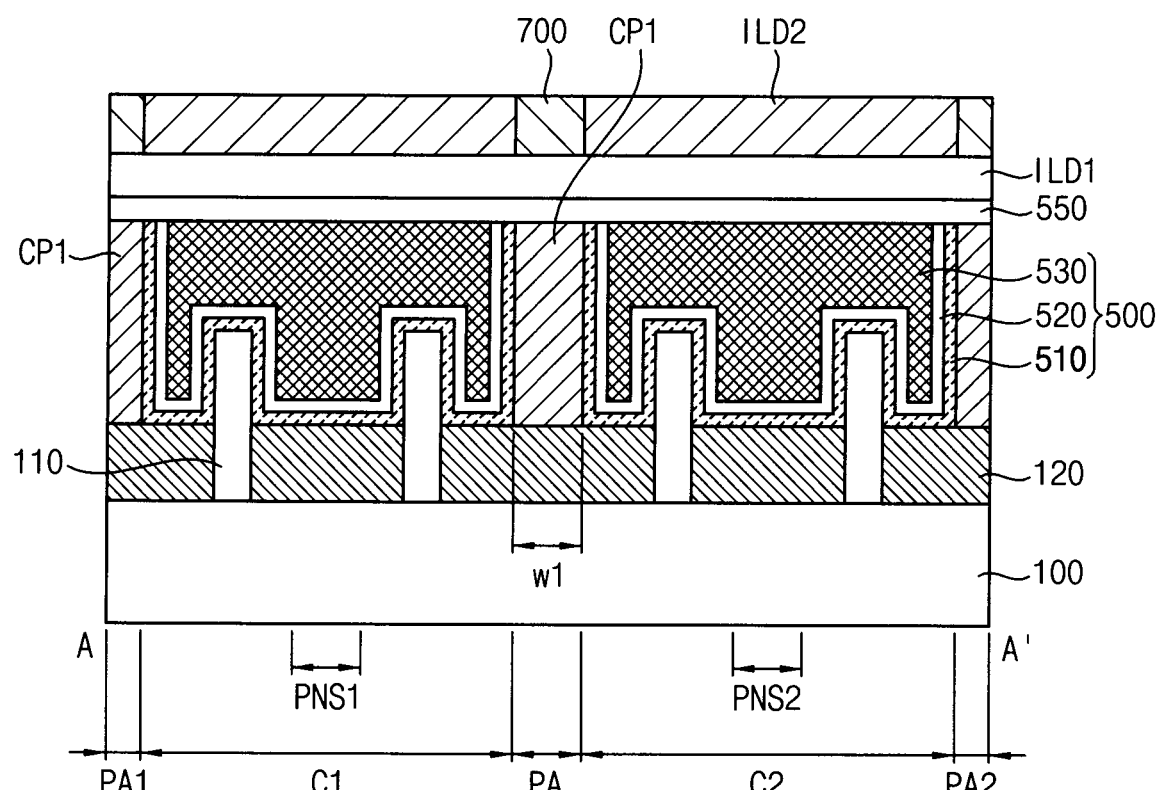
FIGS. 2A to 2E are cross sectional views cut along lines A-A', B-B', C-C', D-D' and E-E' of the semiconductor device depicted in FIG. 1, respectively.
Figure 2B:
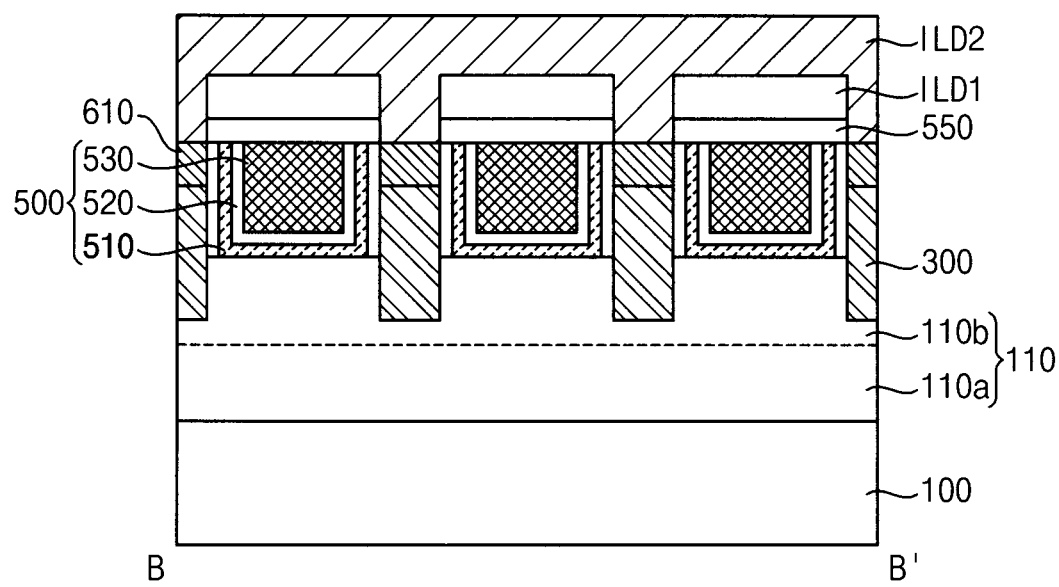
Figure 2C:
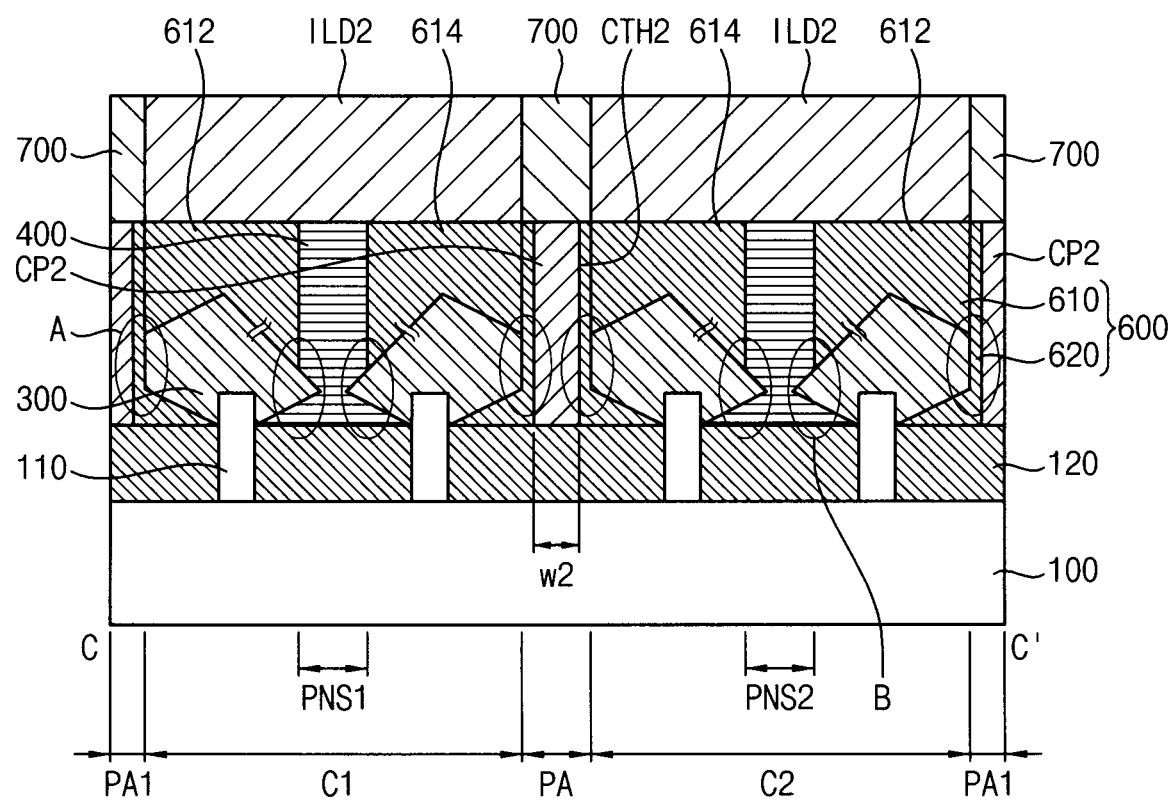
Figure 2D:
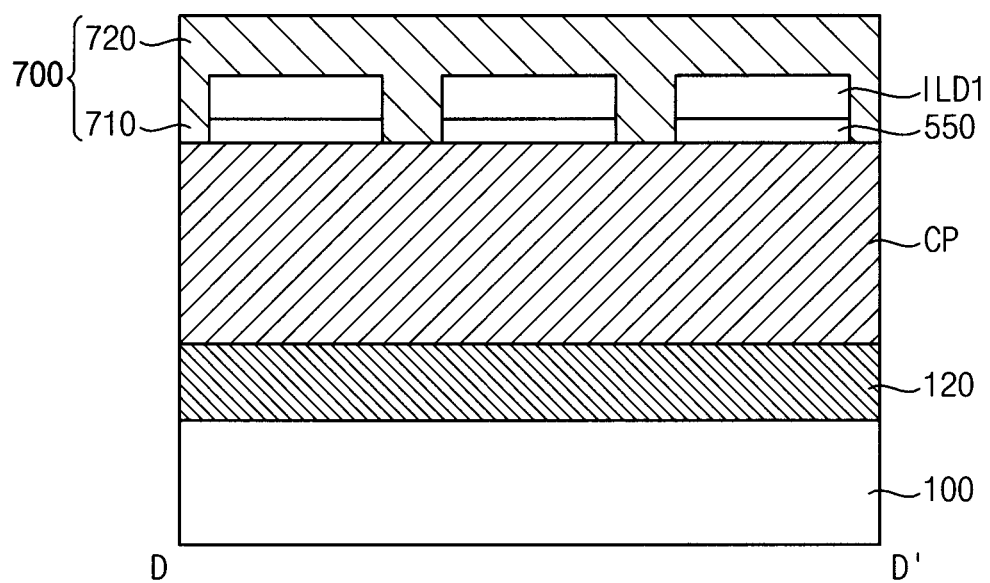
Figure 2D:
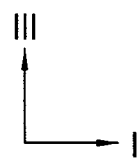
Figure 2E:
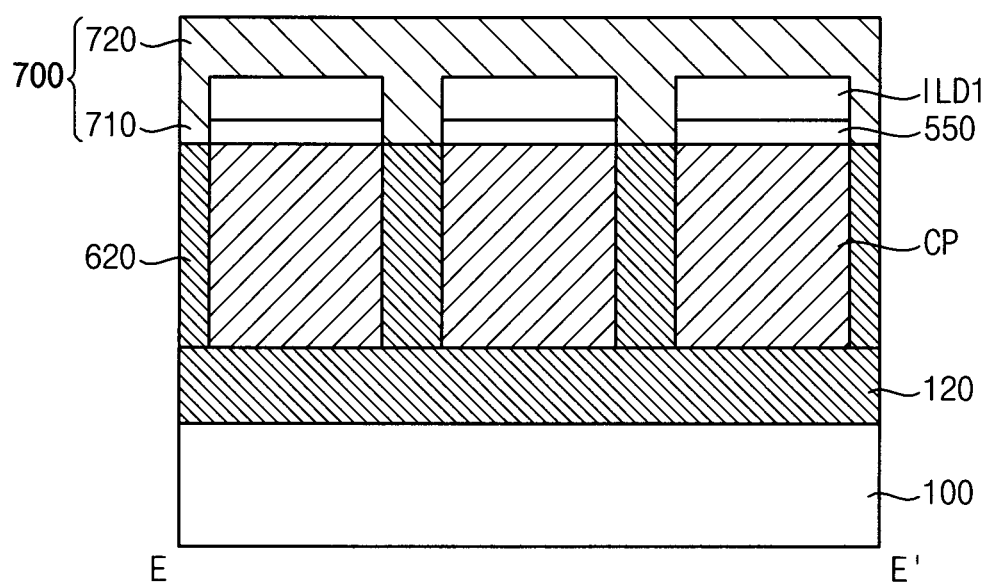

Referring to FIGS. 1 to 2E, a semiconductor device, in accordance with an exemplary embodiment of the present inventive concept, may include a substrate 100 having a plurality of cell areas C and a plurality of power areas PA such that the cell areas C and the power areas PA may be alternately arranged in a second direction II. A plurality of gate structures 500 extends in the second direction II and are spaced apart from each other in a first direction I, which is substantially perpendicular to the second direction II. A plurality of junction layers 300 is arranged at both sides of the gate structures 500 and is arranged in the second direction II in such a configuration that each of the plurality of junction layer 300 may have a flat portion A around the power area PA. A plurality of cutting patterns CP is arranged in the power areas PA and these cutting patterns CP extend in the first direction I such that the gate structures 500 and the junction layers 300 in neighboring cell areas may be separated from each other by the cutting pattern CP.

For example, the substrate 100 may include a bulk substrate, e.g., a silicon (Si) substrate, a germanium (Ge) substrate, a silicon germanium (Si—Ge) substrate, a gallium phosphorus (Ga—P) substrate, a gallium arsenide (Ga—As) substrate, a silicon antimony (Si—Sb) substrate. The substrate 100 may alternatively include a multilayered substrate, e.g., a semiconductor on insulator (SOI) substrate, a germanium on insulator (GOI) substrate.

The substrate 100 may include a plurality of cell areas C in which a plurality of cell transistors may be arranged and a power area PA in which a power rail 700 may be arranged. Hereinafter, the neighboring cell areas around the power area PA may be referred to as a first cell area C1 and a second cell area C2, and the first and the second cell areas C1 and C2 may be separated from each other by the power area PA.

According to an exemplary embodiment, each of the cell areas C may be divided into a PMOS area P and an NMOS area N that may be separated from each other by a separation area PNS. Thus, a plurality of PMOS transistors and NMOS transistors may be arranged in the cell area C and the PMOS transistor and the NMOS transistor may be separated from each other by the separation area PNS, so that CMOS transistors may be arranged in the cell areas C. Hereinafter, the separation area PNS in the first cell area C1 may be referred to as first separation area PNS1 and the separation area PNS in the second cell area C2 may be referred to as second separation area PNS2.

A plurality of active fins 110 may be arranged in the cell area C. The active fin 110 may extend in the first direction I and neighboring active fins 110, of the plurality of active fins 110, may be spaced apart from each other in the second direction II. The active fin 110 may protrude from a device isolation layer 120, so the active fin 110 may be divided into a lower fin 110a that may be at least partially enclosed with the device isolation layer 120 and an upper fin 110b that may extend from the device isolation layer 120. For example, a field area of the substrate 100 may be at least partially covered with the device isolation layer 210 and an active area of the substrate 100 may be provided as the active fin 110 protruded from the device isolation layer 120.

A gate structure 500 may be arranged on each active fin 110 and a plurality of the gate structures 500 along the second direction II may be formed into a gate line GL. A plurality of the gate lines GL may be spaced apart by the same gap distance in the first direction I. A side surface of the gate line GL may be at least partially covered by a gate spacer 240 that may be shaped into a line in the second direction II.

For example, the gate line GL may discontinuously extend in the second direction II by the power area PA. For example, the gate line GL may extend in the first cell area C1 along the second direction II and may be broken or otherwise not arranged in the power area PA. The gate line GL may also extend in the second cell area C2 along the second direction II.

Thus, the gate line GL may be arranged exclusively in the cell area C and the gate line GL in the first cell area C1 may be symmetrical with the gate line GL in the second cell area C2 with respect to a gate cutting pattern CP. The gate structure 500 and the active fin 110 may individually function as a gate electrode of a cell transistor in the cell area C.

The cutting pattern CP may include an insulation material such as silicon nitride (SiN), so the gate structures 500 in the first cell area C1 may be electrically separated from the gate structures 500 in the second cell area C2 by the cutting pattern CP. For example, the gate structures 500 in the first cell area C1 may be separated from the gate structures 500 in the second cell area C2 by the power area PA.

In an exemplary embodiment, the gate structure 500 may include a gate insulation pattern 510, a work function control pattern 520 and a gate electrode 530 that may be sequentially stacked on the active fin 110 and the device isolation layer 120 and may be defined by the gate spacer 240. A gate trench defined by the work function control pattern 520 may extend in the second direction II and the gate electrode 530 may fill up the gate trench. A gate signal may be transferred to the semiconductor device via the gate structure 500.

A junction layer 300 may be arranged at both sides of the gate structure 500. A space between the neighboring gate spacers 240 may be provided as an inter-space trench. IST in the cell area C, and the junction layer 300 may be grown on the active fin 110 in the inter-space trench IST. For example, when the neighboring active fins 110 may be closely arranged in the inter-space trench IST, the junction layers 300 on the neighboring active fins 110 may be connected with each other just like a line extending in the second direction II in the cell area C.

The junction layer 300 may be grown on the active fin 110 around the gate structure 500 by a selective epitaxial growth (SEG) process, so that an epitaxial pattern may be provided as the junction layer 120. Thus, when the neighboring active fins 110 may be closely arranged in the inter-space trench IST, the epitaxial pattern may be grown in the second direction II and be connected to each other. Thus, the junction layer 300 may be selectively connected to each other and may be provided as a discontinuous line in the cell area C.

For example, the junction layer 300 in the first cell area C1 may also be separated from the junction layer 300 in the second cell area C2 by the power area PA, so that the junction layer 300 in the first cell area C1 and the junction layer 300 in the second cell area C2 may also be separated from each other by the cutting pattern CP in the power area PA.

Therefore, the junction layer 300 in the first cell area C1 and the junction layer 300 in the second cell area C2 do not make contact with each other in the SEG process due to the cutting pattern CP in the power area PA. For example, an electrical short of the junction layer 300 between the first cell area C1 and the second area C2 may be substantially prevented by the cutting pattern CP in the power area PA.

The junction layer 300 around the power area PA may be grown on the active fin 110 horizontally toward the power area PA as well as grown vertically, so the junction layer 300 may also be grown along a side surface of the cutting pattern CP in a third direction III. For example, the growth of the junction layer 300 in the second direction II toward the power area PA may be prohibited by the cutting pattern CP.

Thus, the junction layer 300 around the power area PA may be grown along the side surface of the cutting pattern CP in the third direction III and may have a larger size than the junction layer 300 that is farther from the power area PA. For example, the junction layer 300 around the power area PA may have a flat portion A making contact with the cutting pattern CP and may have a larger size than that of the junction layer 300 that is farther from the cutting pattern CP along the same inter-spacer trench IST.

The large size of the junction layer 300 may reduce the contact resistance of the contact structure 600, and the size of the junction layer 300 may be changed according to the contact resistance. For example, the process conditions of the SEG may be controlled in such a way that the size of the flat portion A of the junction layer 300 may be sufficiently sized to achieve a desired contact resistance.

The junction layer 300 that is farther from the cutting pattern CP may have no growth restrictor such as the cutting pattern CP, so the junction layer 300 that is farther from the cutting pattern CP may be grown horizontally as well as grown vertically without any substantial limitations. Thus, when the neighboring active fins 110 may be sufficiently separated from each other in the second direction or the active fin 110 may be arranged around the separation area PNS, the junction layer 300 may have a point portion B due to the non-restricted isotropic epitaxial growth behavior.

For example, when the neighboring active fins 110 may be closely arranged in the inter-space trench IST, the neighboring junction layer 300 may be bonded to each other in the second direction II due to the horizontal growth of the SEC process. Accordingly, the junction layer 300 may be shaped into a broken line extending in the second direction II.

When the growth restrictor is not be provided in the SEG process, the junction layer 300 might not be grown vertically and may instead be formed to have the point portion B. Thus, the junction layer 300 having the point portion B may have a smaller size that of the junction layer having the flat portion A. Therefore, the closer to the cutting pattern CP the larger the size of the junction layer 300, and the closer to the separation area PNS the smaller the size of the junction pattern 300.

The inter-space trench IST may be filled up with the conductive contact structure 600 making contact with the junction layer 300, so that the contact structure 600 may be shaped into a line extending in the second direction II. Further, the line-shaped contact structure 600 might not be positioned in the separation area PNS, so that the contact structure 600 may be broken in the separation area PNS and may be discontinuous in the cell line C.

The gate structure 500 may be at least partially covered by a gate capping pattern 550 and a first interlayer dielectric pattern ILD1 and the junction layer 300 around the gate structure 500 in the inter-space trench IST may be at least partially covered by the contact structure 600 extending in the second direction II. For example, an upper surface of the contact structure 600 may be substantially coplanar with an upper surface of the gate structure 500 or the gate line GL.

While the gate line GL may be continuous in the cell area C, the contact structure 600 may be separated into an NMOS contact 612 and a PMOS 614 contact by an insulation pattern 400 filling the separation area PNS.

For example, the contact structure 600 may include a cell contact 610 making contact with the junction layer 300 in the cell area C and a power contact 620 making a surface contact with the flat portion of the junction layer 300 in the power area PA. The cell contact 610 and the power contact 620 may be provided in one body. The cell contact 610 may include the NMOS contact and the PMOS contact and may be provided as a contact plug making contact with a single junction layer 300 and may be provided as a contact line making contact with a plurality of the junction layers 300 in the second direction II.

The power contact 620 may make surface contact with the flat portion A of the junction layer 300 and may be positioned in a peripheral portion of the power area PA in such a configuration that the power contact 620 may make surface contact with the side surface of the cutting pattern CP. A peripheral portion of the cutting pattern CP may be removed from the substrate 100 and a second contact hole CTH2 may be provided in such a configuration that the flat portion A of the junction layer 300 and the device isolation layer 120 may be exposed through the second contact hole CTH2. The power contact 620 may be positioned in the second contact hole CTH2 in such a configuration that the power contact 620 may be in contact with the device isolation layer 120 and an upper surface of the power contact 620 may be coplanar with an upper surface of the cutting pattern CP. Since the power contact 620 may make surface contact with the flat portion A of the junction layer 300, the contact resistance between the junction layer 300 and the contact structure 600 may be sufficiently reduced in the semiconductor device.

Thus, the cutting pattern CP may include a gate cutting pattern CP1 cutting the gate line GL in the power area PA and having a first width w1 and a junction cutting pattern CP2 cutting the junction layer 300 in the power area PA and having a second width w2 smaller than the first width w1. The gate cutting pattern CP1 and the junction cutting pattern CP2 may be alternately arranged along the first direction I in the power area PA.

The power contact 620 in the first cell area C1 may be symmetrical with the power contact 620 in the second cell area C2 with respect to the junction cutting pattern CP2, so that the power contact 620 in the first cell area C1 may be substantially prevented from being connected with the power contact 620 in the second cell area C2 by the junction cutting pattern CP2. For example, an electrical short of the junction layer 120 between the first and the second cell areas C1 and C2 may be substantially prevented by the cutting pattern CP in the power area PA.

The cell contact 610 may be separated into the NMOS contact 612 and the PMOS contact 614 by the insulation pattern 400 in the cell area C. Thus, the NMOS contact 612 and the PMOS contact 614 may also be electrically separated from each other by the insulation pattern 400 in the cell area C.

The power contact 620 may be connected to a power rail 700 at least partially covering the power area PA. Since the power rail 700 may be in contact with the upper surface of the cutting pattern CP and the upper surface of the power contact 620 may be coplanar with the upper surface of the cutting pattern CP. The power rail 700 may also be in contact with the power contact 620 at the peripheral portion of the power area PA.

The power rail 700 may include a power plug 710 making contact with the power contact 620 and extending upwards.

The power rail 700 may additionally include a power line 720 making contact with the power plug 710 and extending in the first direction I on the first interlayer dielectric pattern ILD1. In the present exemplary embodiment, the power plug 710 and the power line 720 may be provided in one body.

The power plug 710 may be symmetrically arranged at both sides of the junction cutting pattern CP2 in such a configuration that a lower surface of the power plug 710 may be in contact with the power contact 620 and an upper surface of the power plug 710 may be coplanar with an upper surface of the first interlayer dielectric pattern ILD1. The power line 720 may extend in the first direction I in such a configuration that a lower surface of the power line 720 may be alternately in contact with the power plug 710 and the first interlayer dielectric pattern ILD1 in the power area PA.

When a power signal may be applied to the power rail 700 from an external power source, the power signal may be transferred to the junction layer 300 via the power contact 620. For example, the power signal may be simultaneously transferred to the junction layer 300 of the first cell area C1 and the junction layer 300 of the second cell area C2. Since the power contact 620 in the first cell area C1 may be insulated from the power contact 620 in the second cell area C2 by the junction cutting pattern CP2, the power signal may be individually transferred to the junction layer 300 in both of the first cell area C1 and the second cell area C2.

In addition, since the cell contact 610 may be separated into the NMOS contact 612 and the PMOS contact 614 by the insulation pattern 400 in the cell area C, the power signal may be transferred to one of the NMOS contact 612 and the PMOS contact 614. Thus, the NMOS contact 612 and the PMOS contact 614 in the same cell area C might not simultaneously receive the power signal from the same power rail 700. Some of the power rails 700 may transfer the power signal to the NMOS contact 612 and the rest of the power rails 700 may transfer the power signal to the PMOS contact 614.

In the present exemplary embodiment, a PMOS area P may be arranged around the power rail 700 and an NMOS area N may be arranged apart from the power rail 700 and disposed close to another power rail. Thus, the power signal may be transferred to the PMOS contact 614 through the power rail 700 and transferred to the NMOS contact 612 through another power rail that may be spaced apart from the power rail 700 in the second direction II.

A plurality of the power rails 700 may extend in the first direction I and may be spaced apart from each other in the second direction II. A second interlayer dielectric pattern ILD2 may be filled with the gap space between the neighboring power rails 700, so the neighboring power rails 700 may be insulated from each other by the second interlayer dielectric pattern ILD2.

According to the present exemplary embodiment of the semiconductor device, the gate line GL and the junction layer 300 extending in the second direction II may be cut by the cutting pattern CP that may be arranged in the power area PA, so the gate line GL and the junction layer 300 may be separated by a unit of the cell area C. Thus, the gate line GL and the junction layer 300 in the first cell area C1 may be substantially prevented from being connected to the gate line GL and the junction layer 300 in the second cell area C2. Accordingly, electric short of the gate line GL and the junction layer 300 may be substantially prevented between the first and the second cell areas C1 and C2.

Further, the power contact 620 making contact with the junction layer 300 may be arranged at both sides of the junction cutting pattern CP2 symmetrically with respect to the junction cutting pattern CP2. Thus, the power signal may be individually and independently transferred to the first and second cell areas C1 and C2. For example, the power signal transferred to the PMOS contact 614 in the first cell area C1 may be prevented from leaking to the PMOS contact 614 in the second cell area C2, and the power signal transferred to the PMOS contact 614 in the second cell area C2 may be prevented from leaking to the PMOS contact 614 in the first cell area C1.

In addition, since the power contact 620 may make surface contact with the junction layer 300, the contact resistance between the junction layer 300 and the contact structure 600 may be sufficiently reduced in the semiconductor device.

Accordingly, when the power area PA may be reduced according to the size reduction of the recent semiconductor devices, an electric short of the gate line GL and the junction layer 300 may be substantially prevented or minimized between the neighboring cell areas C that may be separated by the power area PA. For example, an electric short of the transistors between the neighboring cell areas C separated by the power area PA may be substantially prevented by the cutting pattern CA in the power area PA.

While the cutting pattern for preventing the neighboring transistors in different cell areas C may be arranged in the power area PA, an electric shorts of the neighboring transistors may also occur in the same cell area C via the separation area PNS. Thus, the cutting pattern may be further provided in the separation area PNS as well as the power area PA.

Figure 3:
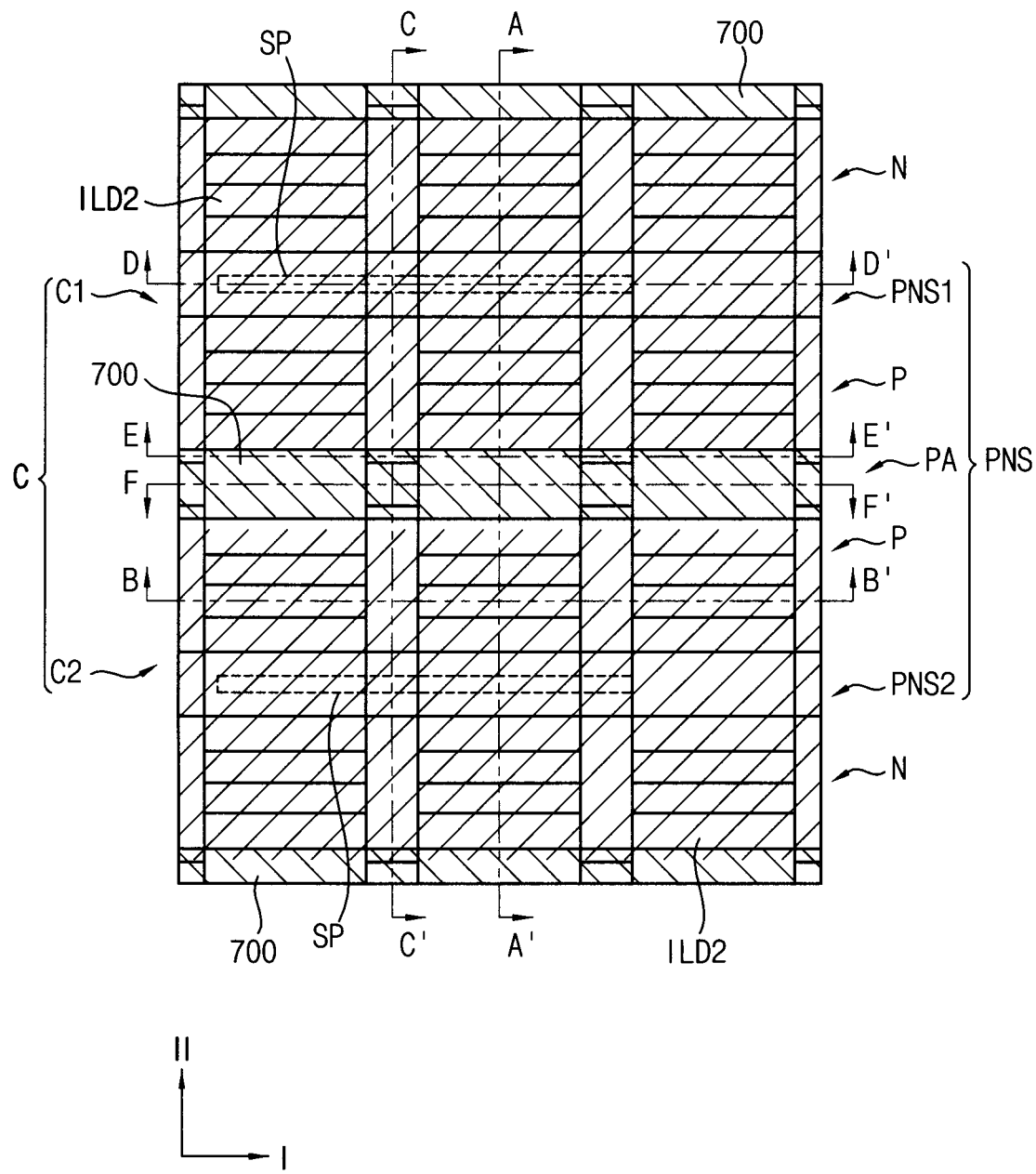
FIG. 3 is a plan view illustrating a semiconductor device in accordance with an exemplary embodiment of the present inventive concept.

FIG. 3 is a plan view illustrating a semiconductor device in accordance with an exemplary embodiment of the present inventive concept. FIGS. 4A to 4F are cross sectional views cut along lines A-A', B-B', C-C', D-D', E-E' and F-F' of the semiconductor device in FIG. 3, respectively. The semiconductor device in FIG. 3 has substantially the same structures as the semiconductor device shown in FIG. 1, except that a separation pattern SP may be further arranged in the separation area PNS in each cell area C. Thus, in FIGS. 3 to 4F, the same reference numerals in FIGS. 1 to 2E may be used to denote the same elements and to the extent that further descriptions of various elements is omitted, it may be assumed that these elements are at least similar to corresponding elements that have already been described.

Figure 4A:
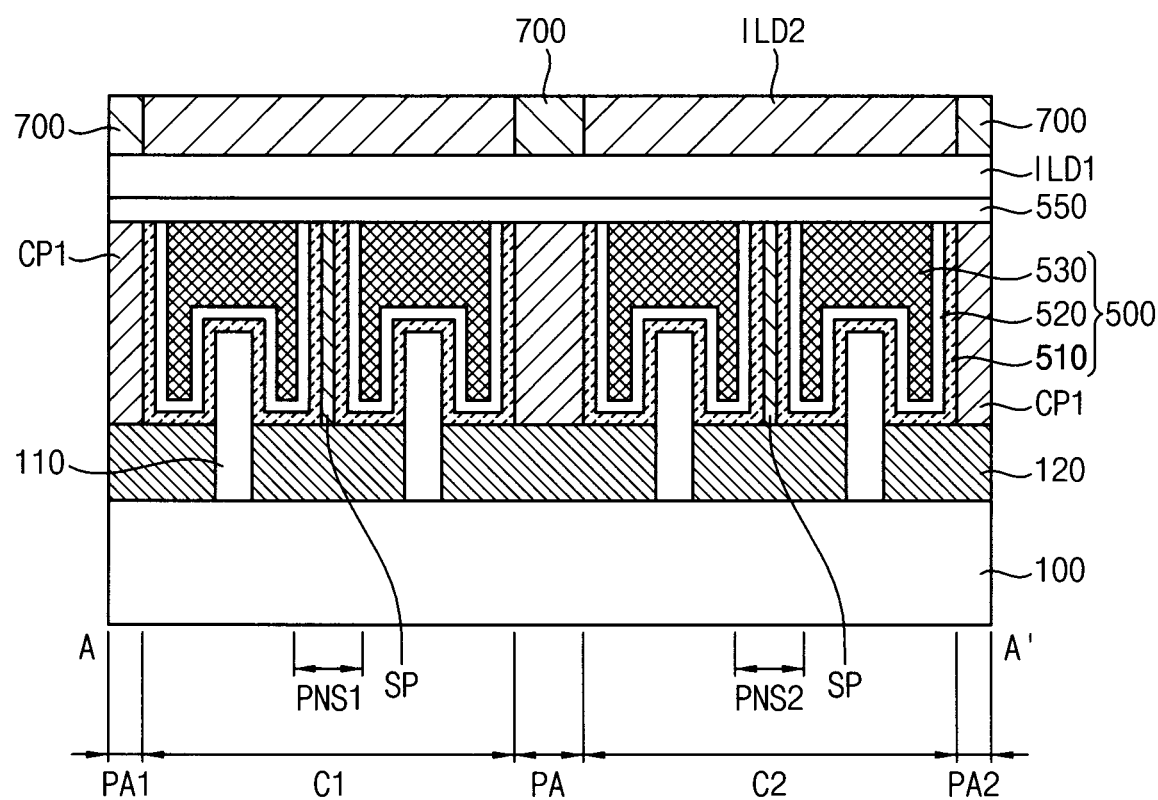
FIGS. 4A to 4F are cross sectional views cut along lines A-A', B-B', C-C', D-D', E-E' and F-F' of the semiconductor device depicted in FIG. 3, respectively.
Figure 4A:
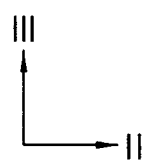
Figure 4B:
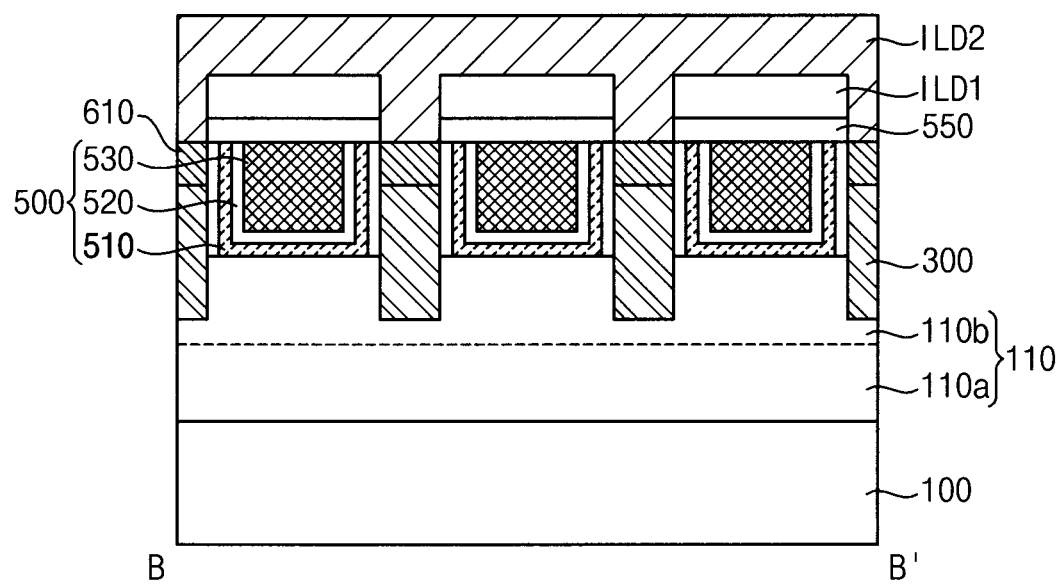
Figure 4B:
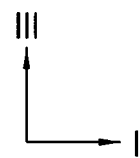
Figure 4C:
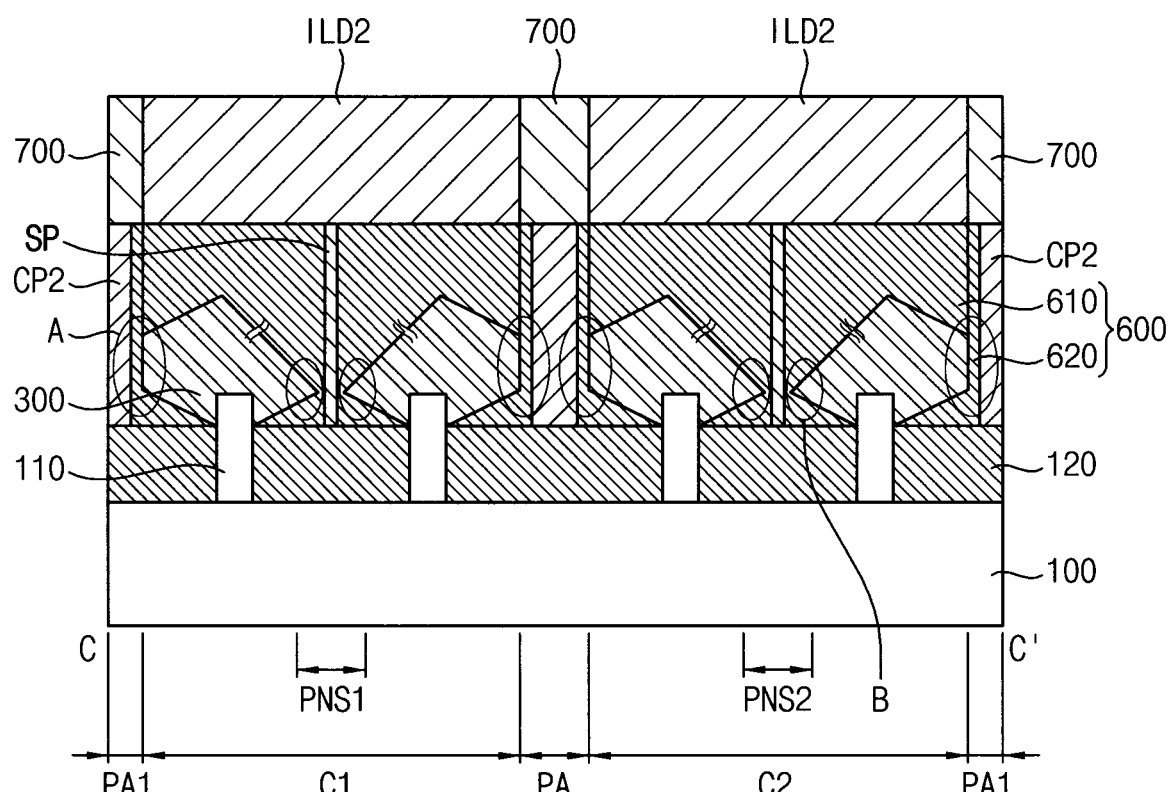
Figure 4D:
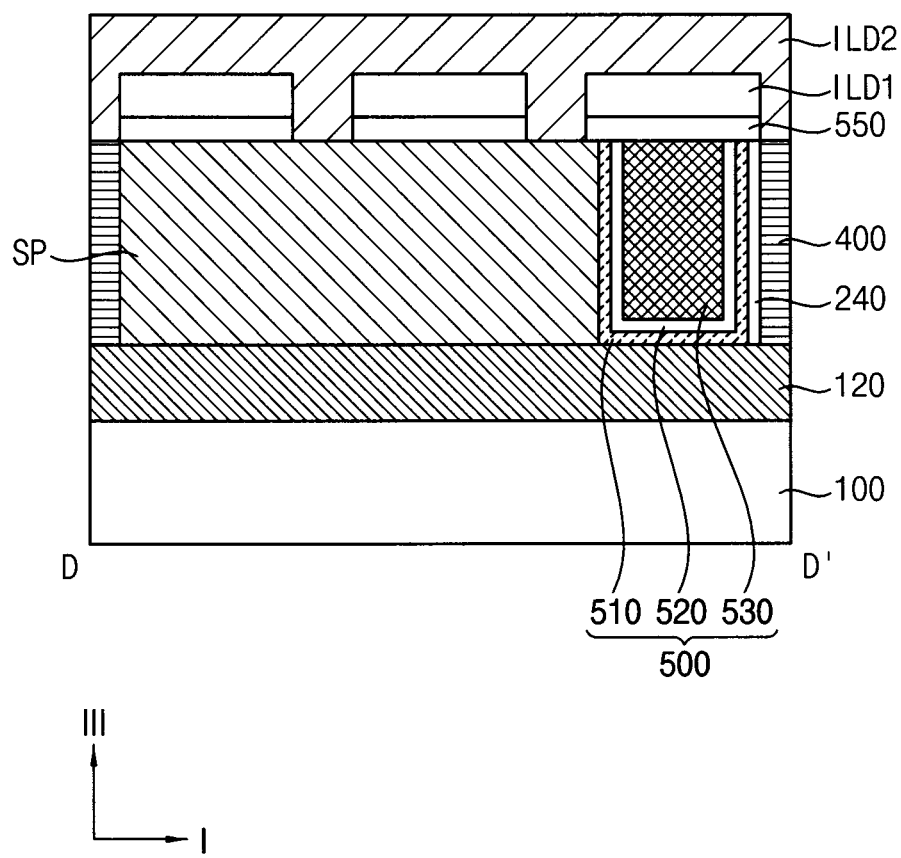
Figure 4E:
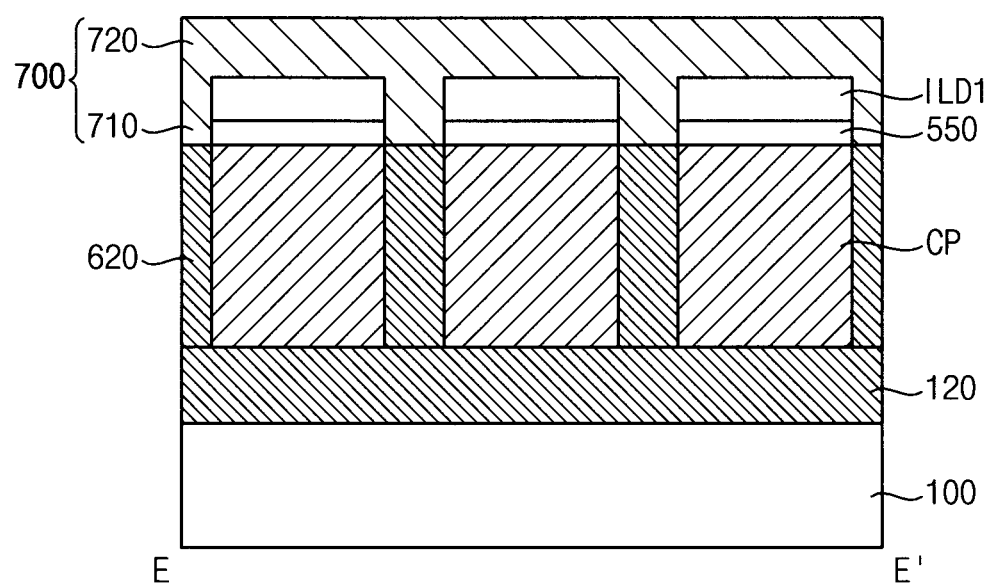
Figure 4F:
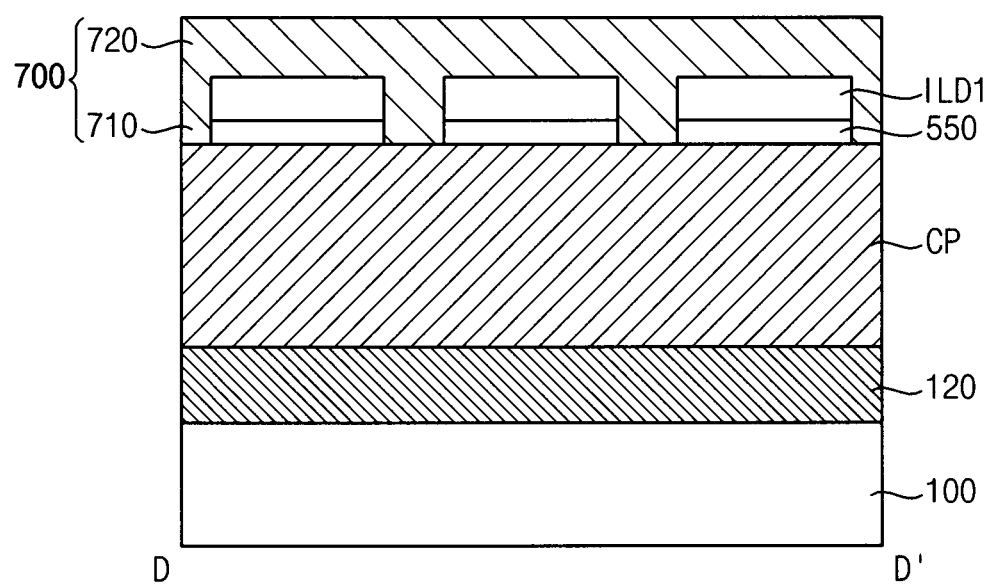

Referring to FIGS. 3 to 4F, a separation pattern 300 may be arranged in the separation area PNS in such a way that the gate line GL and the junction layer 300 in the PMOS area P might not be connected to the gate line GL and the junction layer 300 in the NMOS area N.

Figure 33:
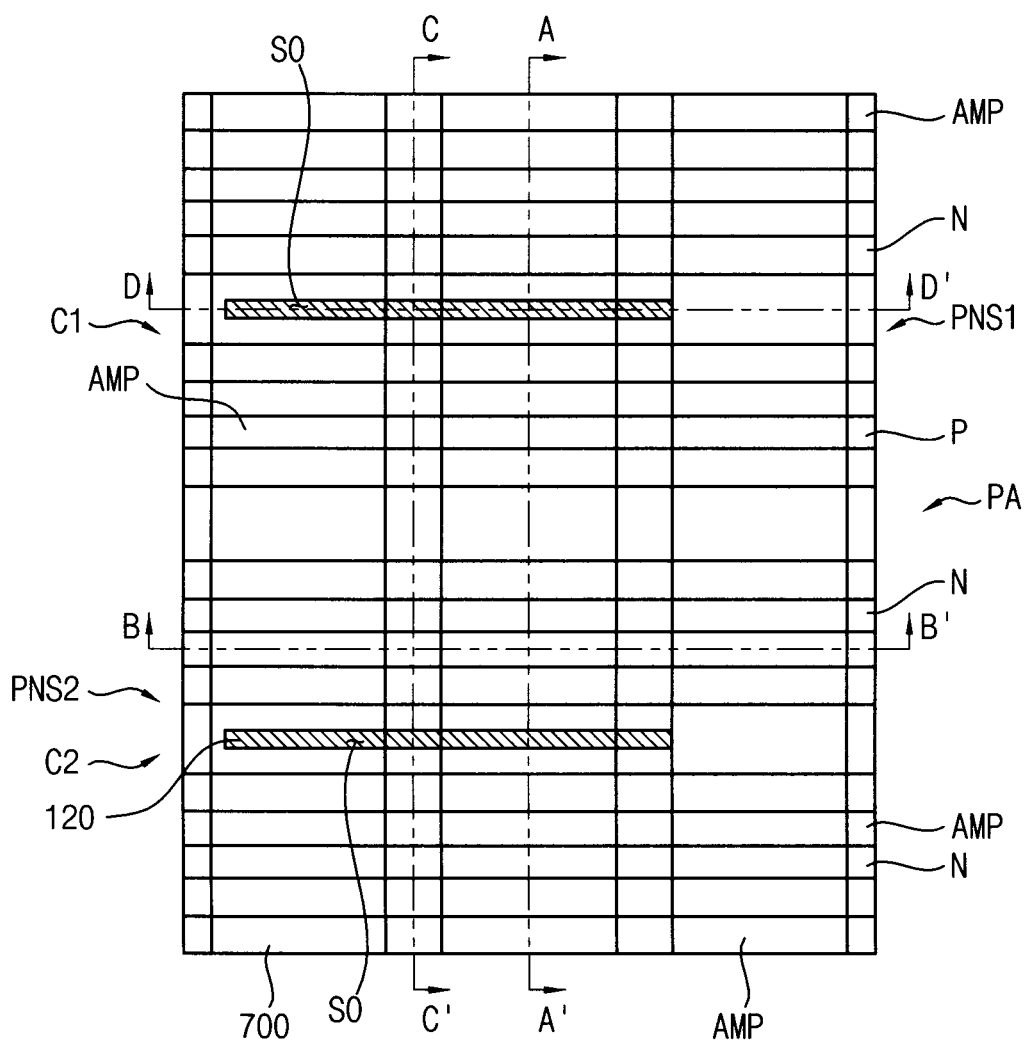
FIGS. 33 to 40F are views illustrating processing steps of a method of manufacturing a semiconductor device in accordance with an exemplary embodiment of the present inventive concept.
Figure 34A:
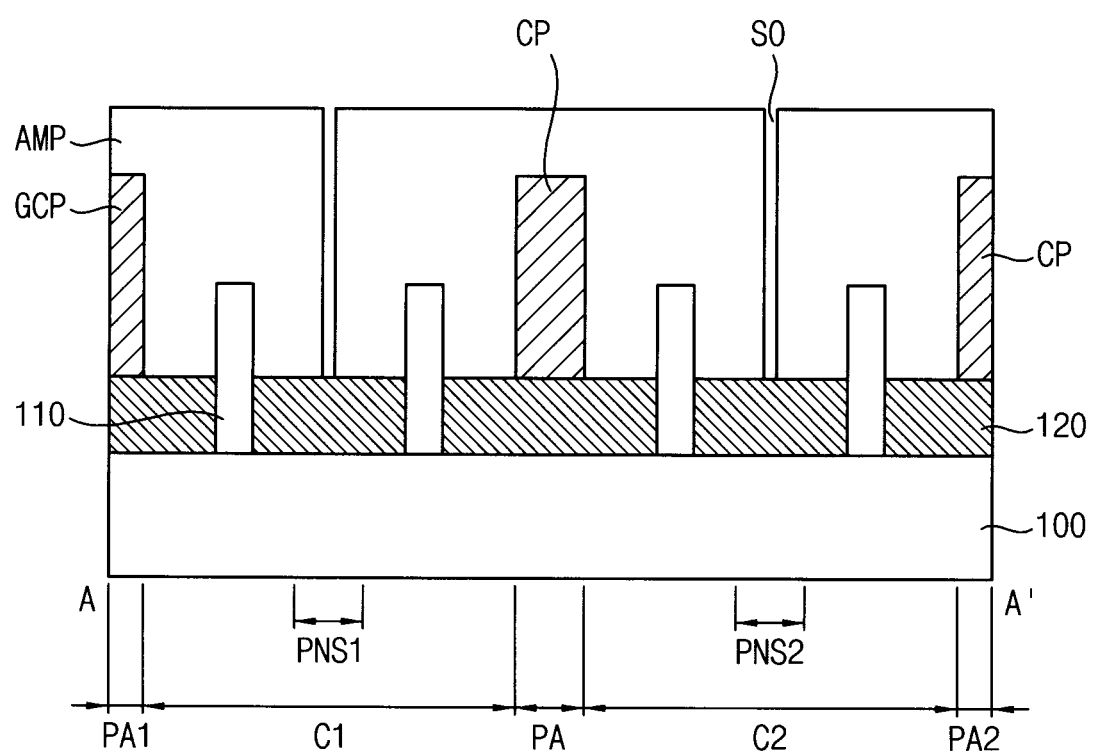
Figure 34B:
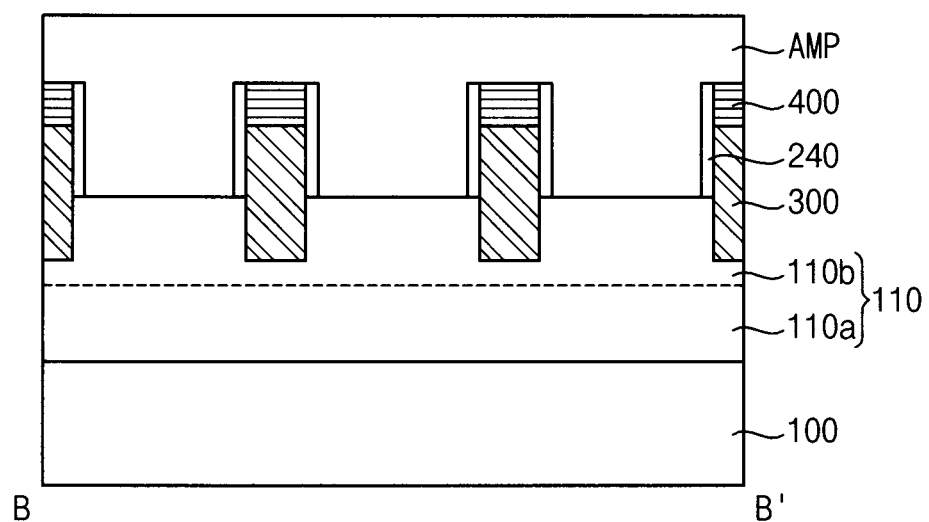
Figure 34B:
Figure 34C:
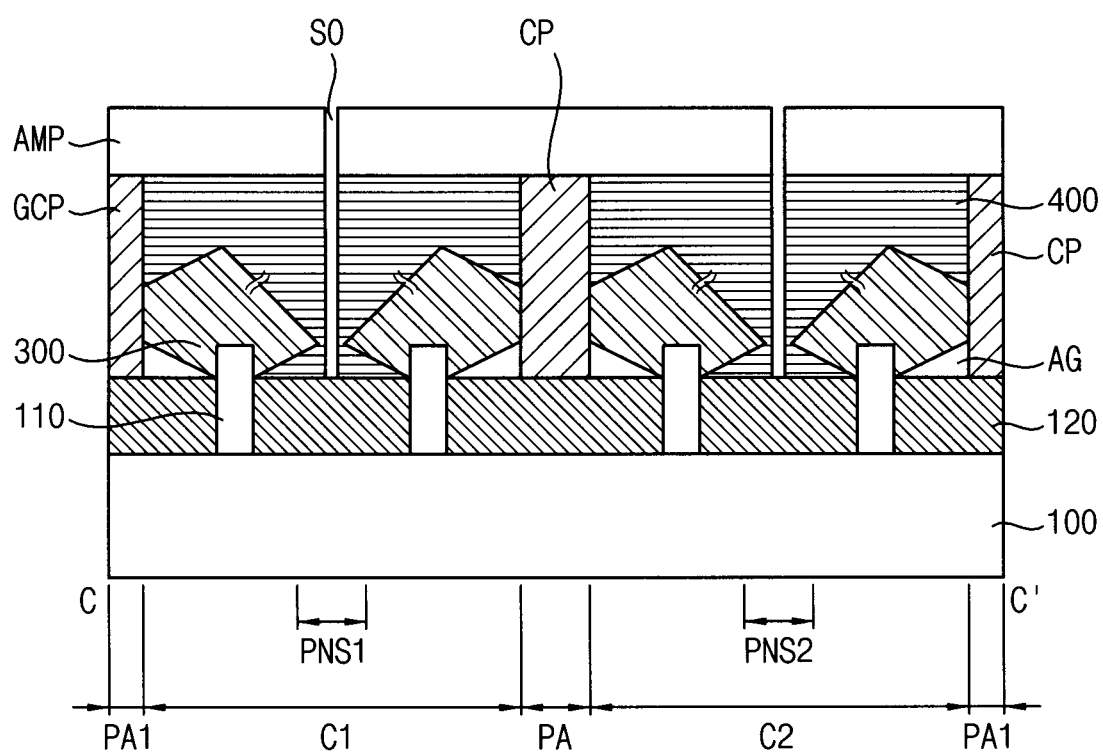
Figure 34D:
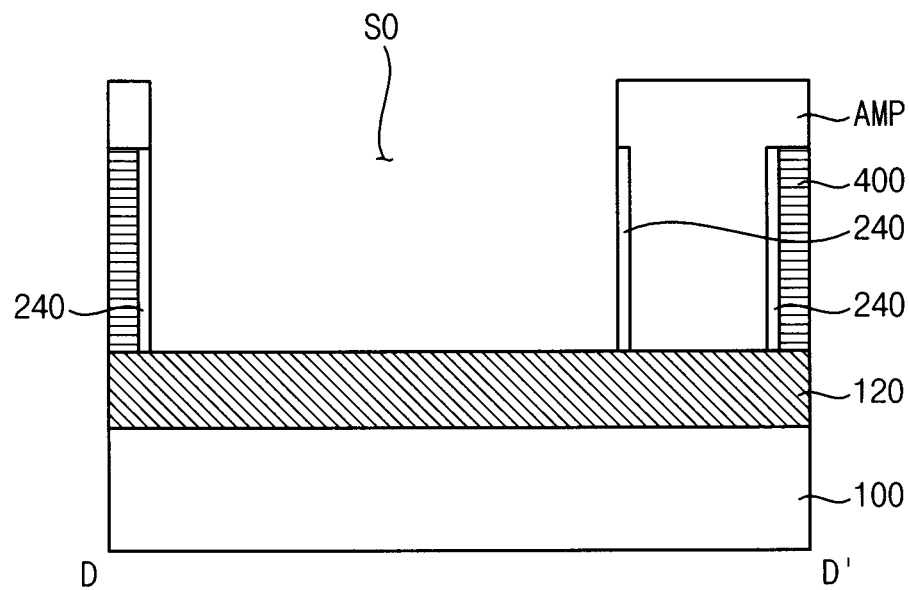
Figure 35:
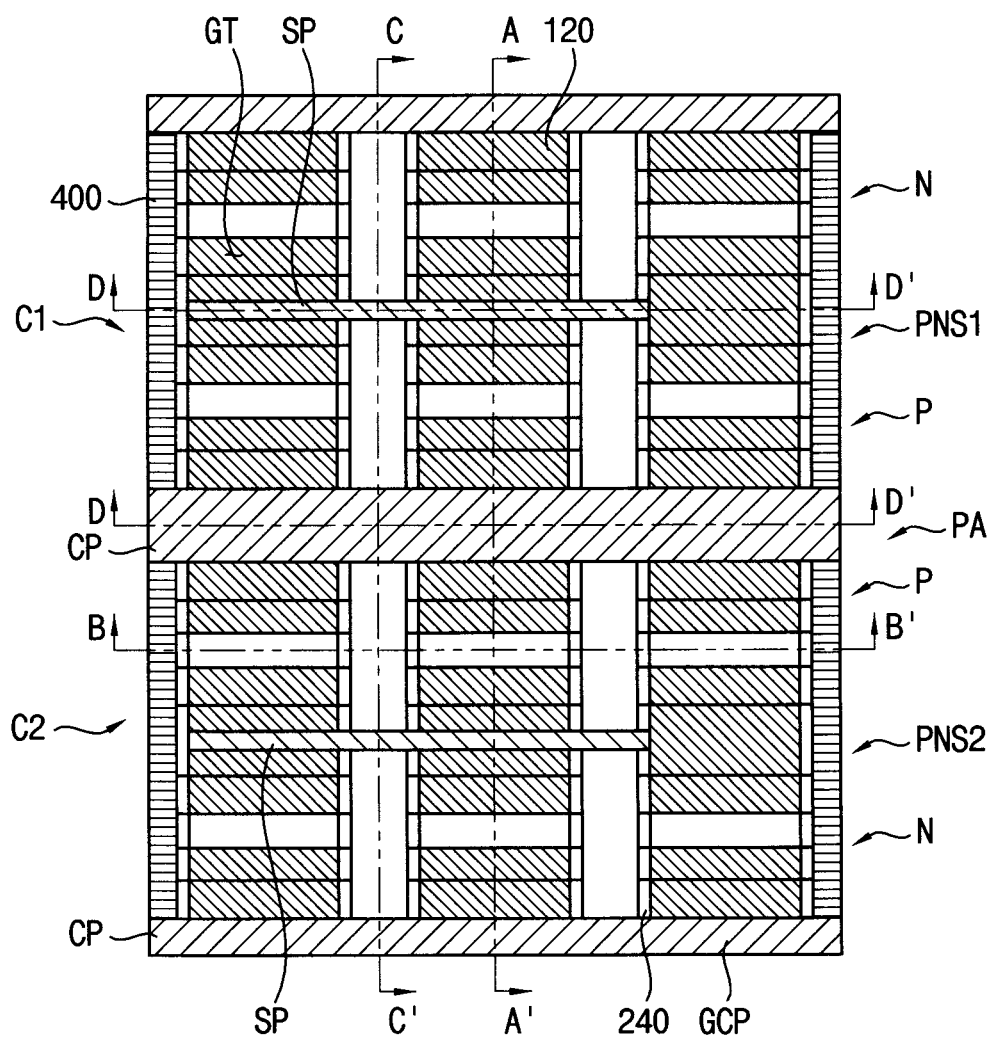
Figure 36A:
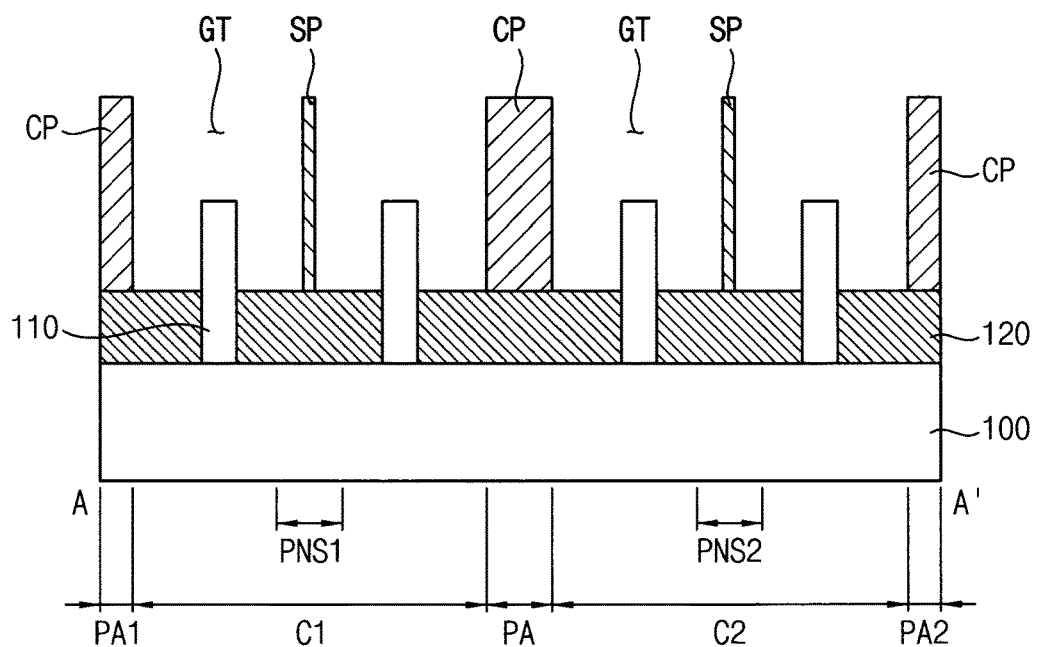
Figure 36A:
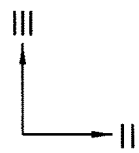
Figure 36B:
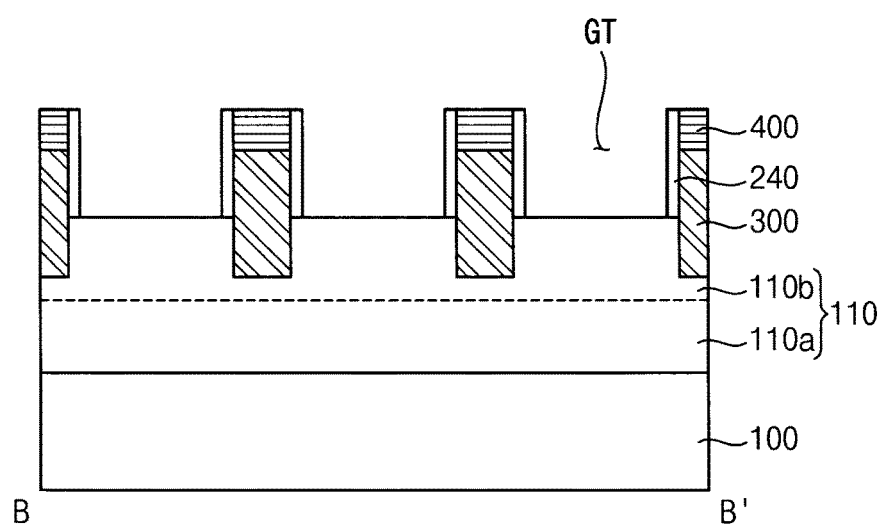
Figure 36B:
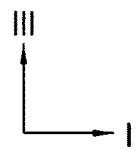
Figure 36C:
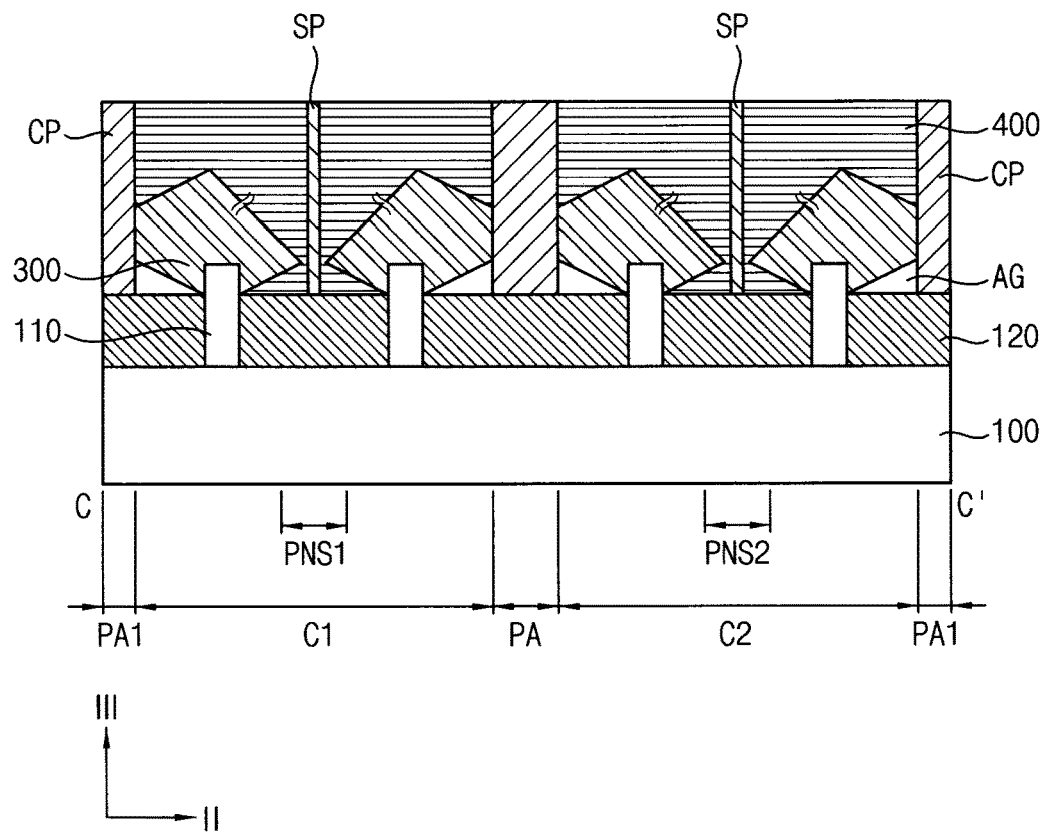
Figure 36D:
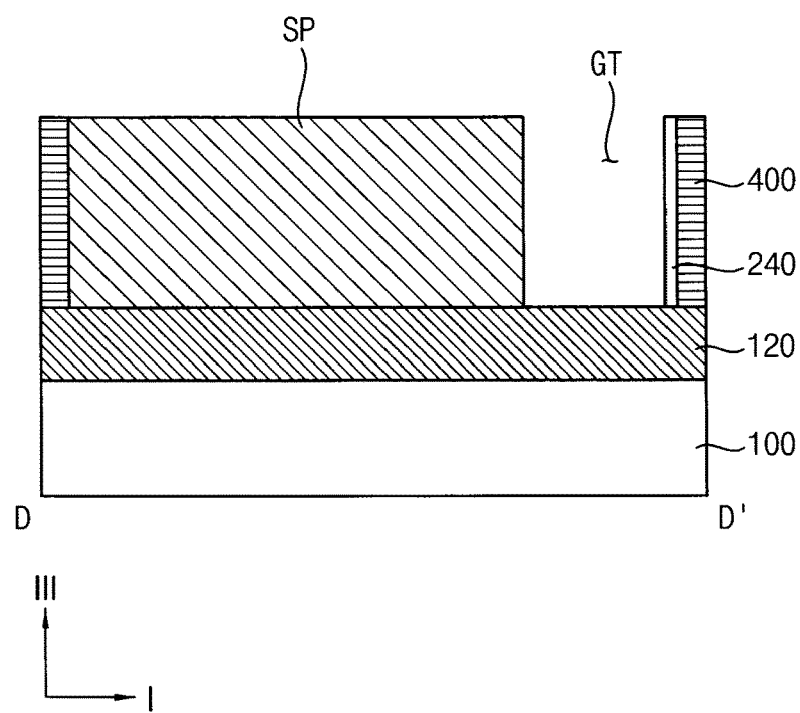
Figure 37:
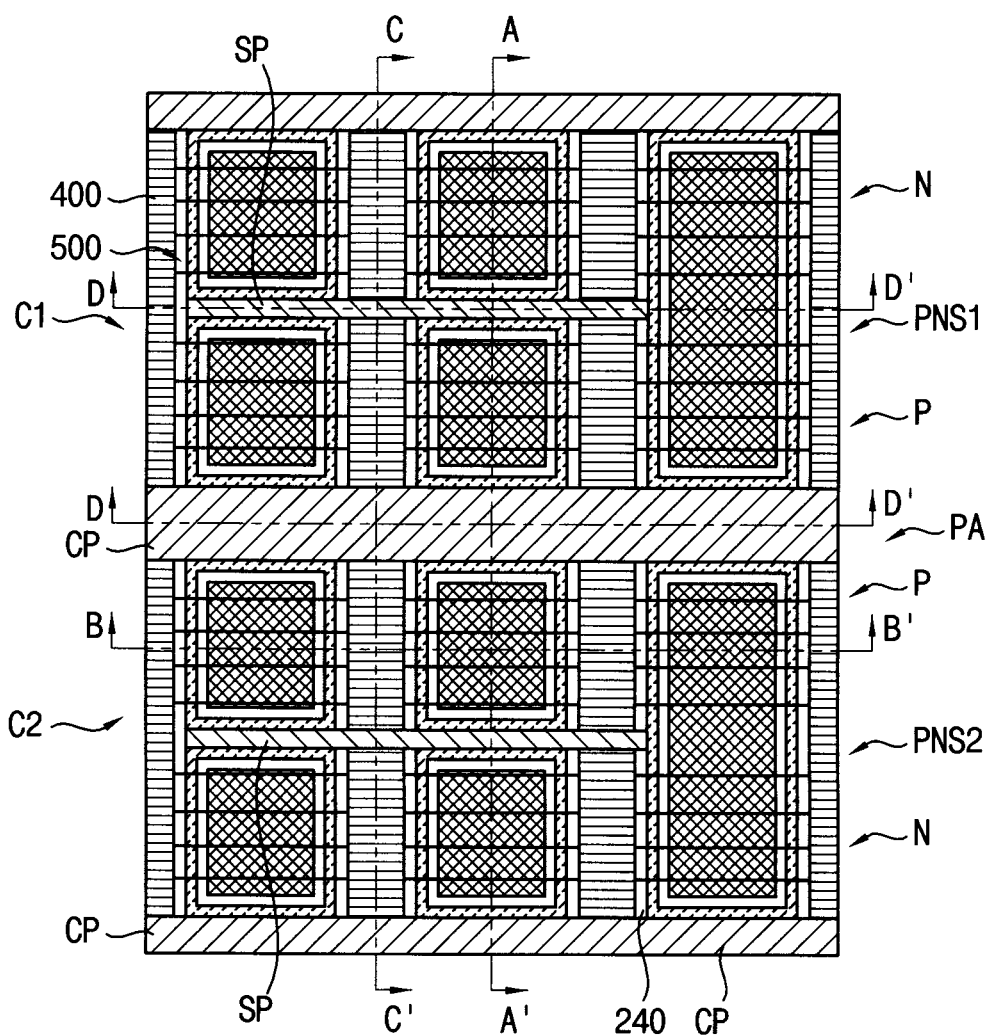
Figure 38A:
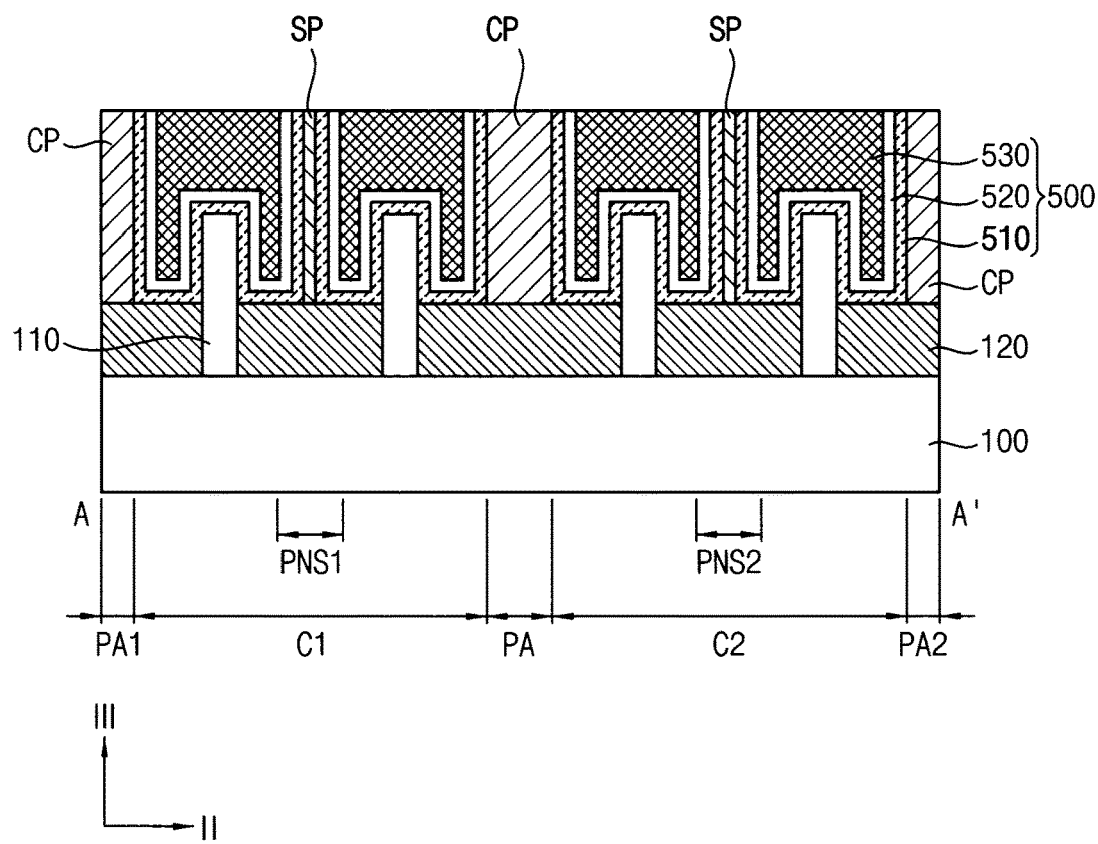
Figure 38B:
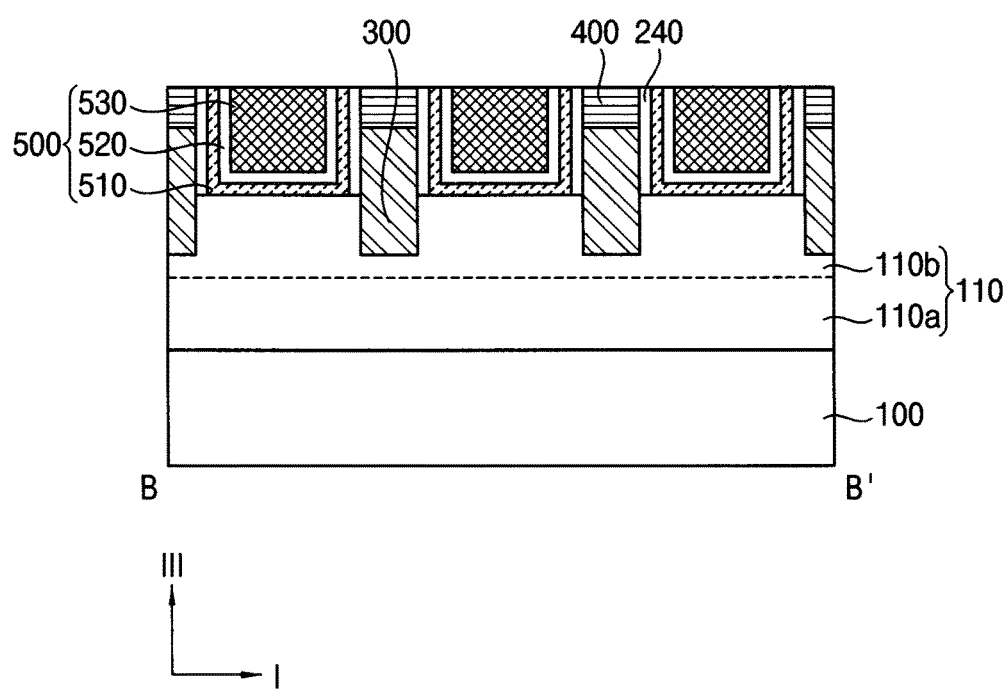
Figure 38C:
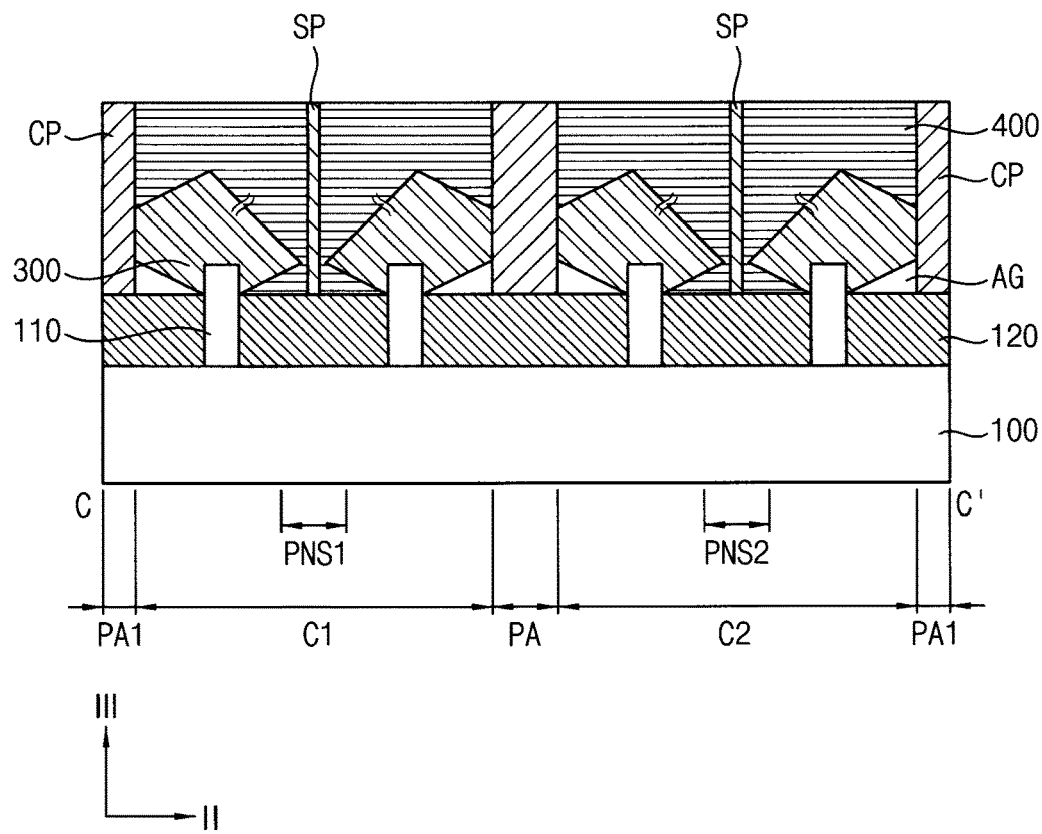
Figure 38D:
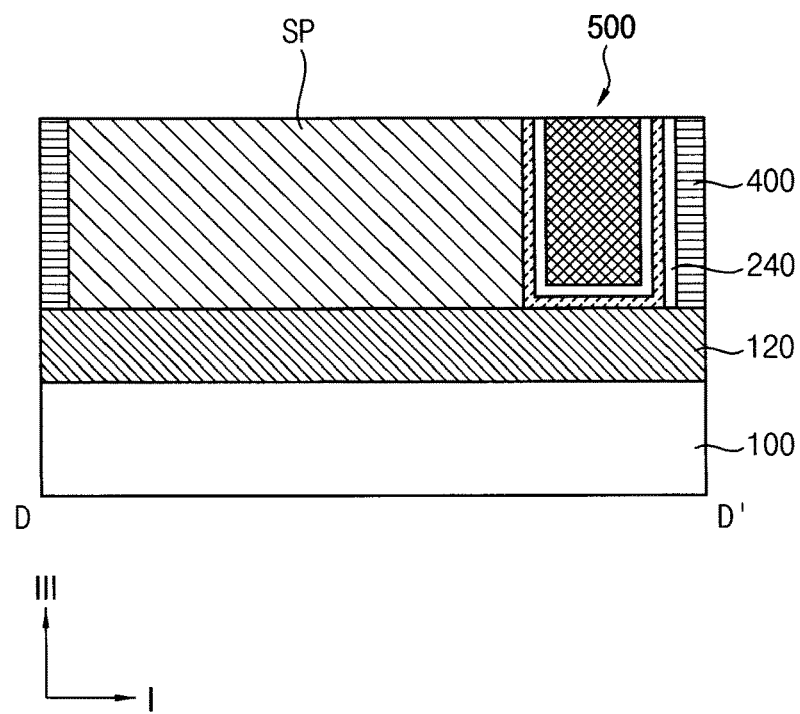
Figure 39:
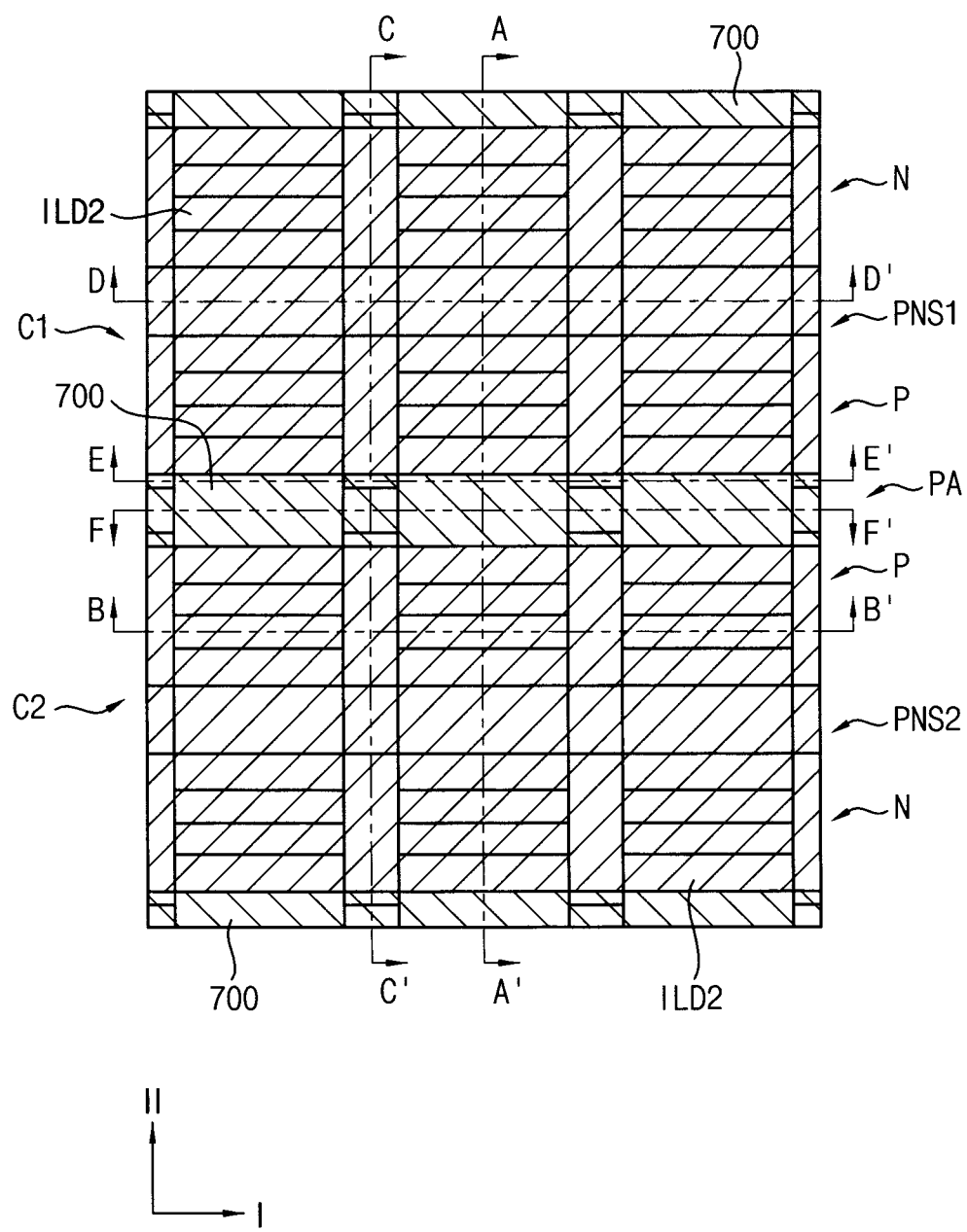
Figure 40A:
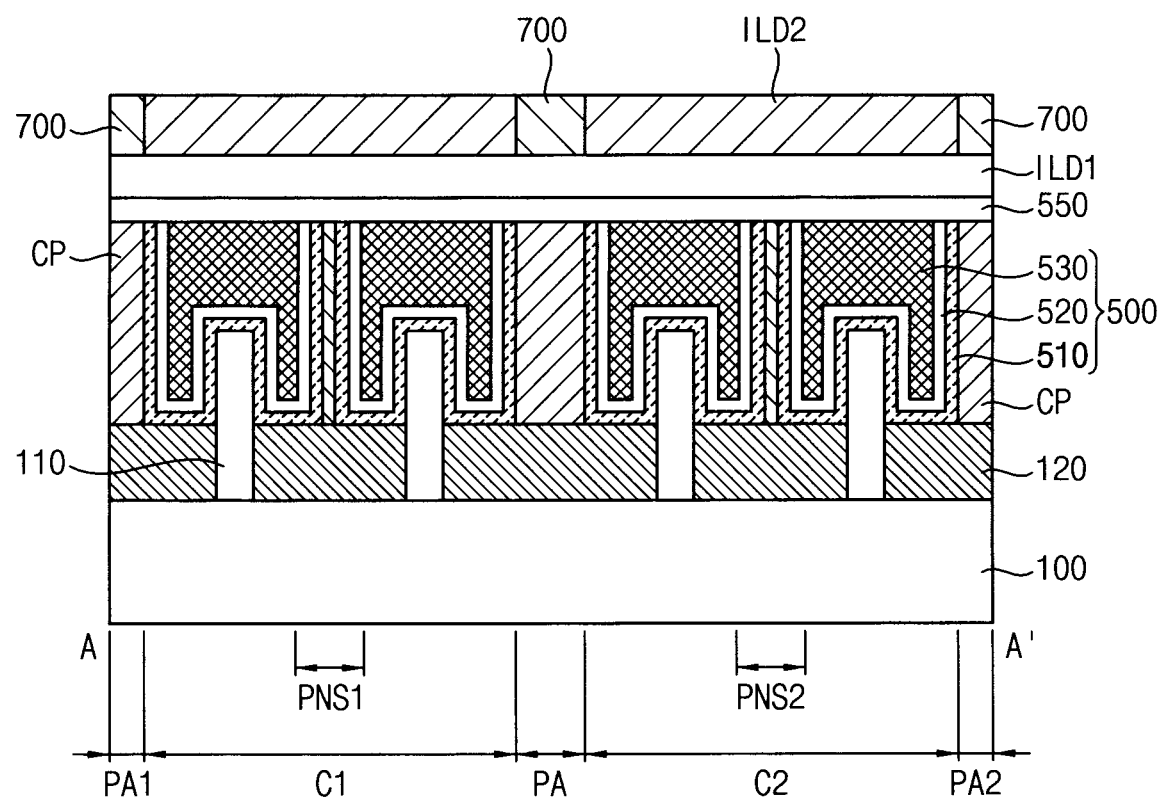
Figure 40A:
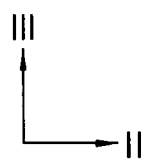
Figure 40B:
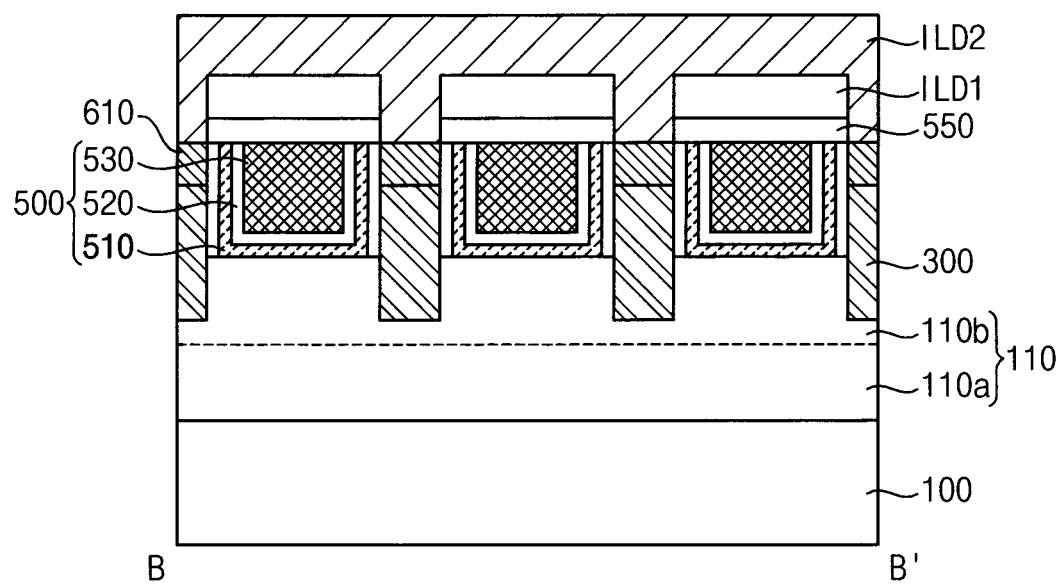
Figure 40B:
Figure 40C:
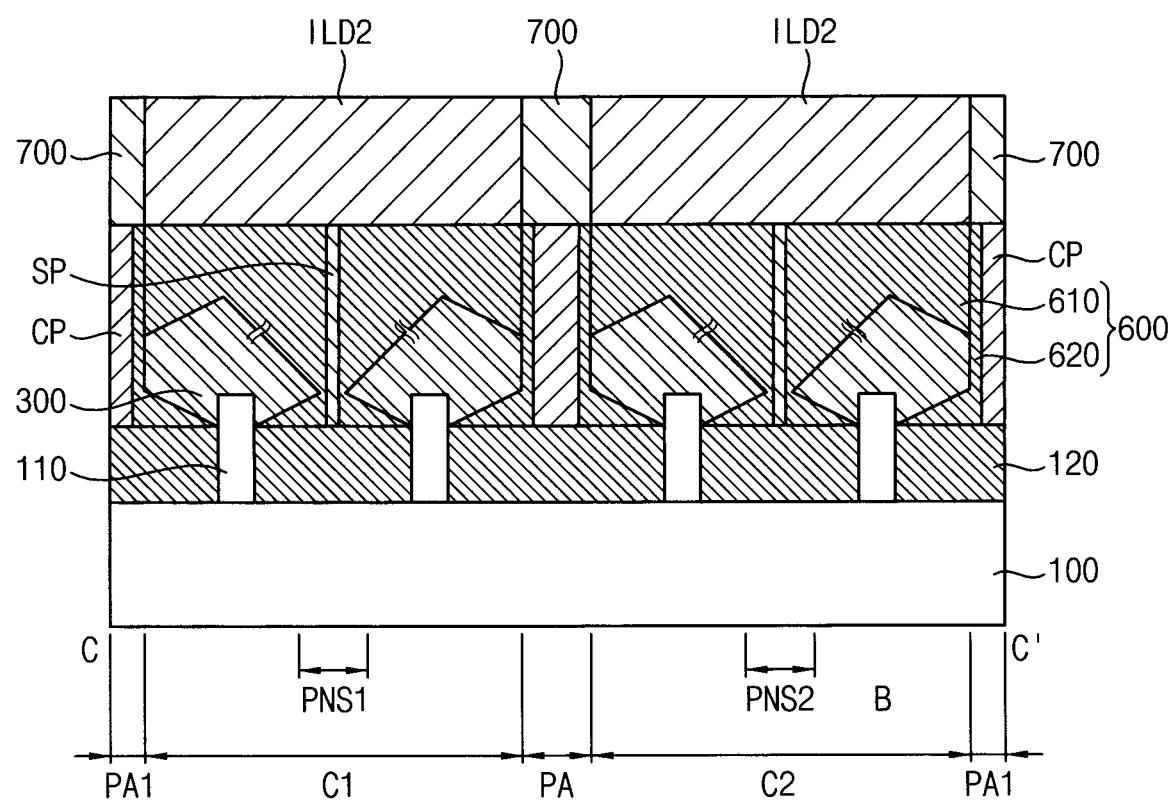
Figure 40D:
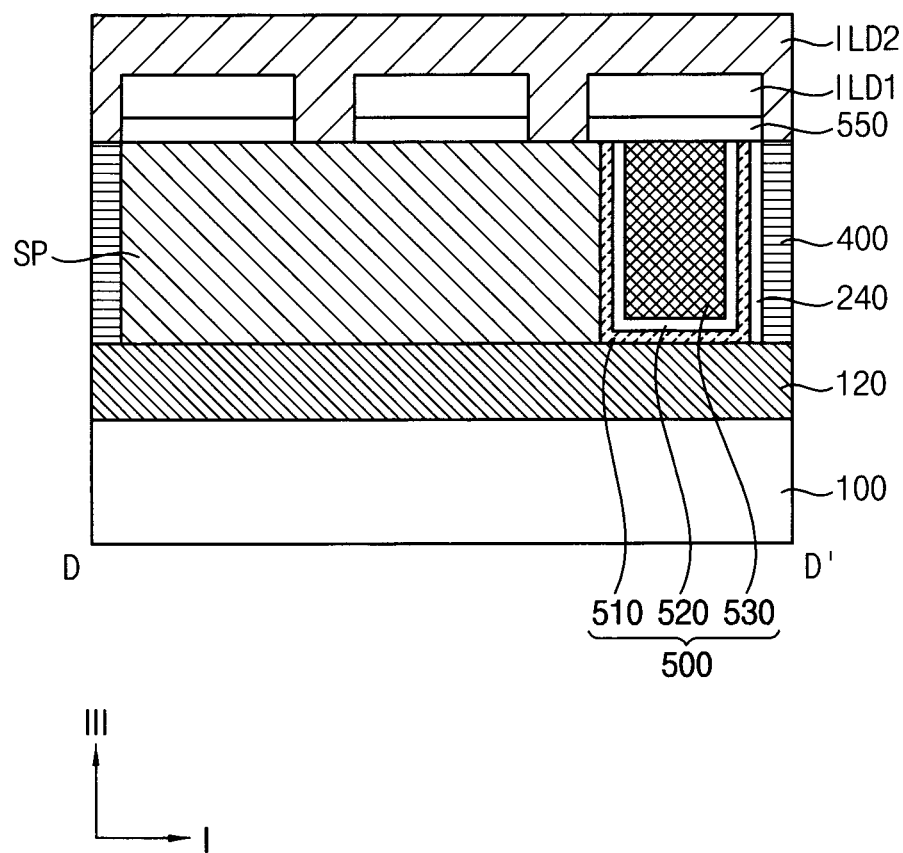
Figure 40E:
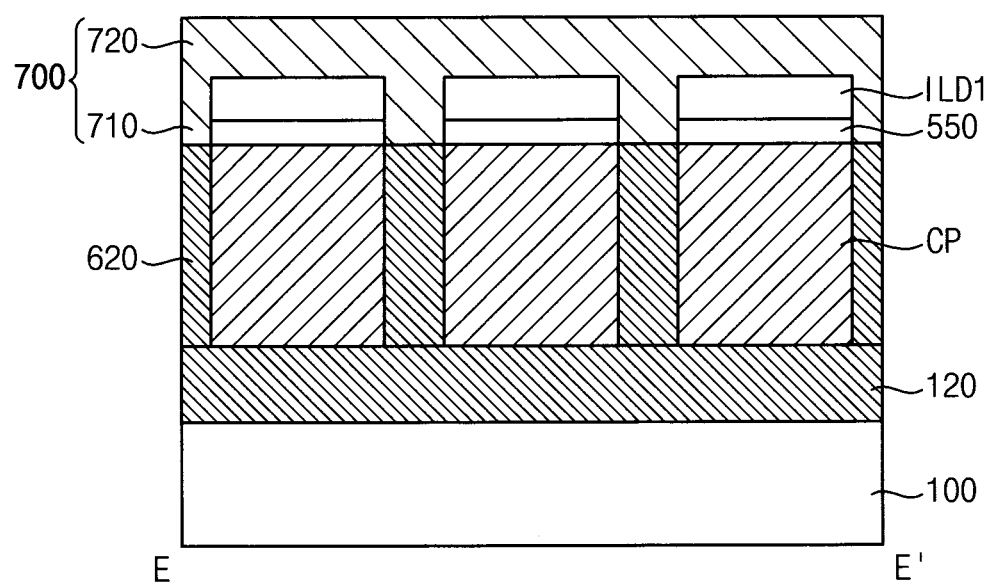
Figure 40F:
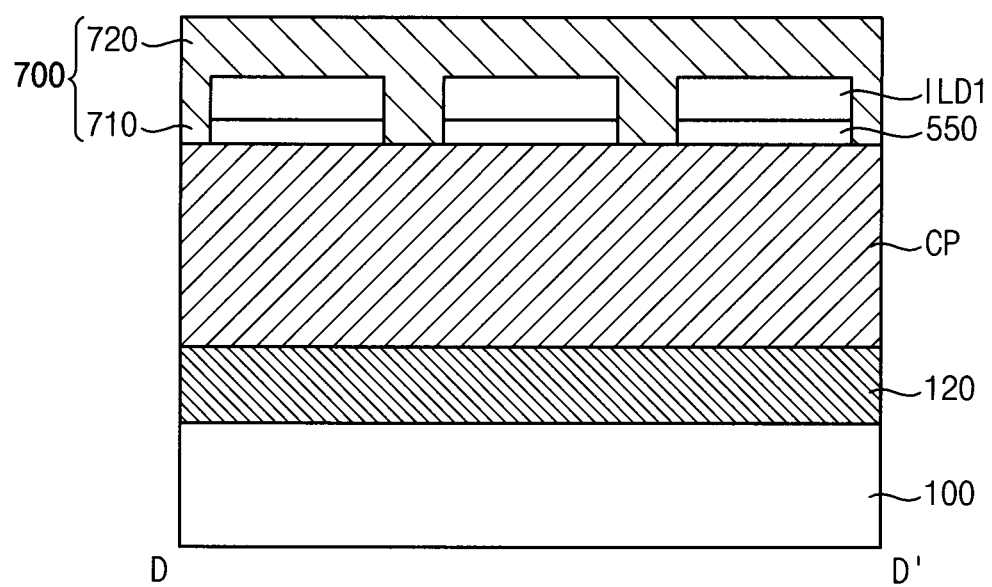

Prior to the formation of the gate structure 500, the insulation pattern 400 may be removed form the substrate 100 and a separation hole SO in FIG. 33 may be formed in the separation area PNS. The separation hole may be formed in the whole separation area PNS or in a portion of the separation area PNS according to a layout of the semiconductor device.

In the present exemplary embodiment, the separation hole SO may extend in the first direction I through the gate spacer 240 and may include the gate trench and the inter-space trench IST I in the first direction I. Thus, the separation pattern SP may extend in the first direction I in the cell area C and at least one gate line GL and at least one junction layer 300 may be separated by the separation pattern SP in the cell area C.

The separation pattern SP may have substantially the same insulation material as the cutting pattern CP. For example, the separation pattern SP may include silicon nitride (SiN), silicon oxynitride (SiON), and/or silicon carbon oxynitride (SiOCN).

Accordingly, the gate structure 500 in the PMOS area P and the gate structure 500 in the NMOS area N may be electrically separated by the separation pattern SP in the cell area C. In the same way, the junction layer 300 in the PMOS area P and the junction layer 300 in the NMOS area N may also be electrically separated by the separation pattern SP in the cell area C. Thus, the PMOS transistor and the NMOS transistor may be sufficiently separated from each other by the separation pattern SP in the same cell area C although the size of the semiconductor device may be reduced. For example, the semiconductor device may be formed into a stable and reliable CMOS device.

FIGS. 5 to 32E are views illustrating processing steps of a method of manufacturing a semiconductor device in accordance with an exemplary embodiment of the present inventive concept. In FIGS. 5 to 32E, odd-numbered figures are plan views illustrating each processing step for the manufacturing method and even-numbered figures are cross sectional views corresponding to the odd-numbered figure. Each figure designated by the subscript 'A' in the drawing number is a cross-sectional view cut along a line A-A' of the semiconductor device shown in FIG. 1, and each figure designated by the subscript 'B' in the drawing number is a cross-sectional view cut along a line B-B' of the semiconductor device shown in FIG. 1. In addition, each figure designated by the subscript 'C' in the drawing number is a cross-sectional view cut along a line C-C' of the semiconductor device shown in FIG. 1, and each figure designated by the subscript 'D' in the drawing number is a cross-sectional view cut along a line D-D' of the semiconductor device shown in FIG. 1. Each figure designated by the subscript 'E' in the drawing number is a cross-sectional view cut along a line E-E' of the semiconductor device shown in FIG. 1.

Figure 5:
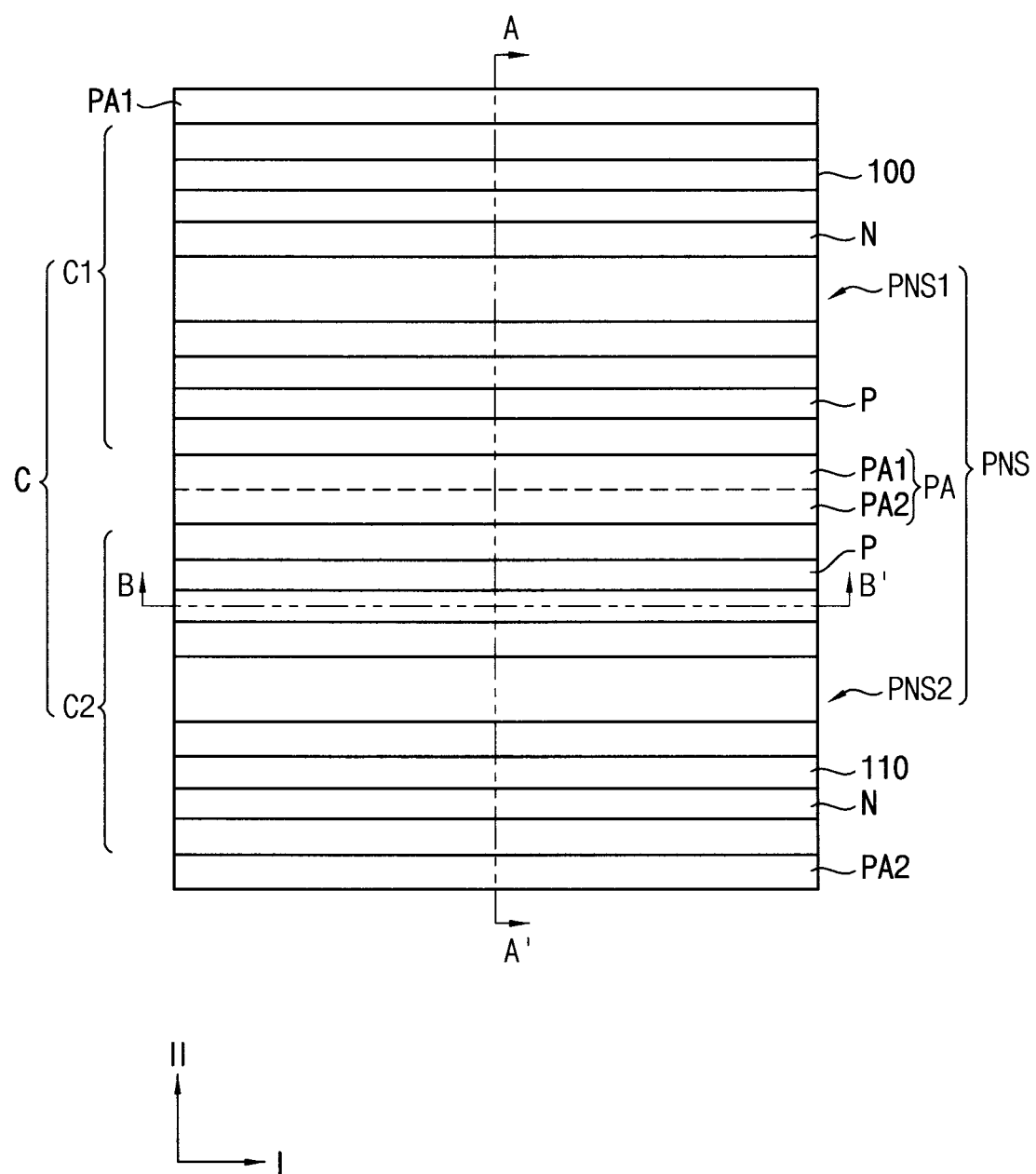
FIGS. 5 to 32E are views illustrating processing steps of a method of manufacturing a semiconductor device in accordance with an exemplary embodiment of the present inventive concept.
Figure 6A:
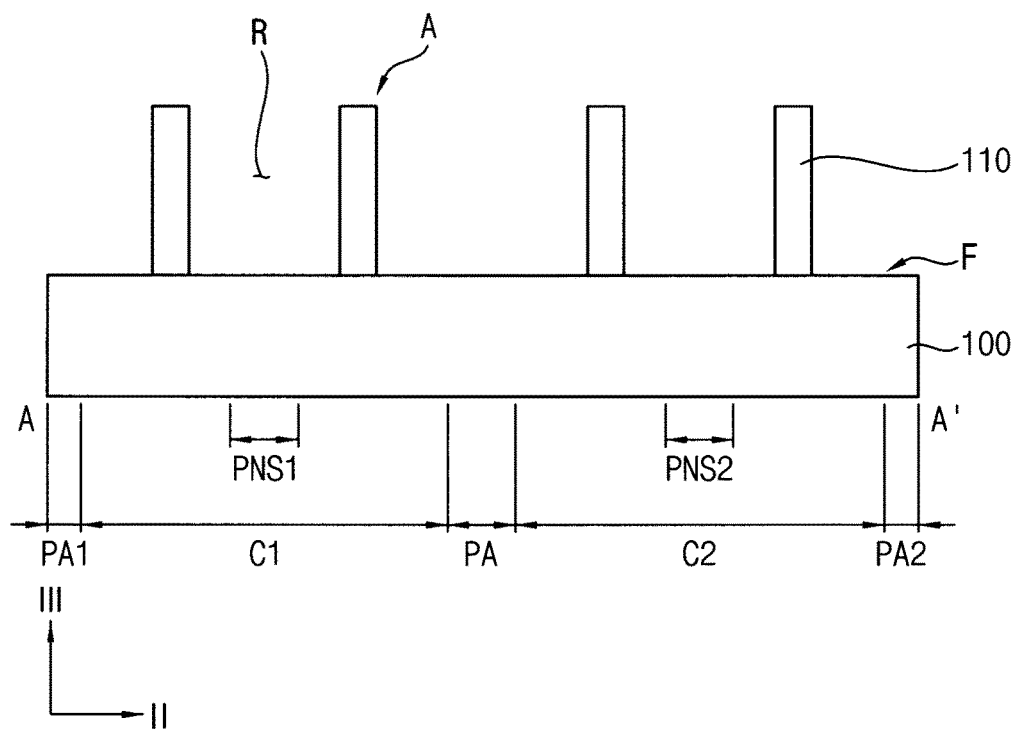
Figure 6B:
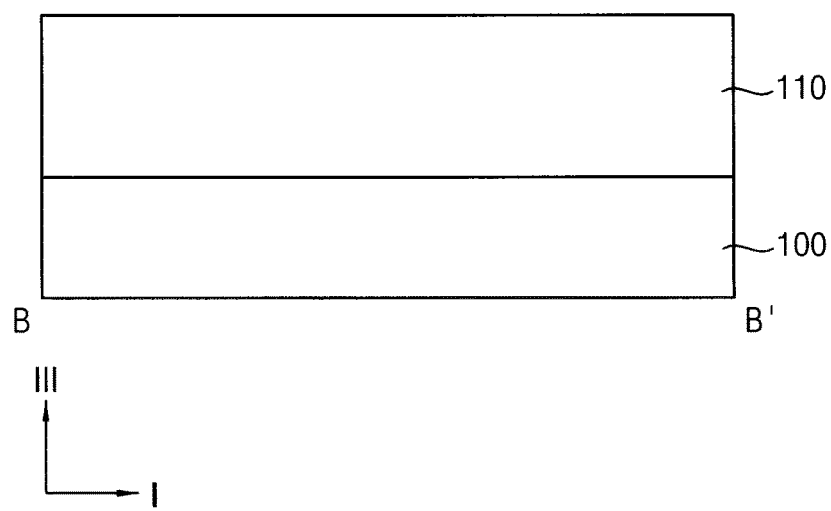

Referring to FIGS. 5 and 6A to 6B, an upper portion of the substrate 100 may be partially removed and a plurality of recesses R may be formed on the substrate 100 in such a way that a plurality of active fins 110 may be arranged on the substrate 100. The neighboring active fins 110 may be spaced apart from each other by the recess R.

For example, the substrate 100 may include a bulk substrate, e.g., a silicon (Si) substrate, a germanium (Ge) substrate, a silicon germanium (Si—Ge) substrate, a gallium phosphorus (Ga—P) substrate, a gallium arsenide (Ga—As) substrate, a silicon antimony (Si—Sb) substrate. Alternatively, the substrate 100 may include a multilayered substrate, e.g., a semiconductor on insulator (SOI) substrate, a germanium on insulator (GOD substrate.

A mask pattern for defining an active region of the substrate 100 may be formed on the substrate 100 and a dry etching process may be conducted to the substrate 100 using the mask pattern as an etching mask, so that an upper portion of the substrate 100 may be partially removed to thereby form the recesses R on the substrate 100. An etched portion of the substrate 100 may function as a field region F of the substrate 100 and a non-etched portion of the substrate 100 may protrude upwards from the bottom of the recess R just like a fin 110 and function as an active region A of the substrate 100. Thus, the substrate 100 may have the field region F corresponding to the recess R and the active region A corresponding to the fin 110. The active region A shaped into the fin is referred to as active fin 110. In the present exemplary embodiment, the active fin 110 may be formed into a line extending in the first direction I.

The substrate 100 may include a plurality of cell areas C in which a plurality of cell transistors may be arranged and a power area PA in which the power rail 700 such as a metal line may be arranged. The cell area C and the power area PA may be alternately arranged on the substrate 100 in the second direction II. For example, the contact structure 600 may be formed in the power area PA and the power signal may be simultaneously transferred to the neighboring cell areas close to the power area PA.

The first cell area C1 may be separated from the second cell area C2 by the power area PA and may be symmetrical to each other with respect to the power area PA. The power area PA may include a first power area PA1 for holding the contact structure 600 through which the power signal may be transferred to the first cell area C1 and a second power area PA2 for holding the contact structure 600 through which the power signal may be transferred to the second cell area C2.

Each of the cell area C may include the PMOS area P and the NMOS area N. A PMOS transistor may be formed on the PMOS area P and the NMOS transistor may be formed on the NMOS area N, so that the CMOS transistor may be formed in each of the cell area C. For example, since the first and the second cell areas C1 and C2 may be symmetrical to each other with respect to the power area PA, the PMOS area P and the NMOS area N of the first cell area C1 may be folded onto the PMOS area P and the NMOS area N of the second cell area C2.

Therefore, a first power signal may be simultaneously transferred to both of the PMOS transistors in the first and the second cell areas C1 and C2 by the power rail 700 in the power area PA interposed between the first and the second cell areas C1 and C2. Then, a second power signal may be transferred to both of the NMOS transistors in the first and the second cell areas C1 and C2 by another power rail in another power area that may be arranged at a top portion of the first cell area C1 and at a bottom portion of the second cell area C2.

For example, the PMOS area P and the NMOS area N may be separated from each other by the separation area PNS in each cell area C. Thus, the NMOS transistor and the PMOS transistor may be electrically separated from each other by the insulation pattern 400 in the separation area PNS of each cell area C. Thus, when only PMOS transistor or only NMOS transistor would be formed in the cell area C, the separation area PNS might not be provided with the cell area C. Hereinafter, the separation area PNS in the first cell area C1 is referred to as first separation area PNS1 and the separation area PNS in the second cell area C2 is referred to as second separation area PNS2 for convenience's sake.

The active fin 110 may be formed into a line shape extending in the first direction in the PMOS area P and the NMOS area N. While a single active fin 110 may be formed in each of the PMOS area P and the NMOS area N as shown in FIG. 6A, the single active fin 110 represents a plurality of the active fins 110 that may be spaced apart from each other in the second direction II. The configurations and the structures of the plurality of the active fins may be varied according to the layout of the semiconductor device.

Figure 7:
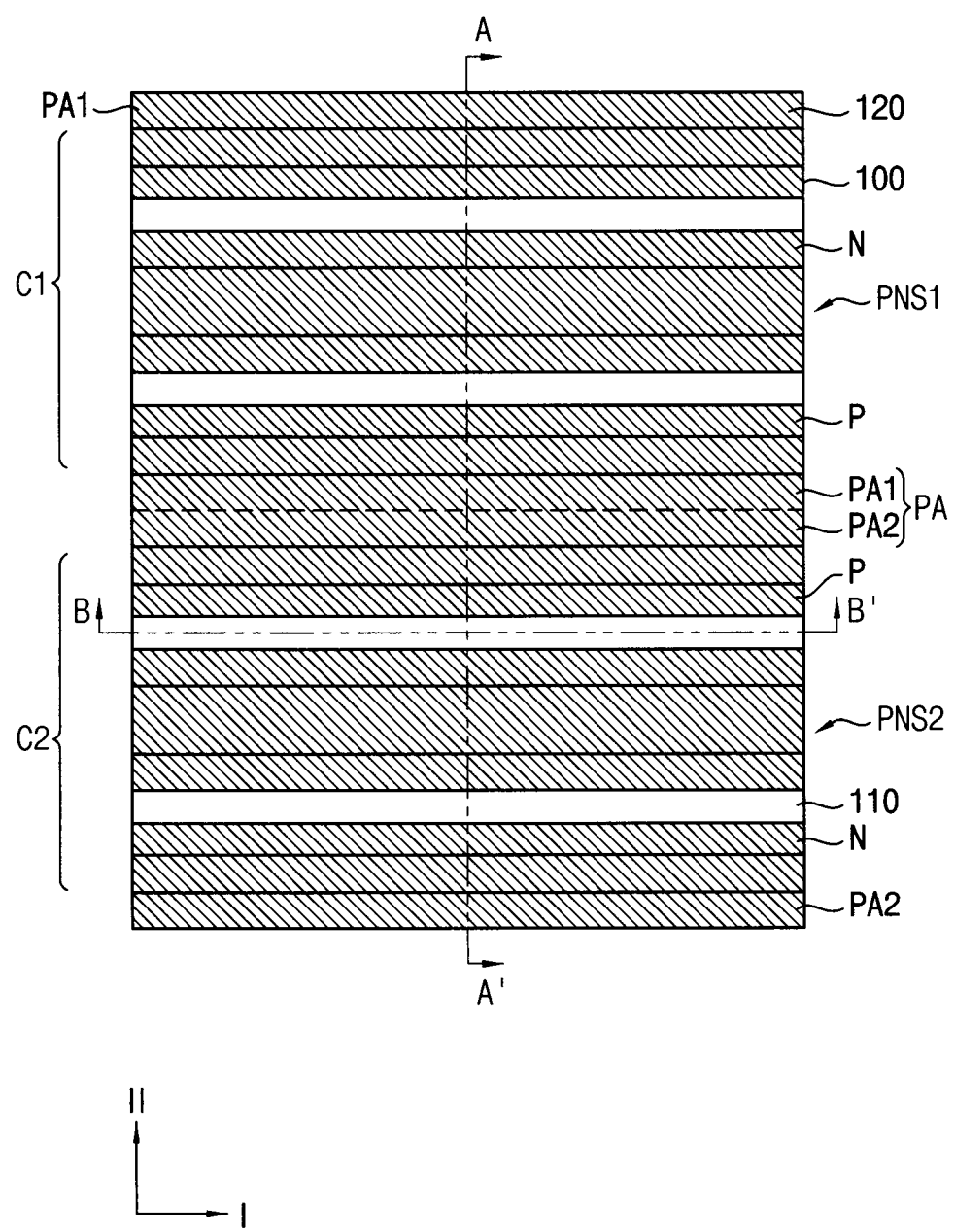
Figure 8A:
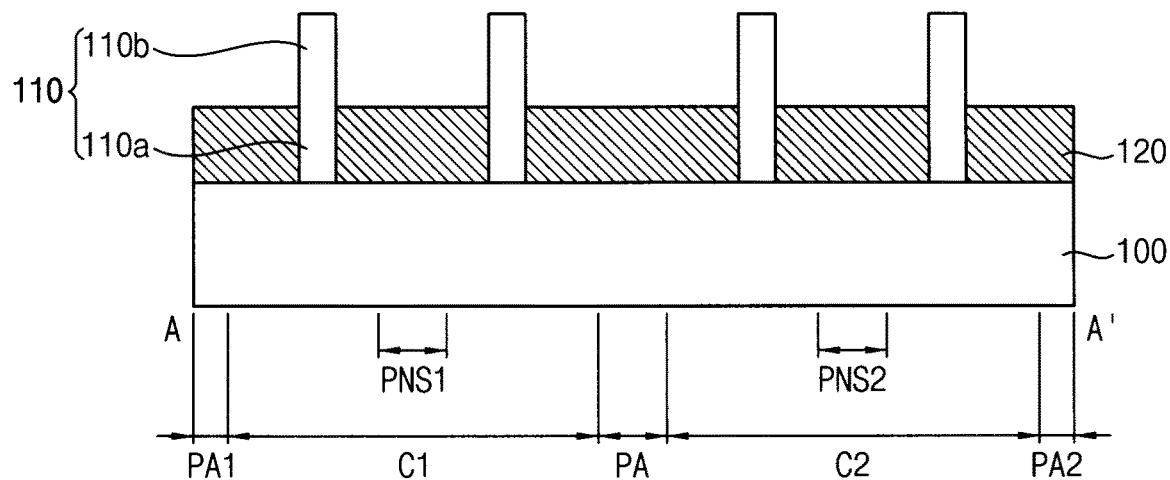
Figure 8A:
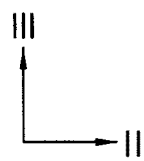
Figure 8B:
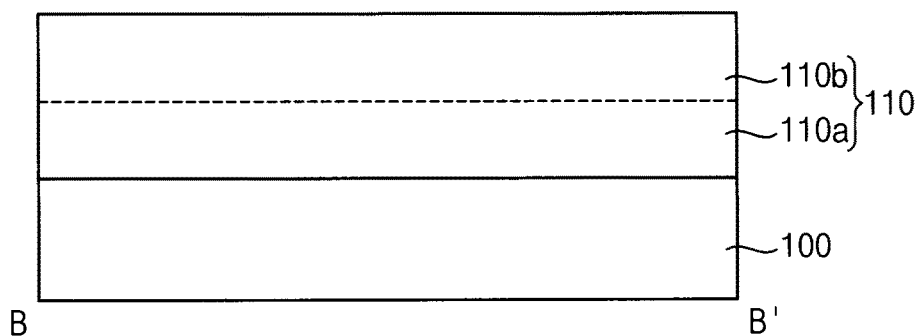
Figure 8B:
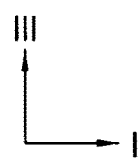
Figure 9:
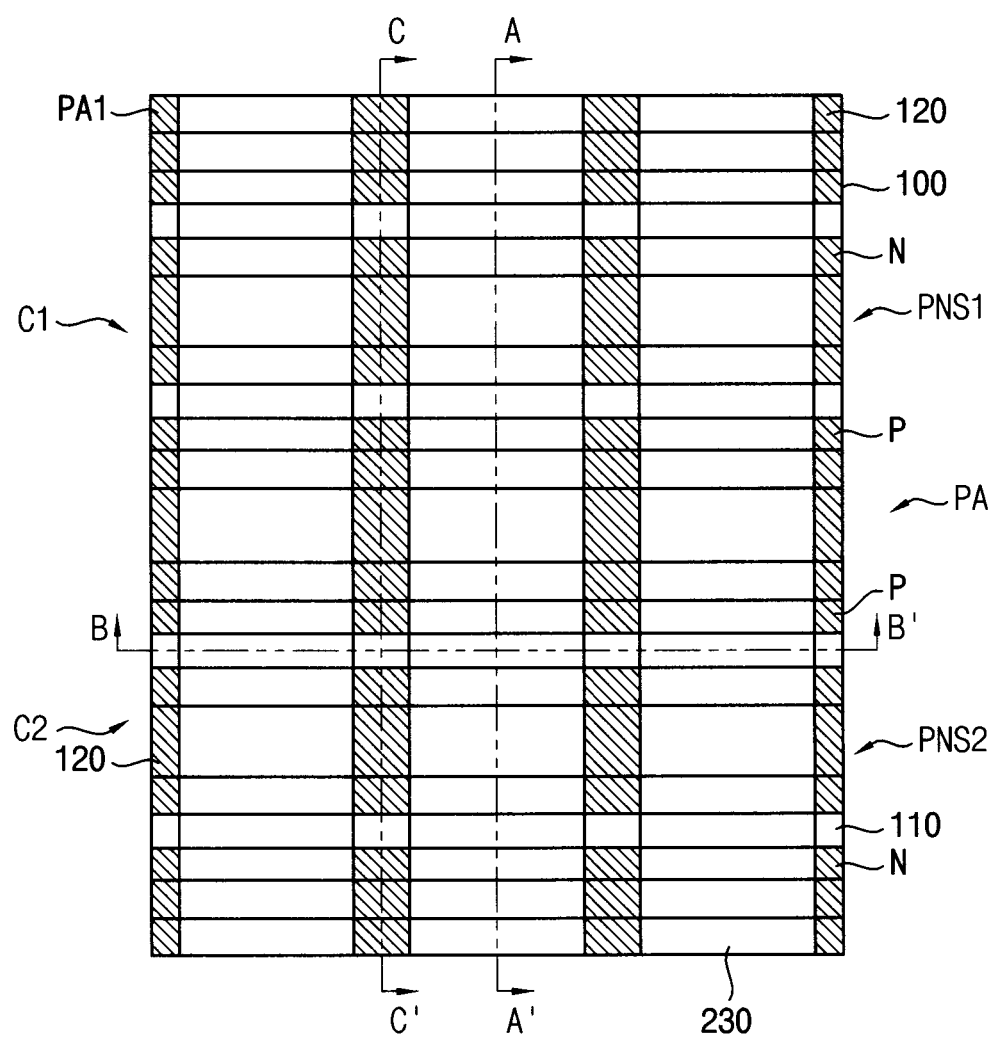
Figure 10A:
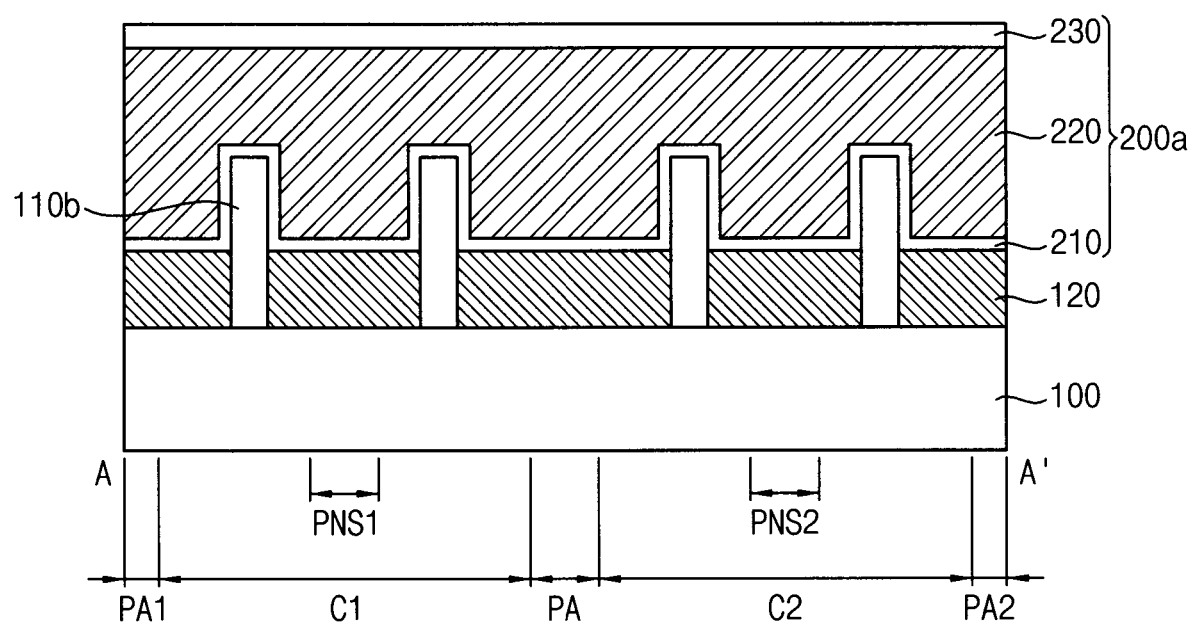
Figure 10A:
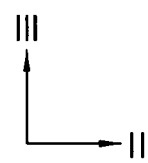
Figure 10B:
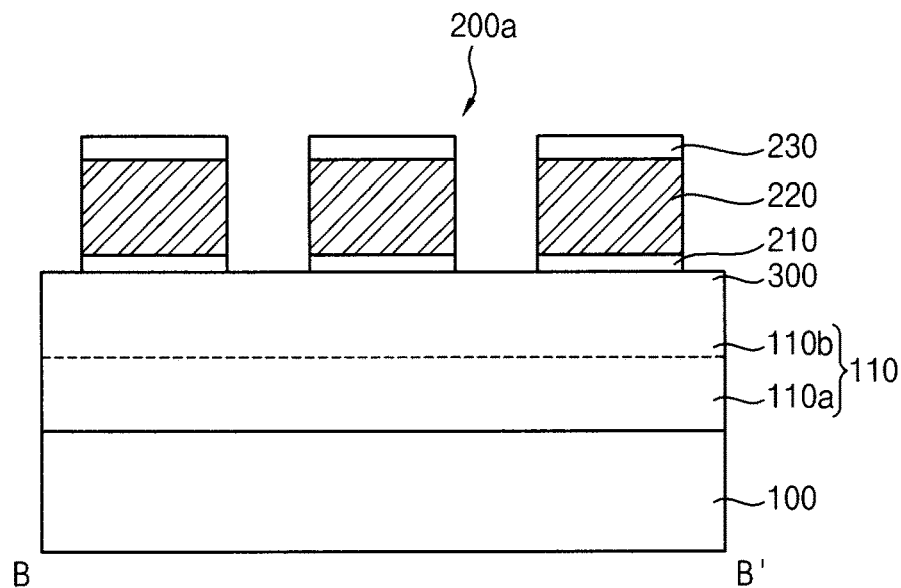
Figure 10B:
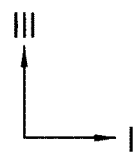
Figure 10C:
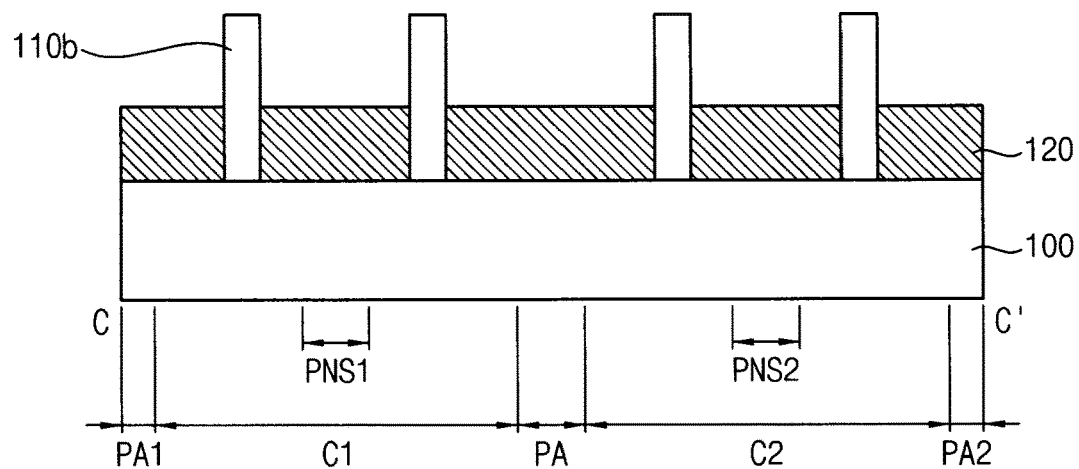
Figure 10C:
Figure 11:
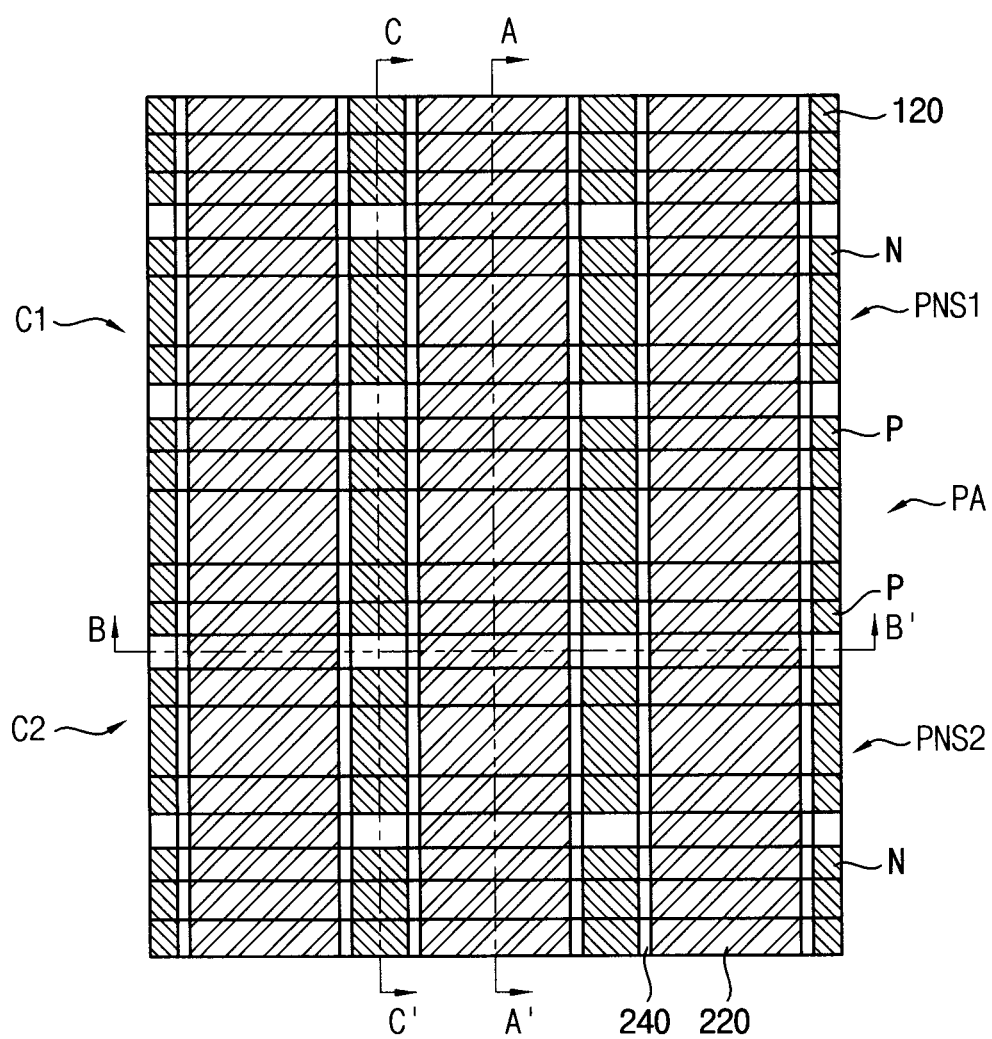
Figure 12A:
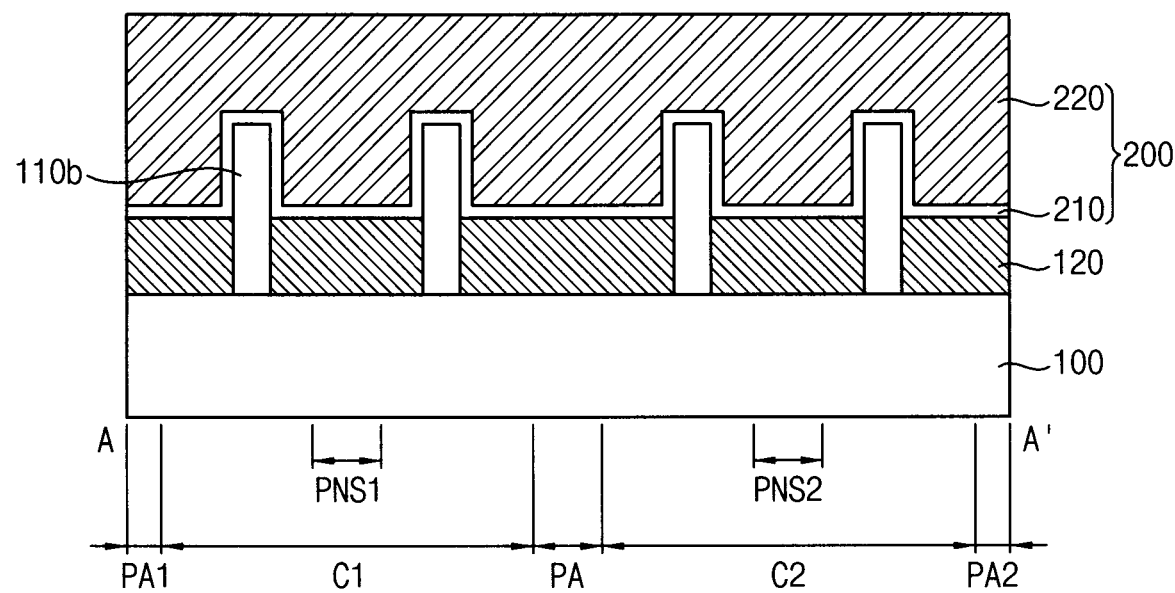
Figure 12A:
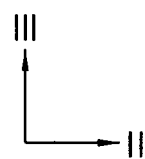
Figure 12B:
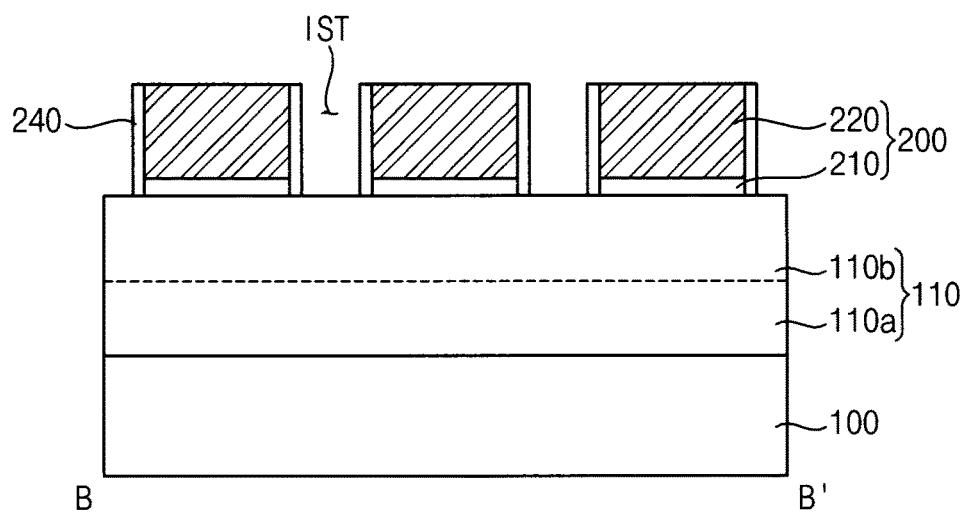
Figure 12B:
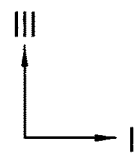
Figure 12C:
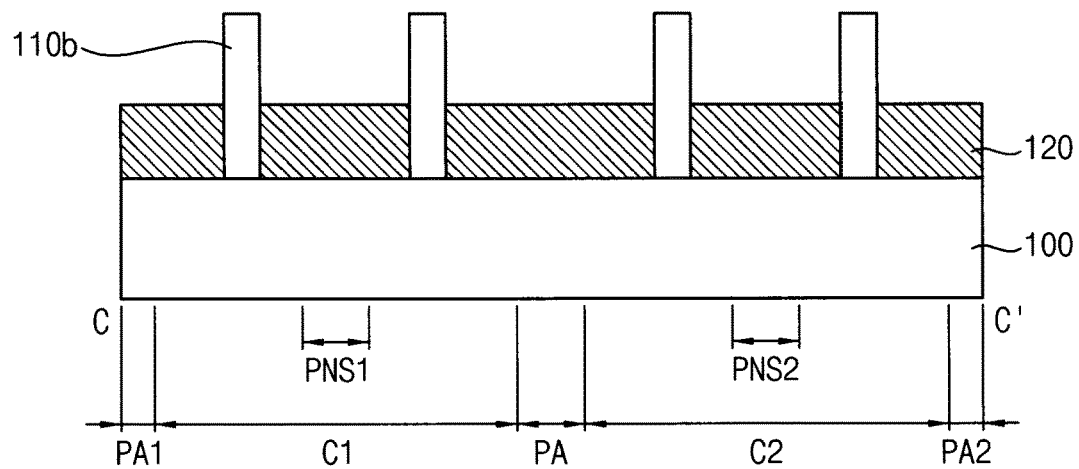
Figure 12C:
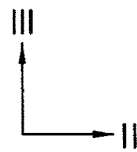
Figure 13:
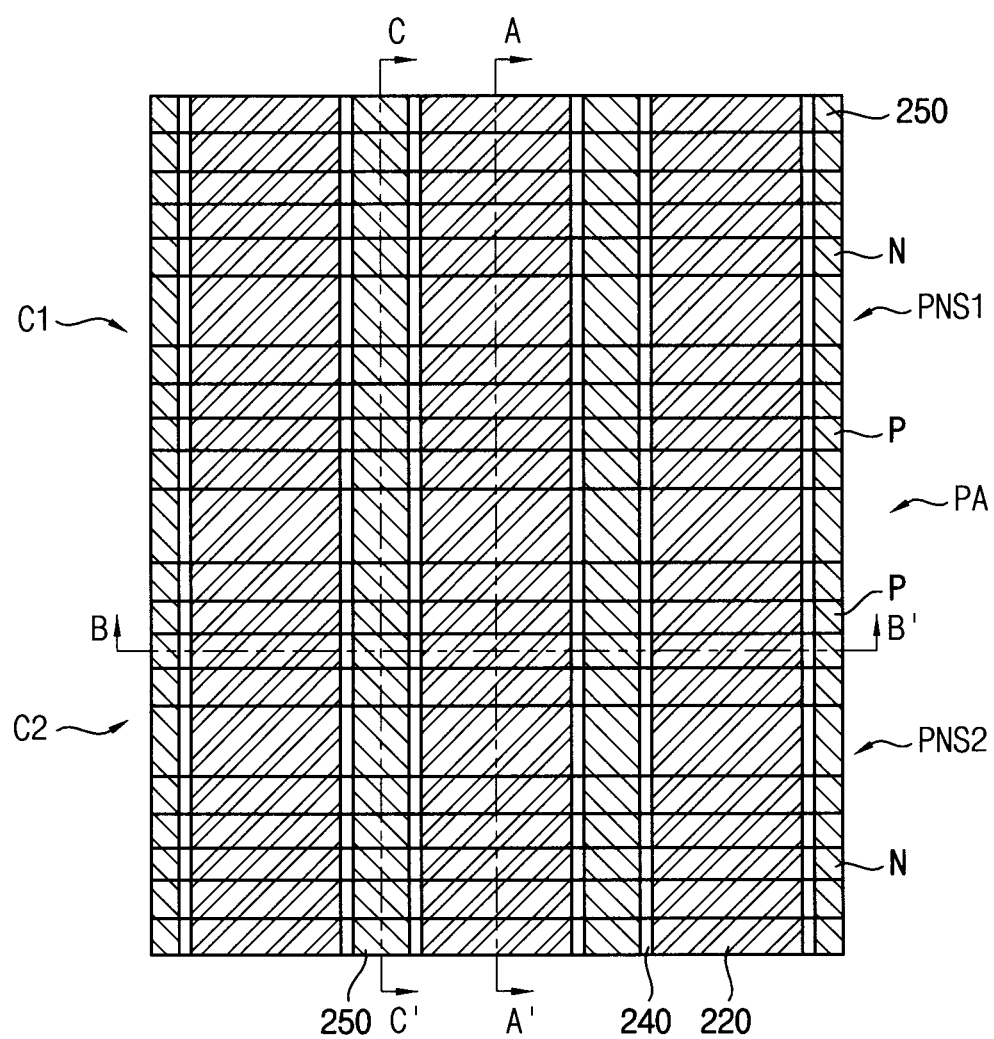
Figure 14A:
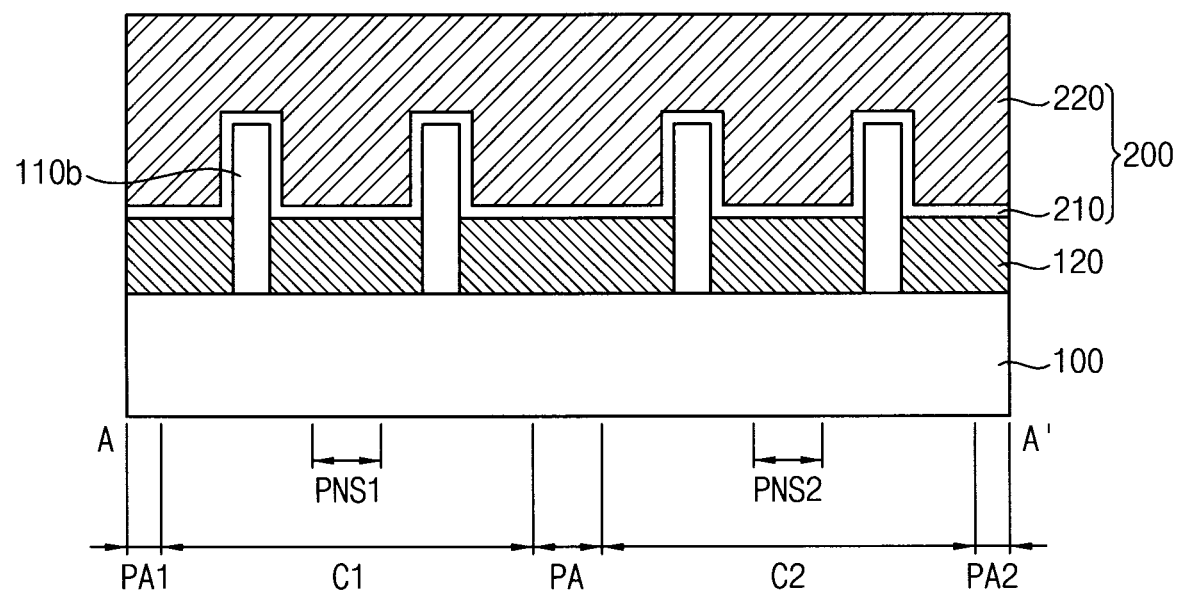
Figure 14B:
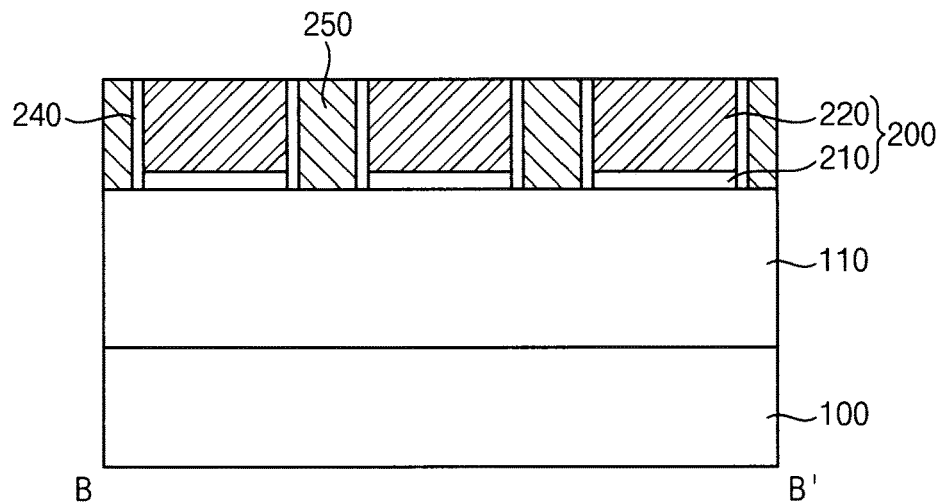
Figure 14C:
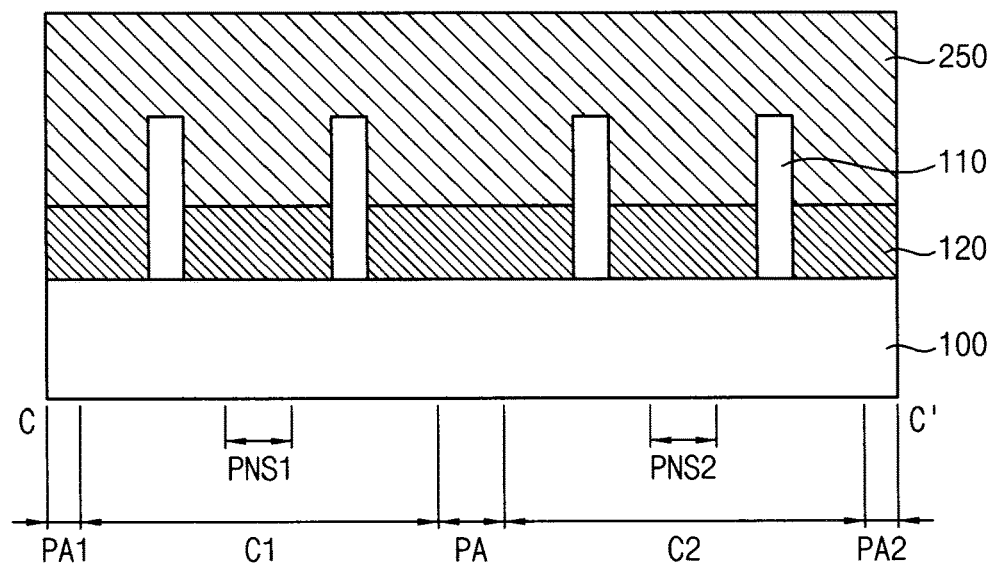
Figure 15:
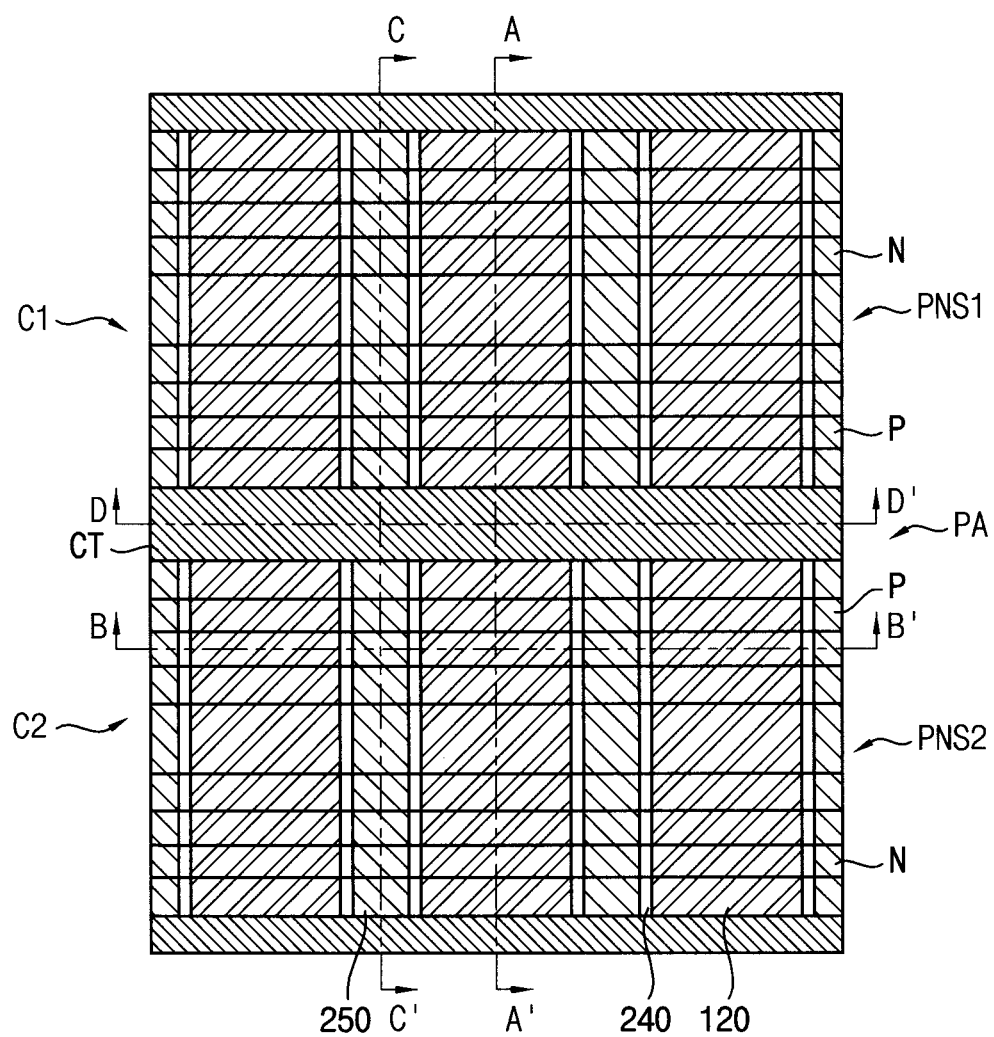
Figure 16A:
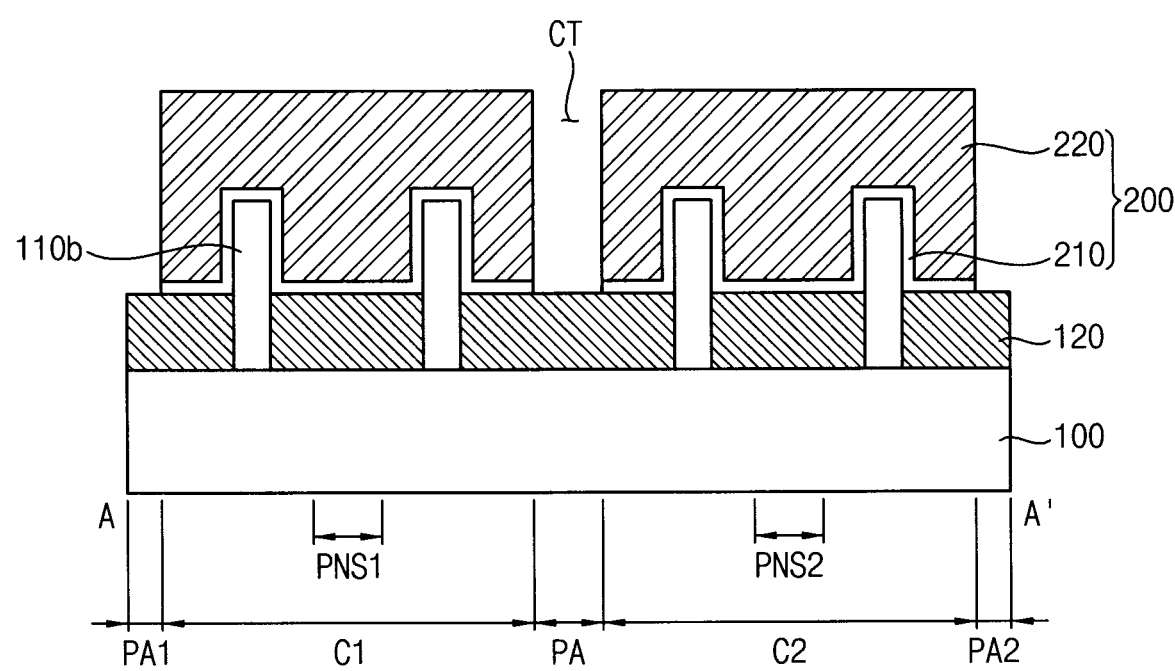
Figure 16A:
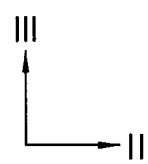
Figure 16B:
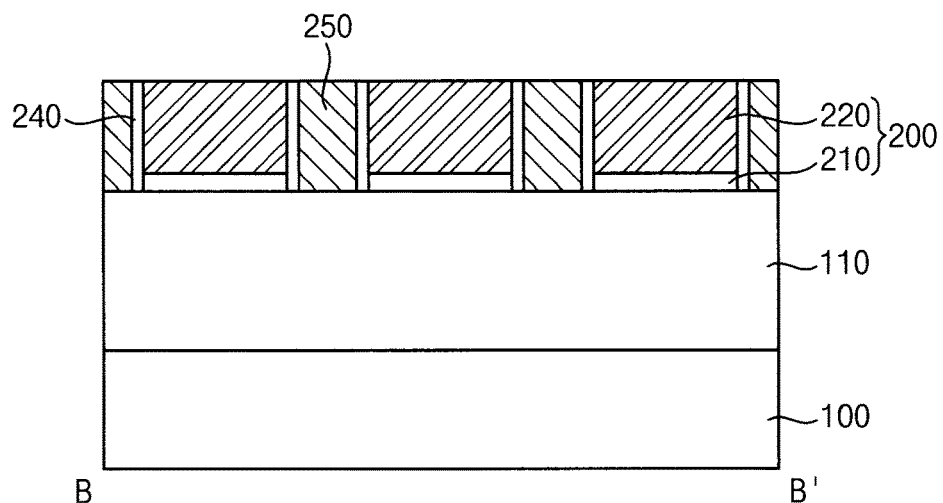
Figure 16B:
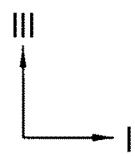
Figure 16C:
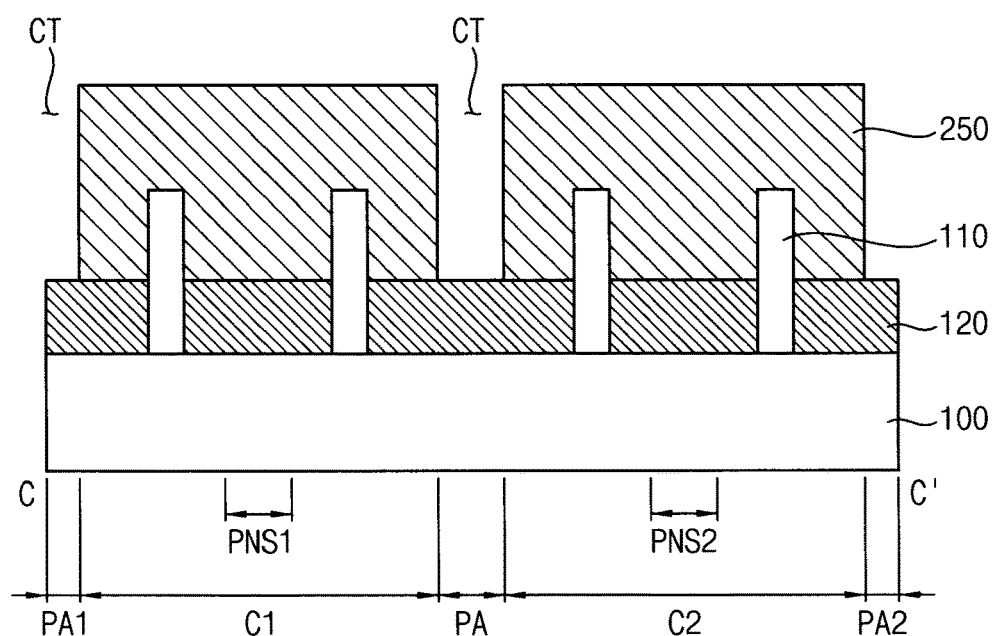
Figure 16C:
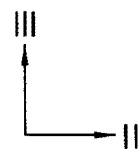
Figure 16D:
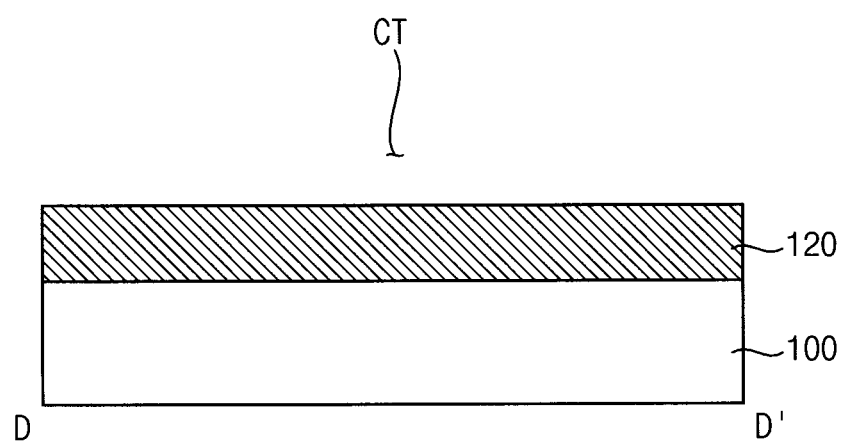
Figure 16D:
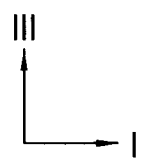
Figure 17:
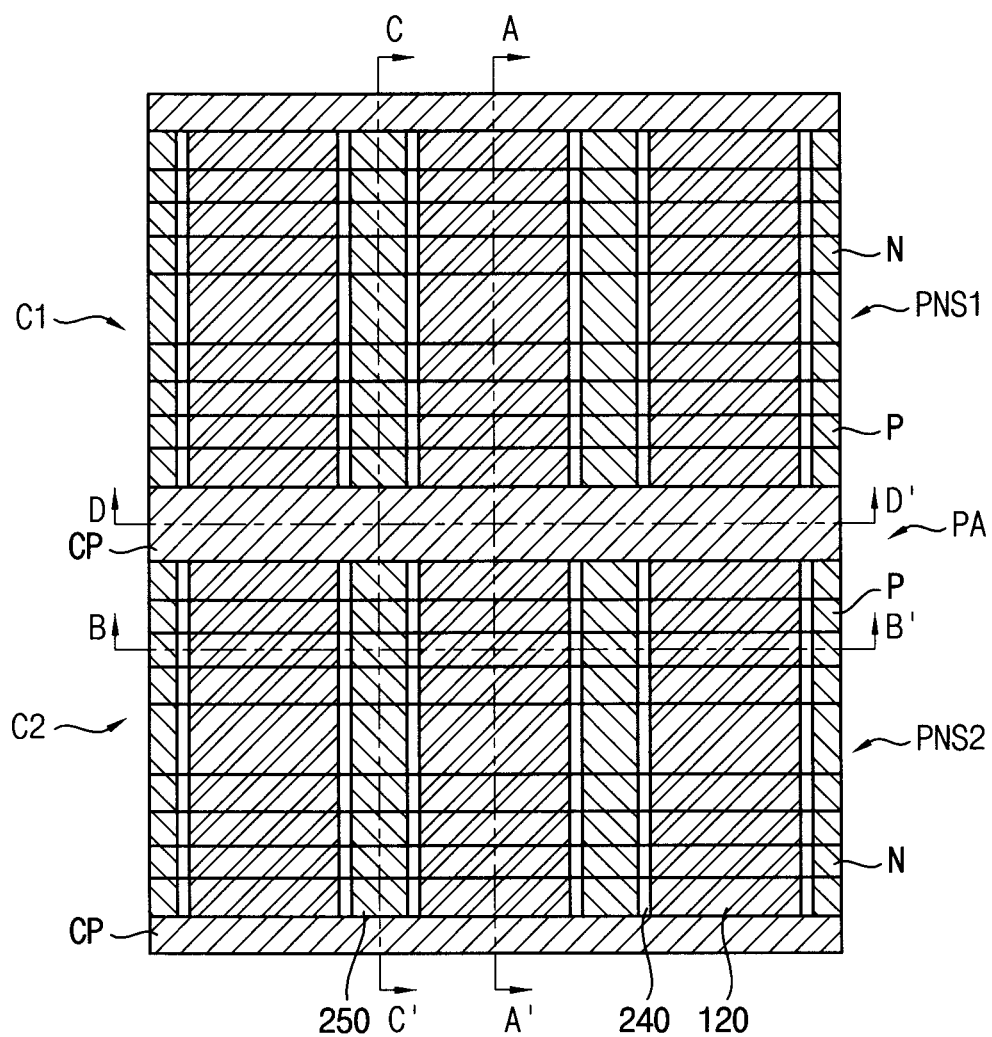
Figure 18A:
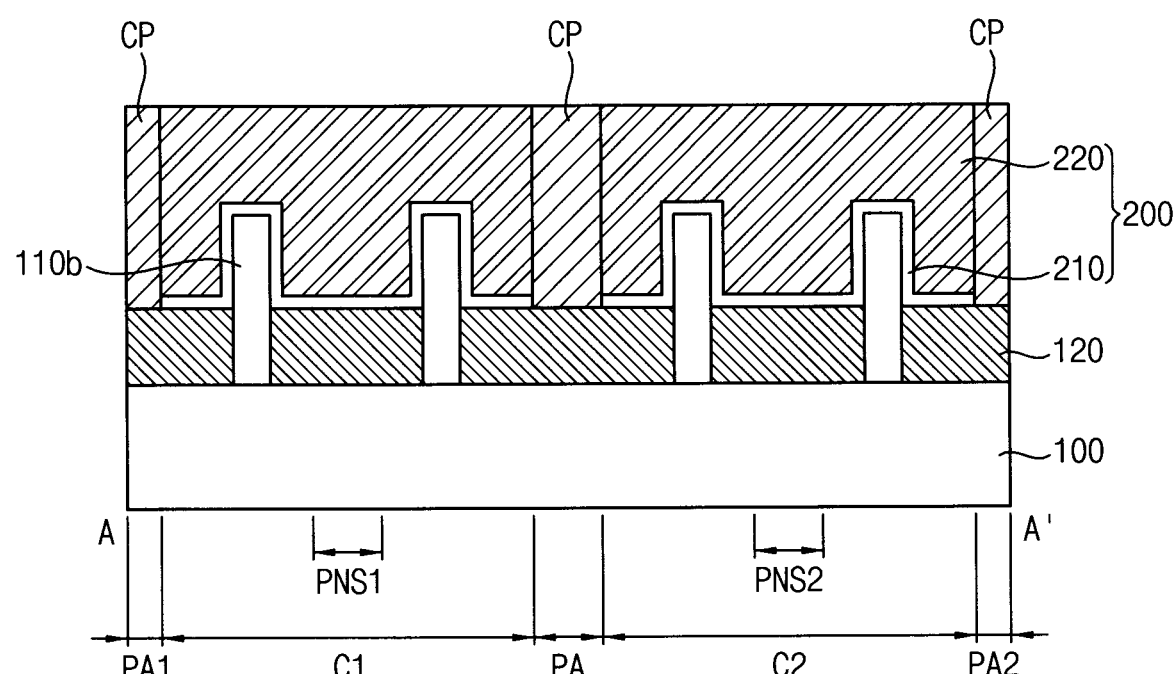
Figure 18B:
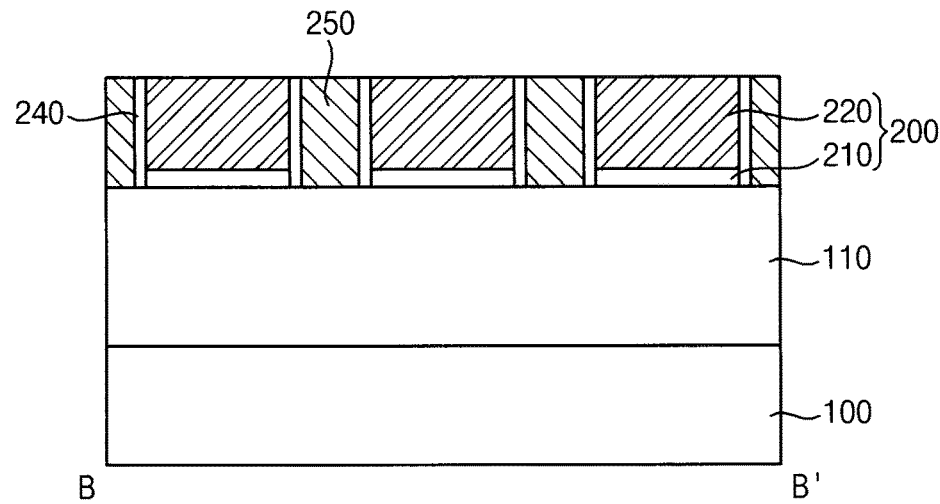
Figure 18B:
Figure 18C:
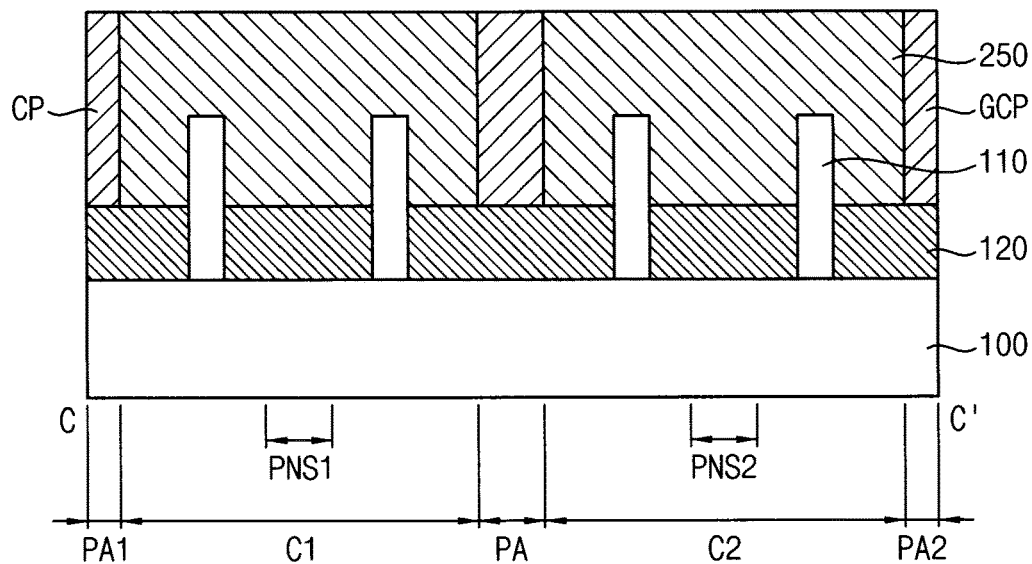
Figure 18C:
Figure 18D:
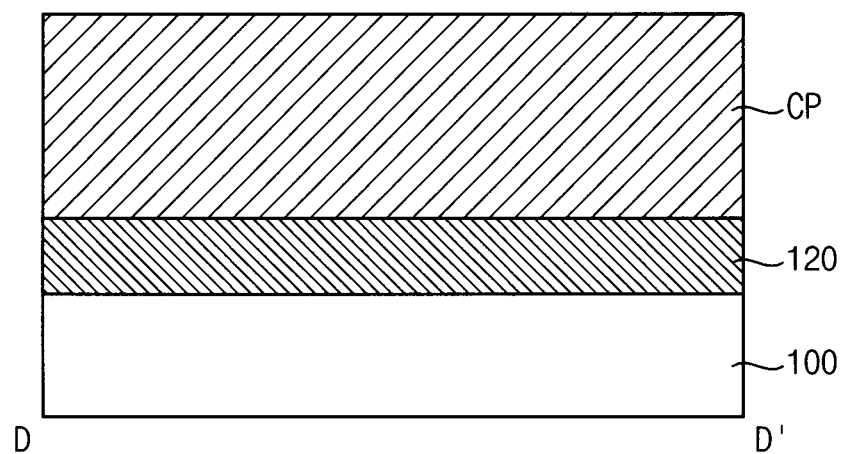
Figure 18D:
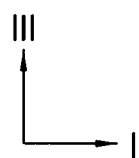
Figure 19:
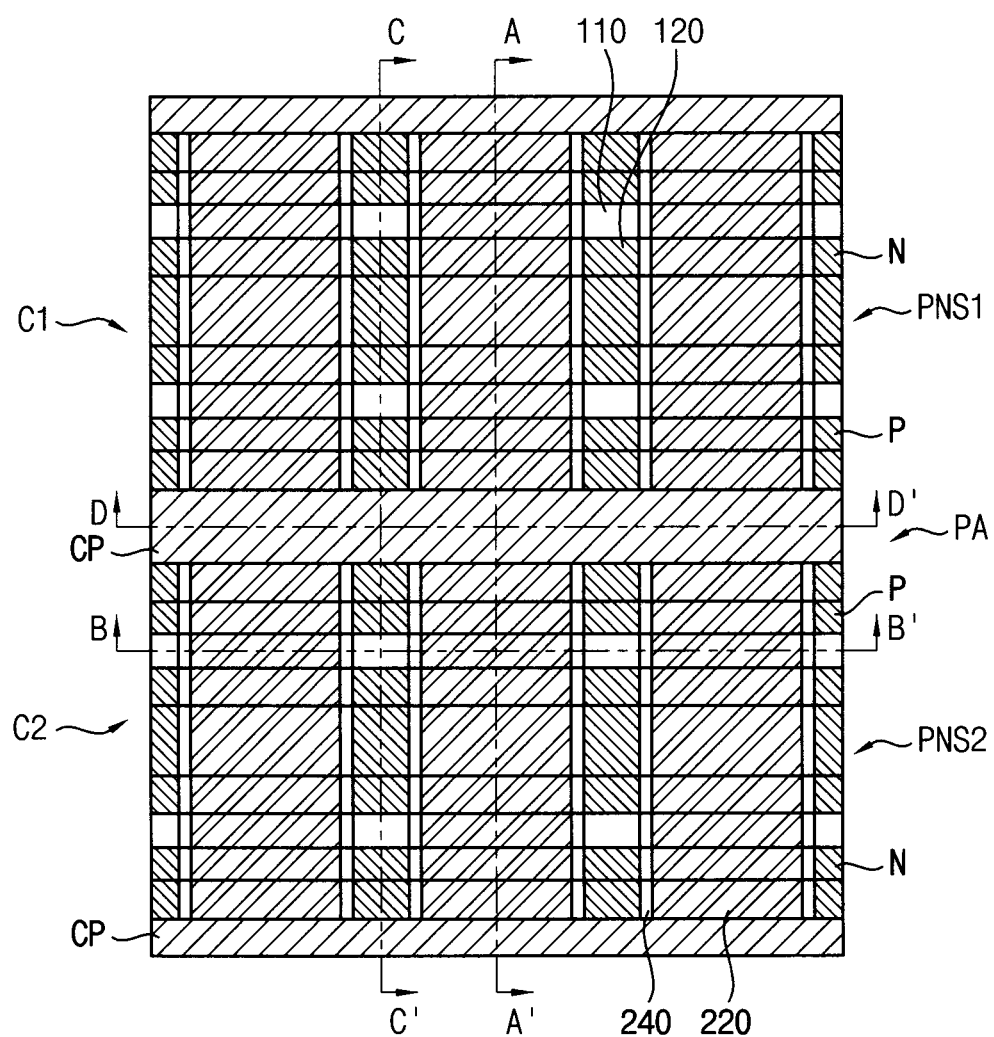
Figure 20A:
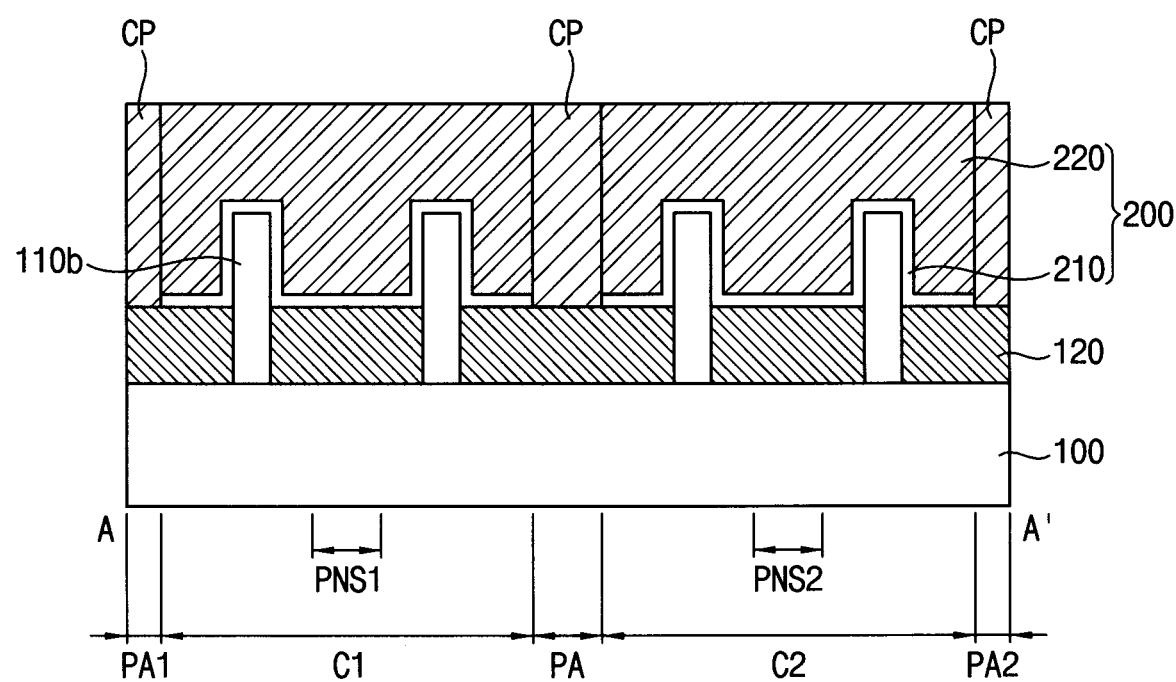
Figure 20B:
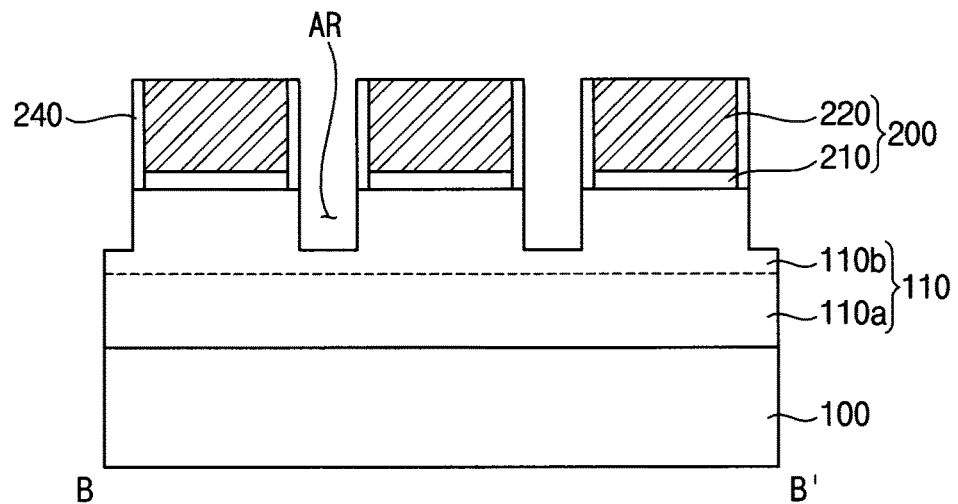
Figure 20C:
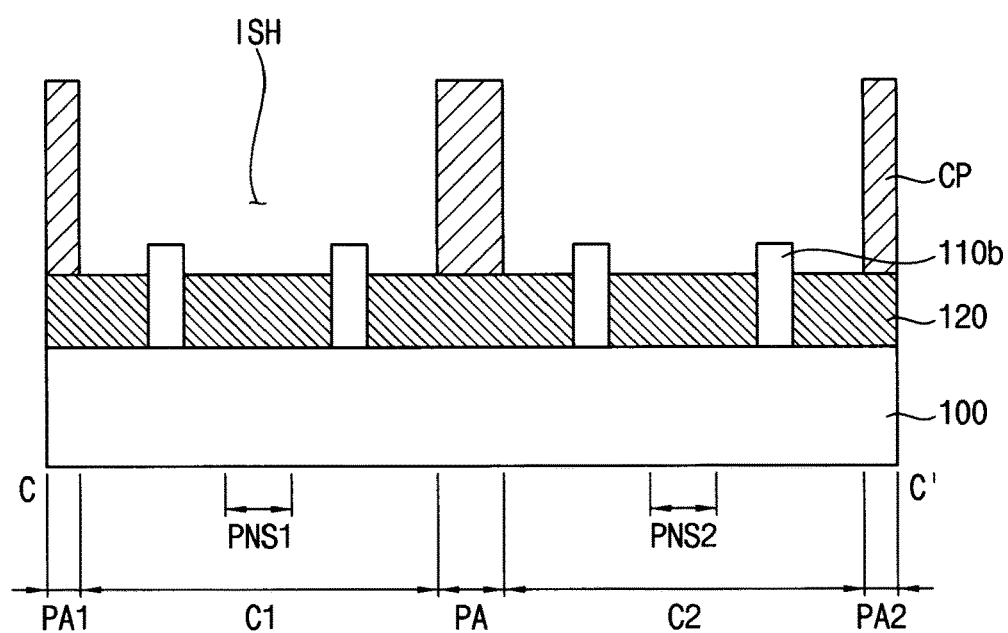
Figure 20D:
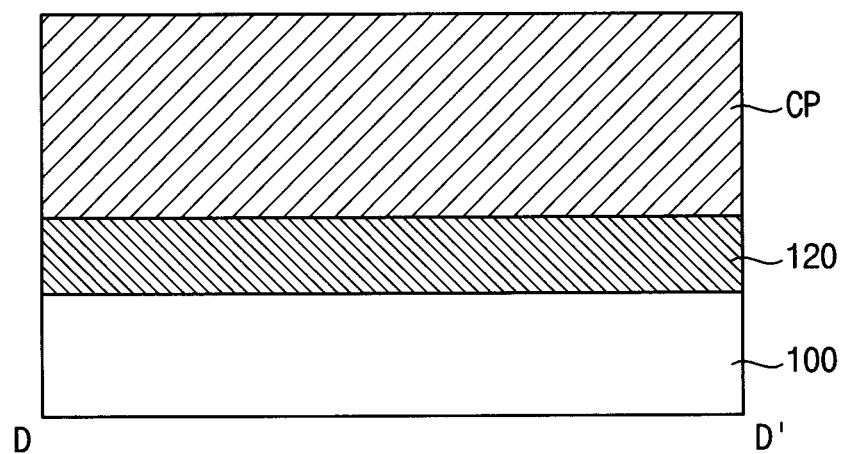
Figure 21:
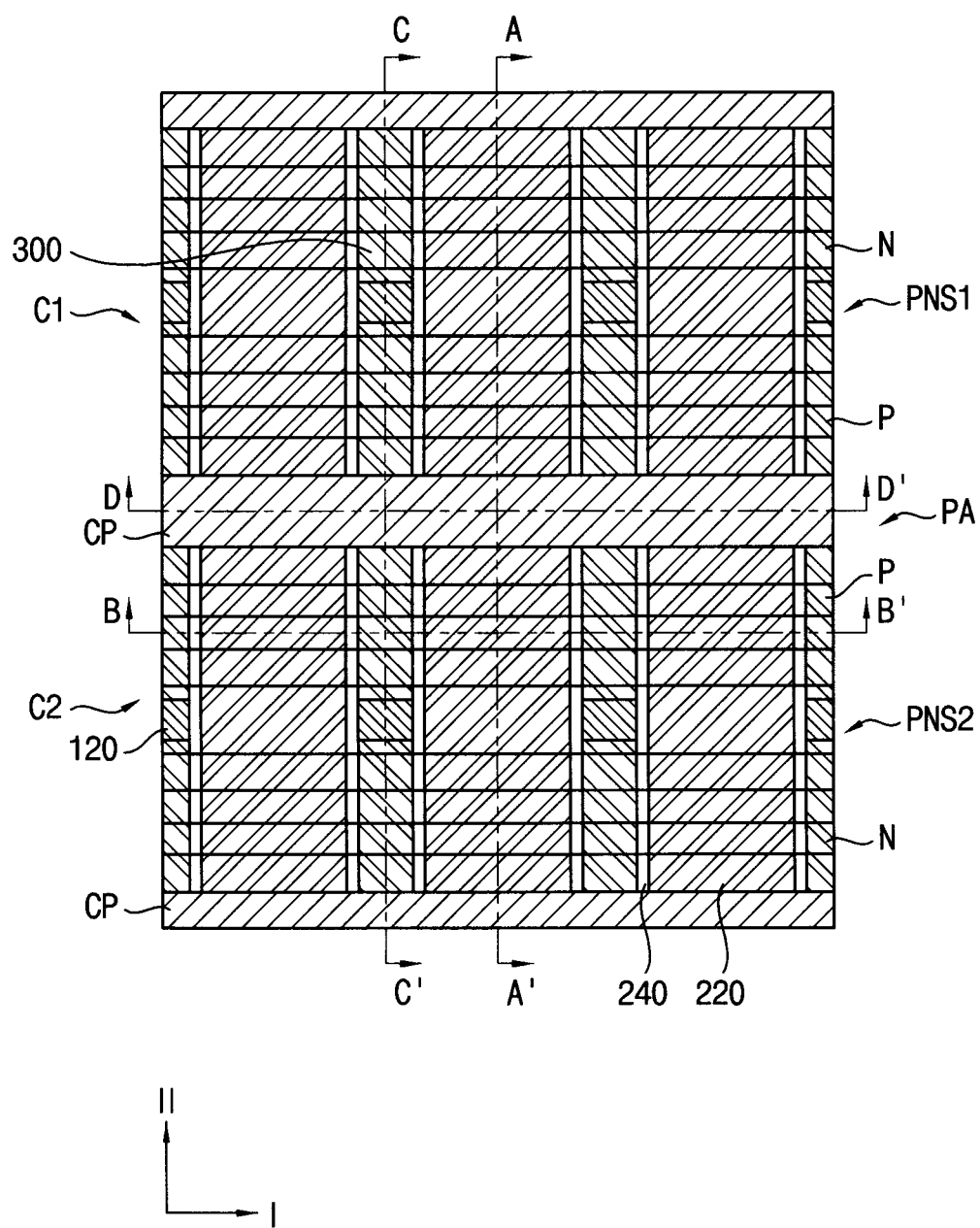
Figure 22A:
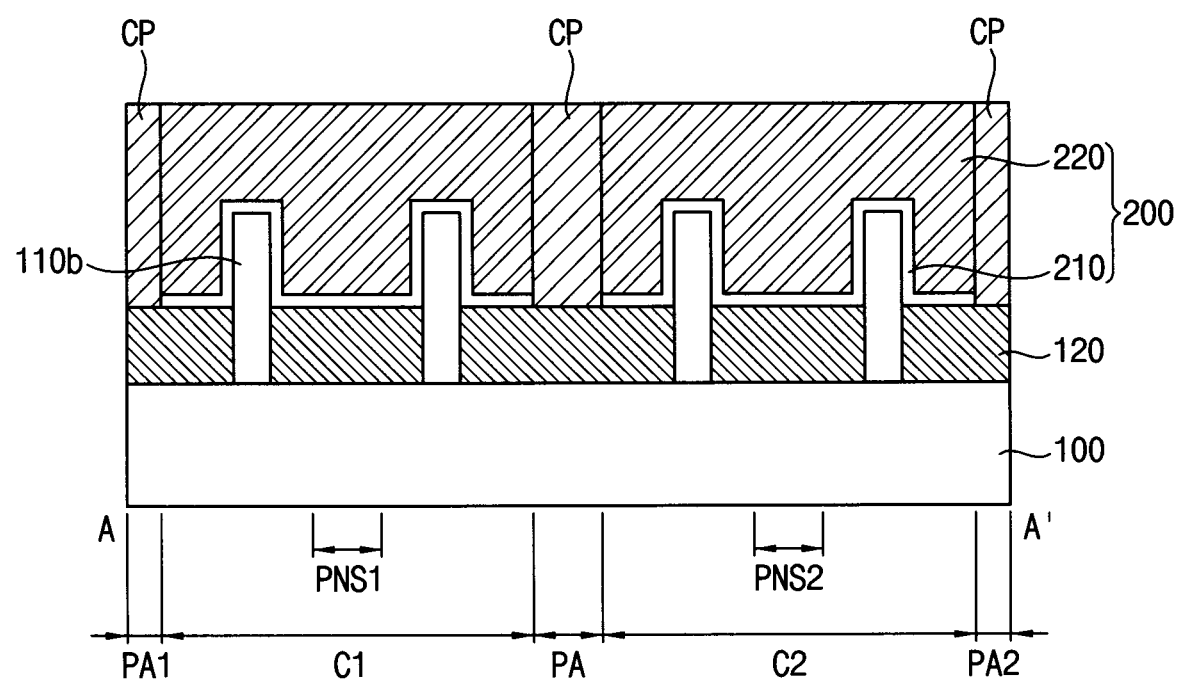
Figure 22B:
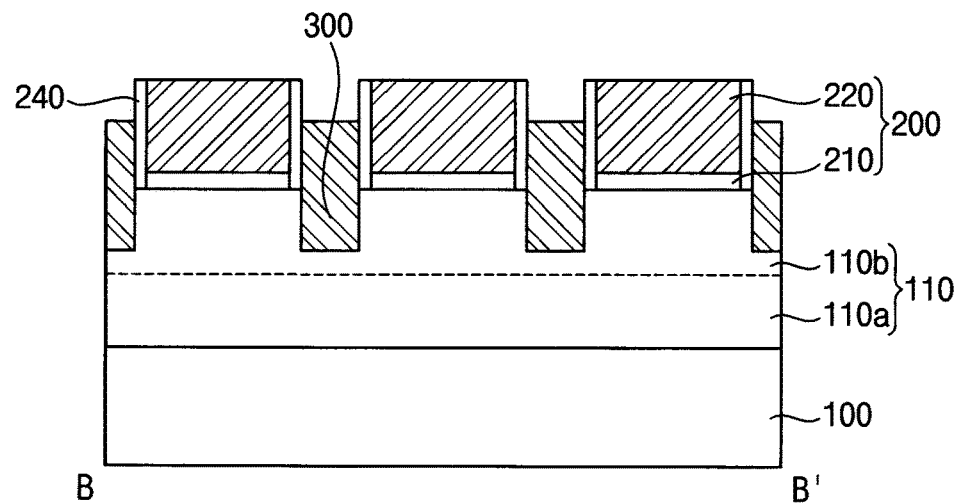
Figure 22B:
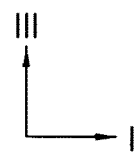
Figure 22C:
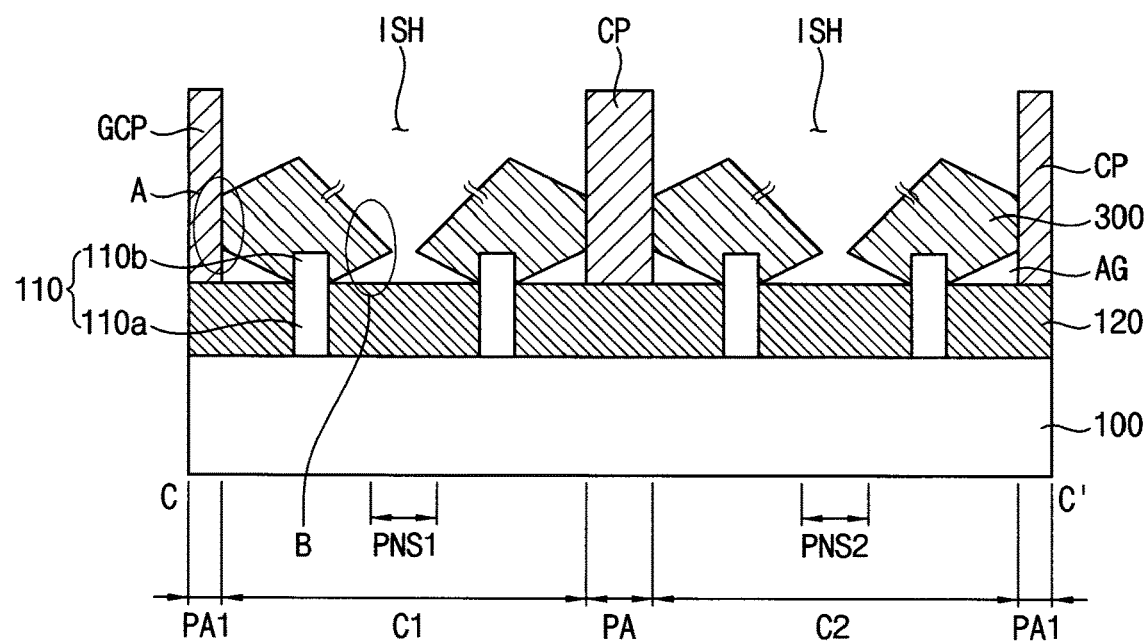
Figure 22C:
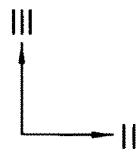
Figure 22D:
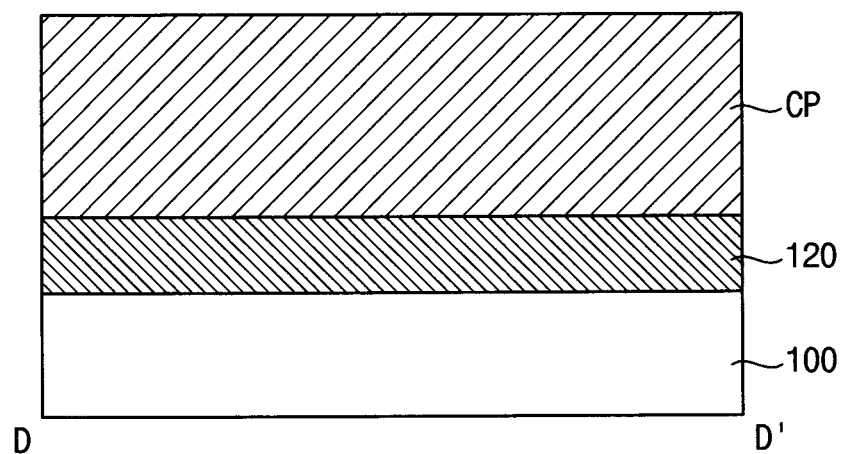
Figure 22D:
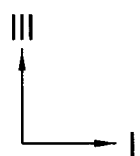
Figure 23:
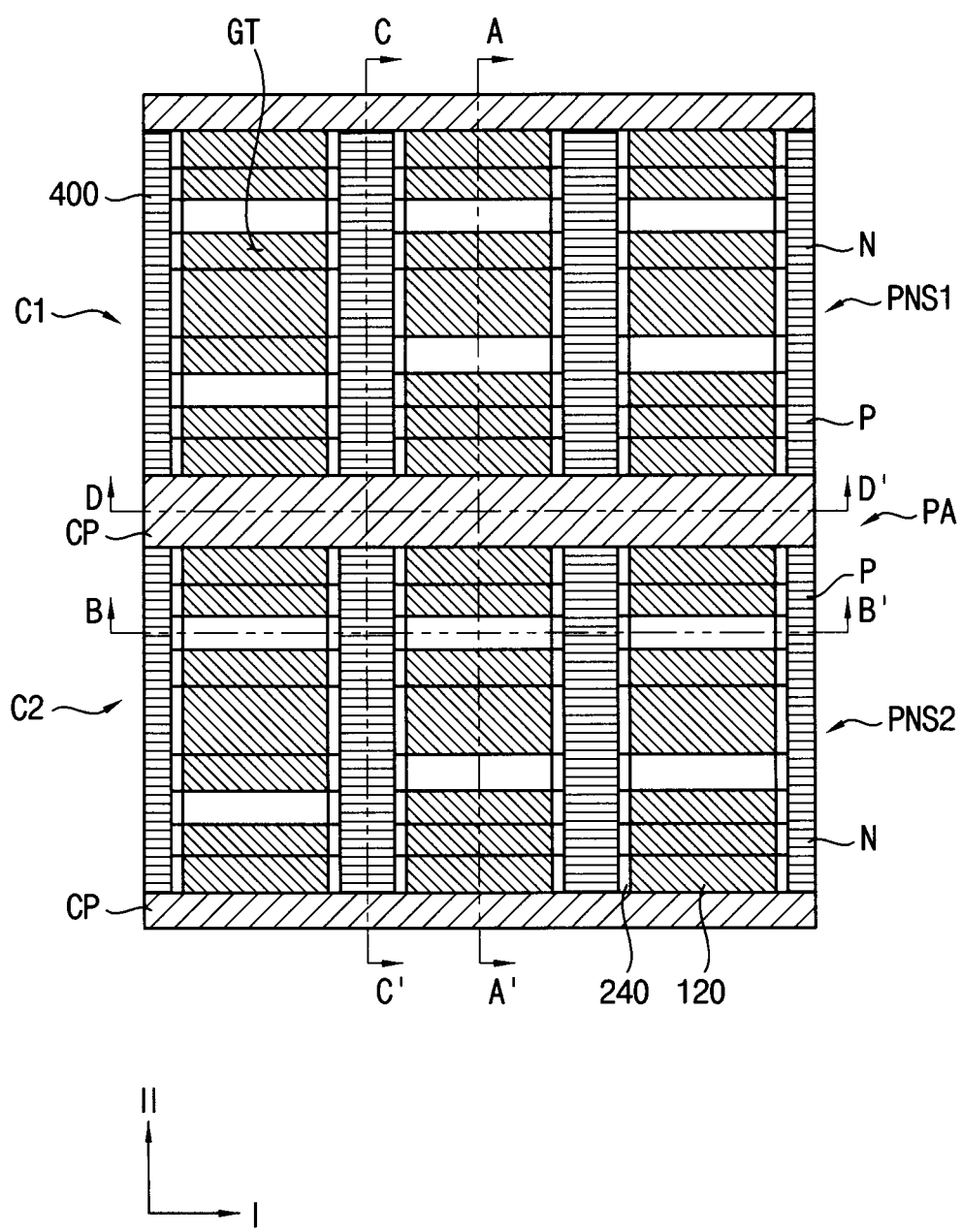
Figure 24A:
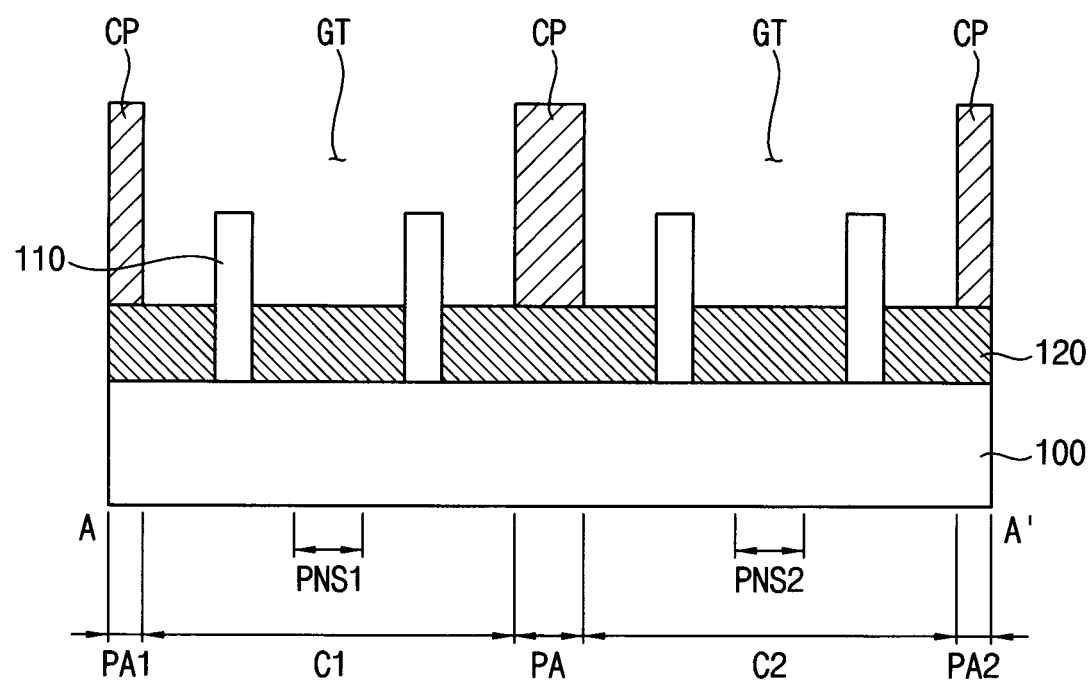
Figure 24A:
Figure 24B:
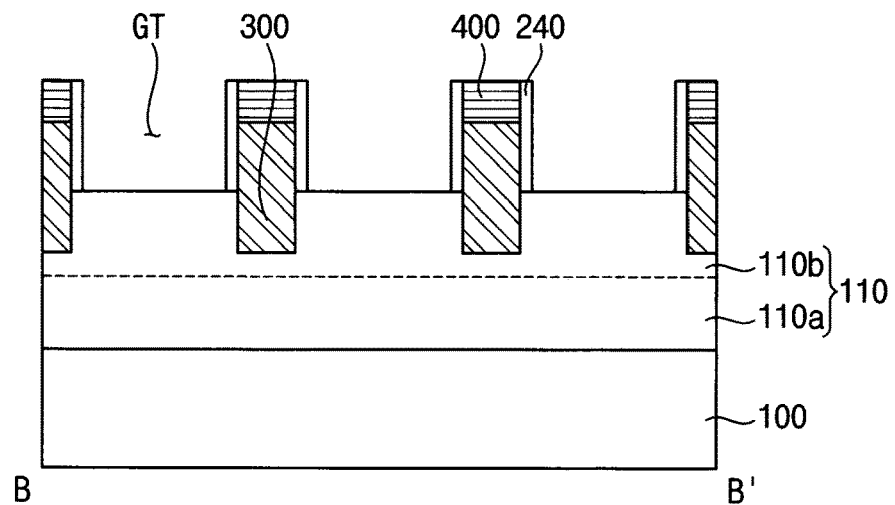
Figure 24B:
Figure 24C:
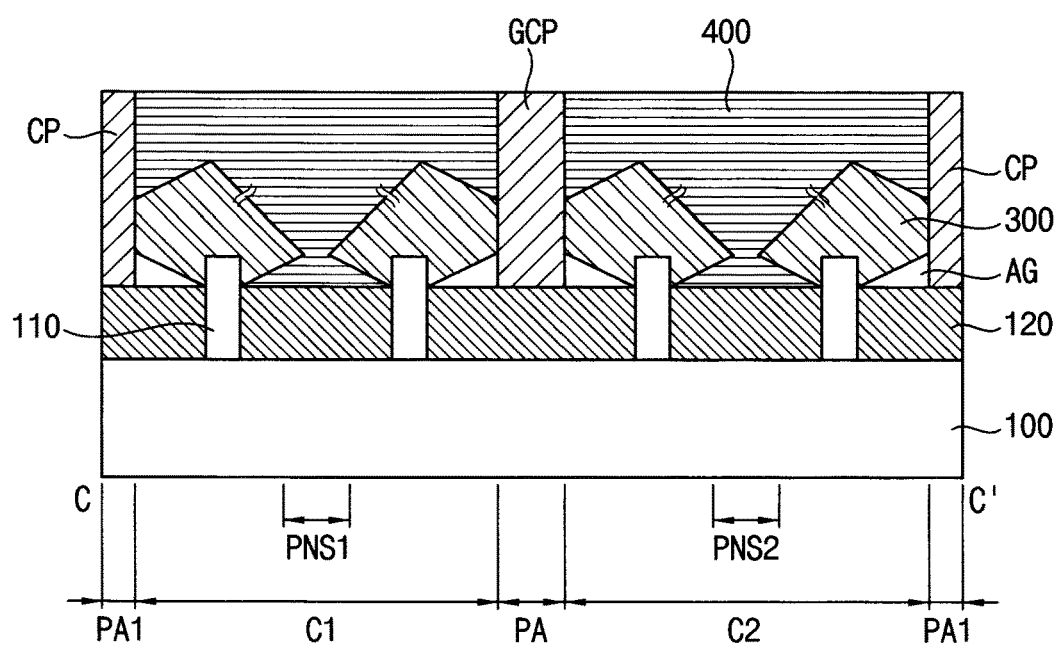
Figure 24C:
Figure 24D:
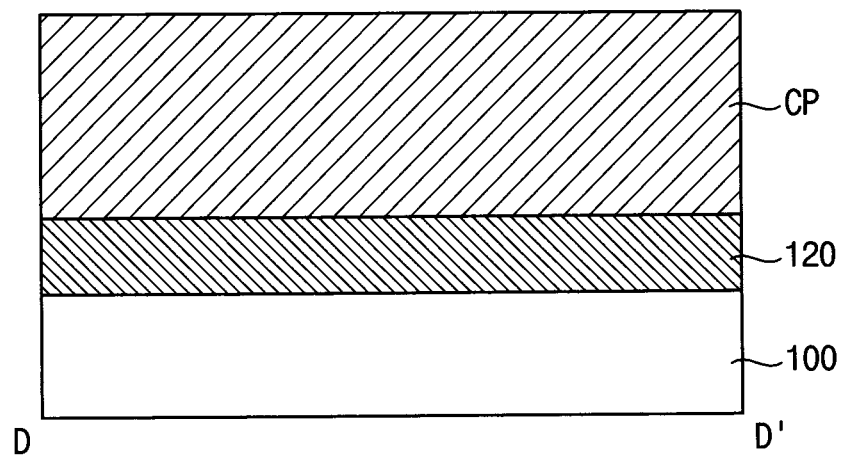
Figure 25:
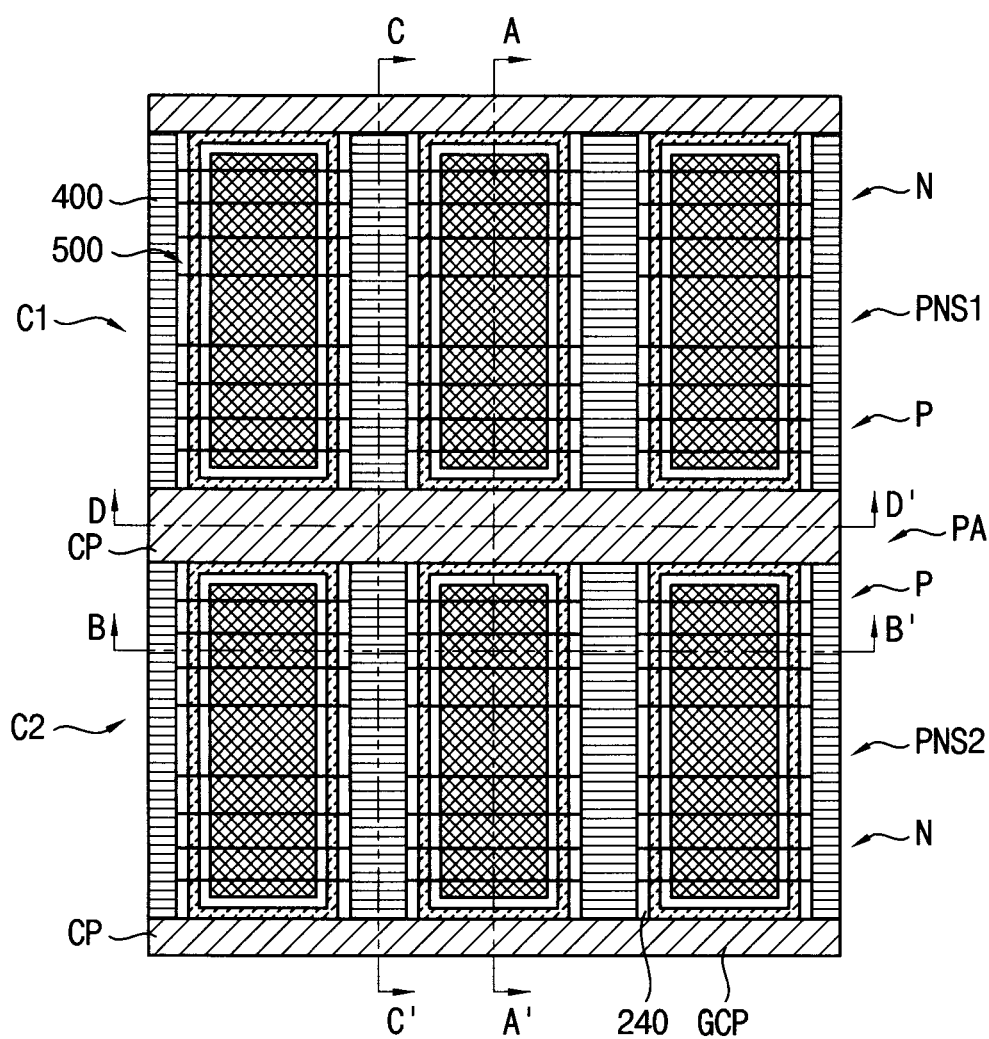
Figure 26A:
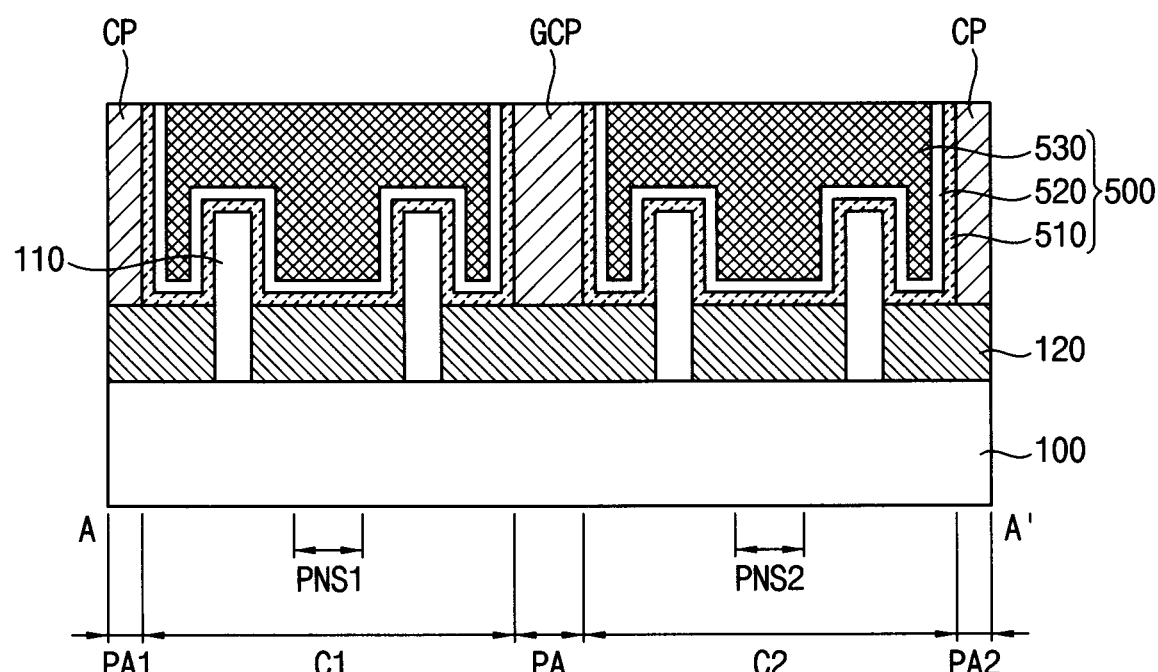
Figure 26B:
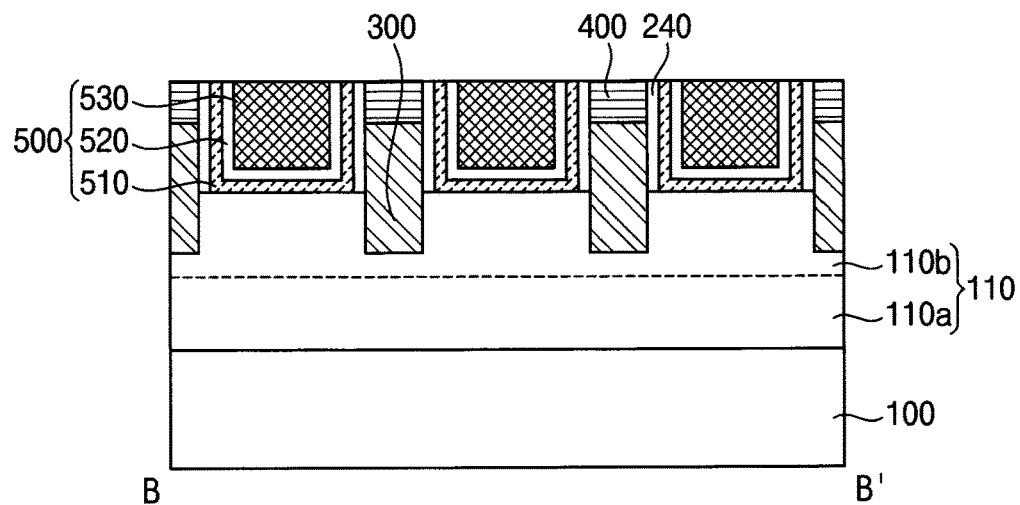
Figure 26B:
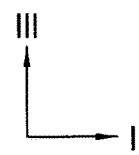
Figure 26C:
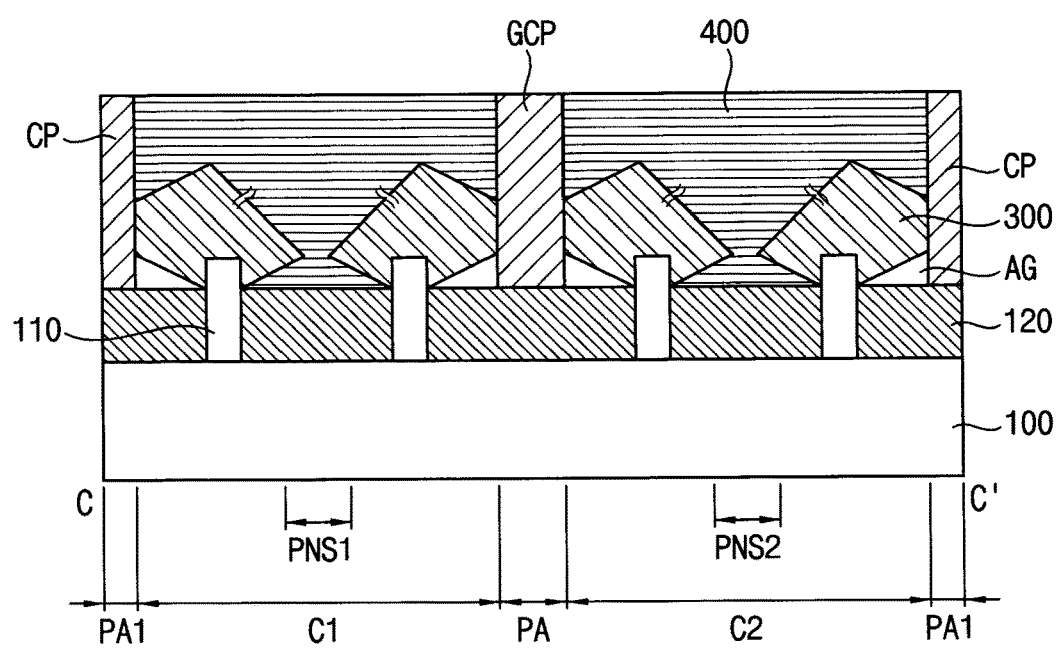
Figure 26C:
Figure 26D:
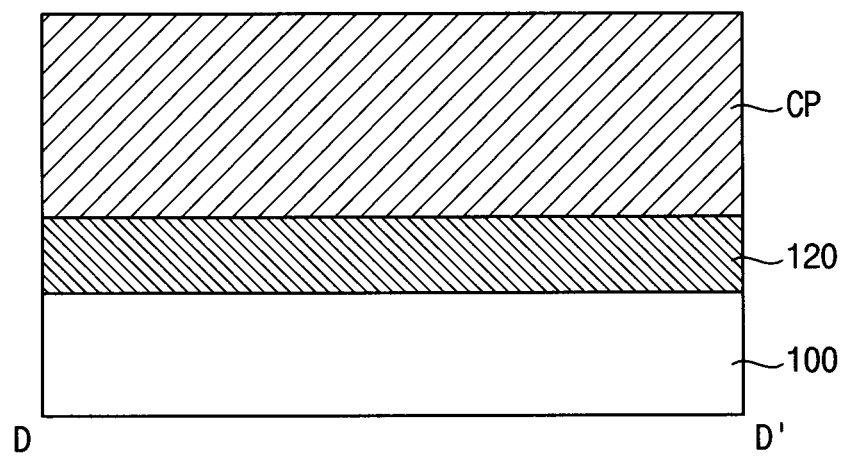
Figure 26D:
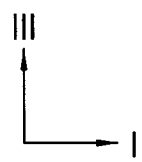
Figure 27:
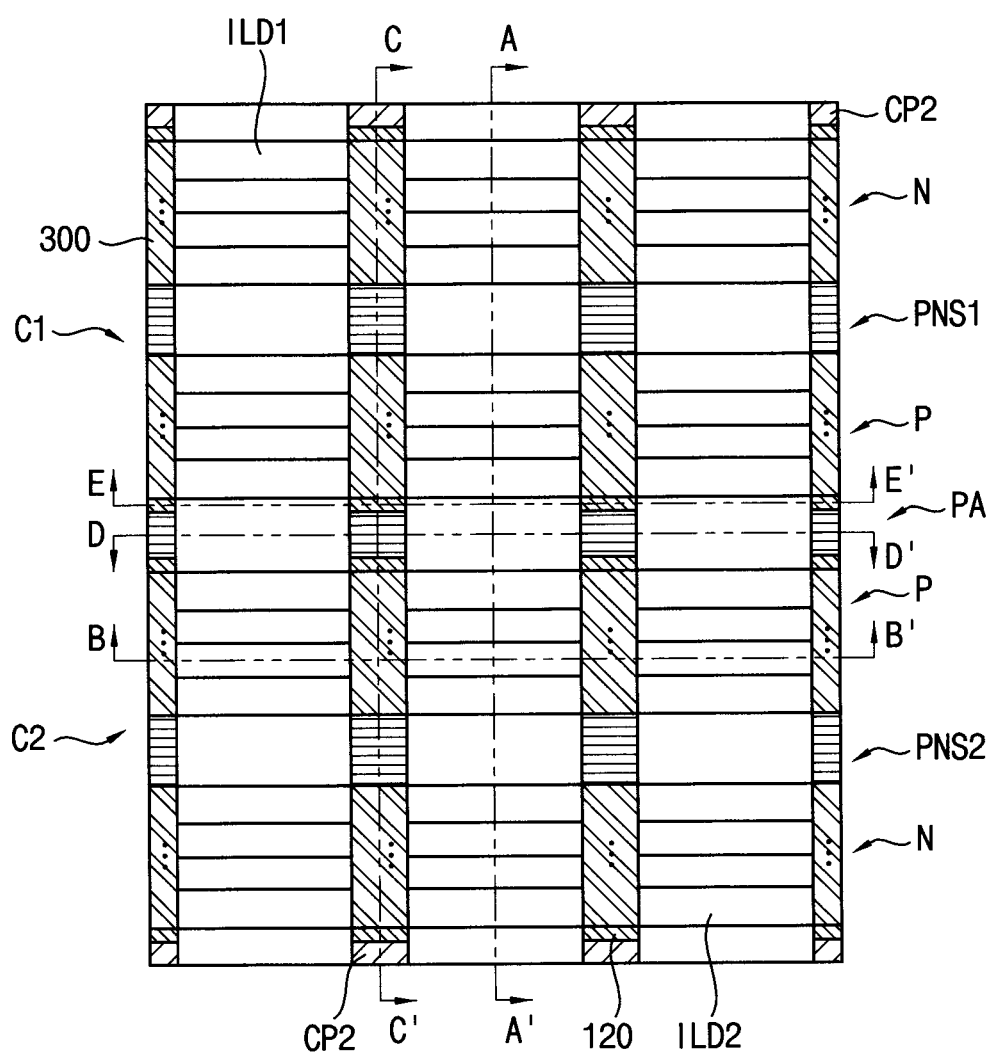
Figure 28A:
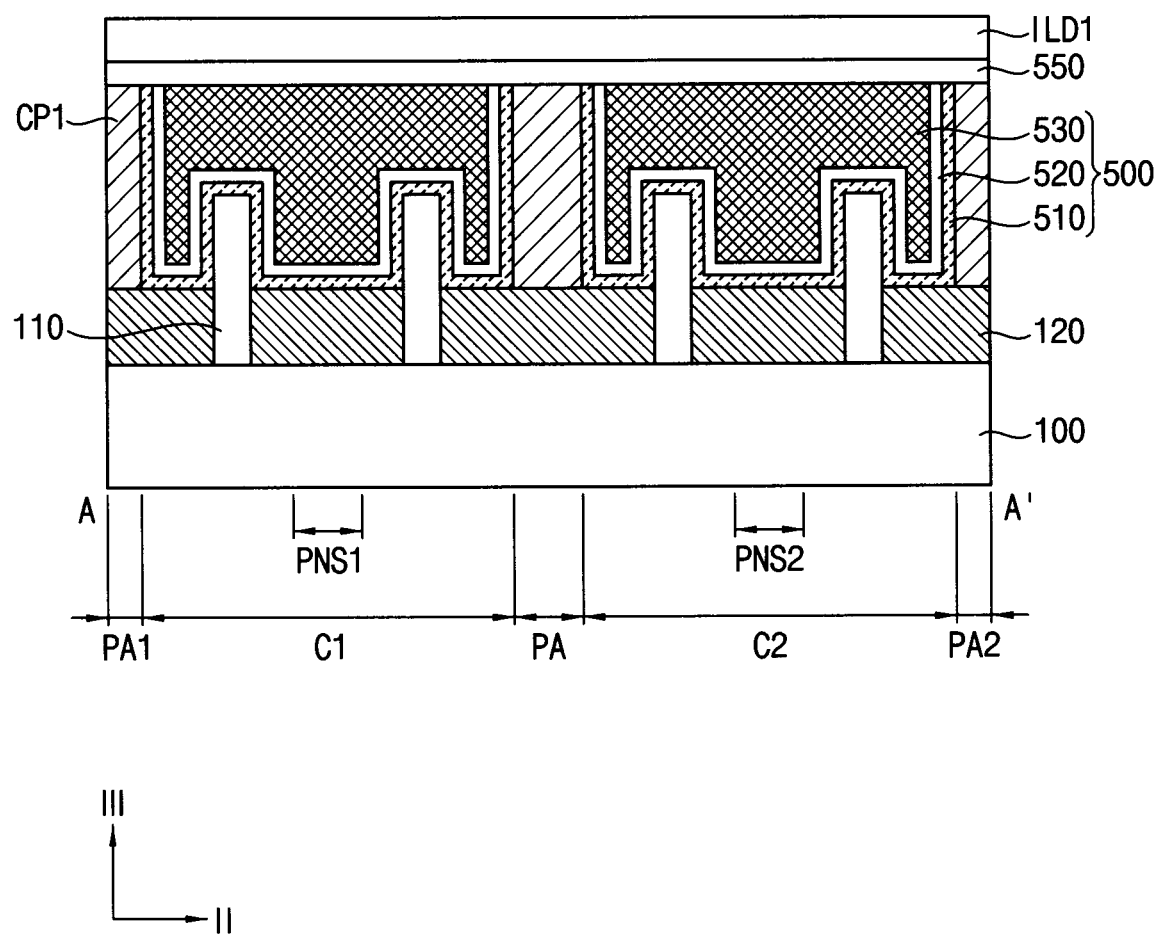
Figure 28B:
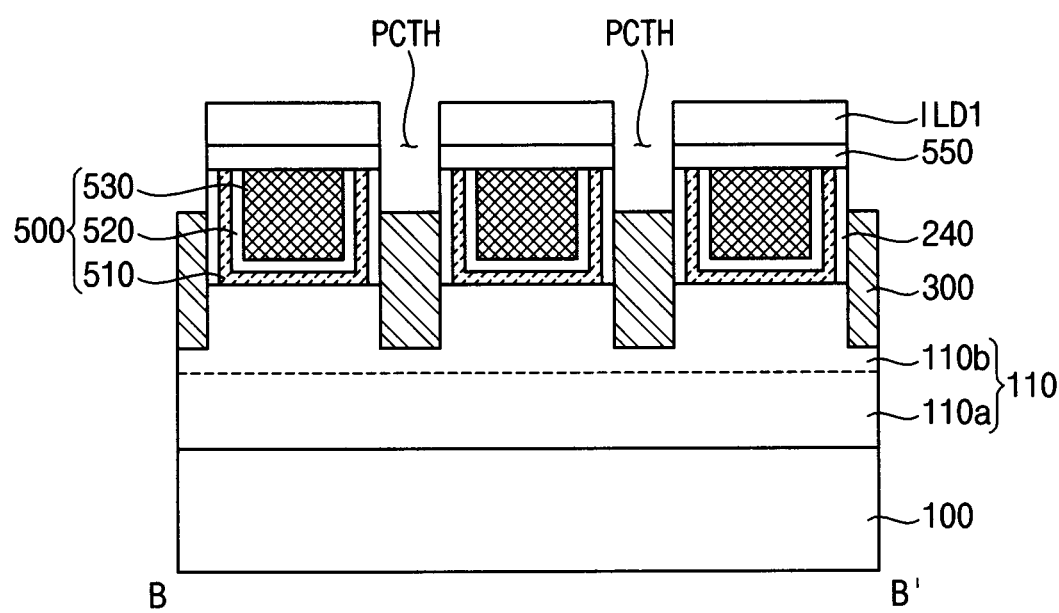
Figure 28C:
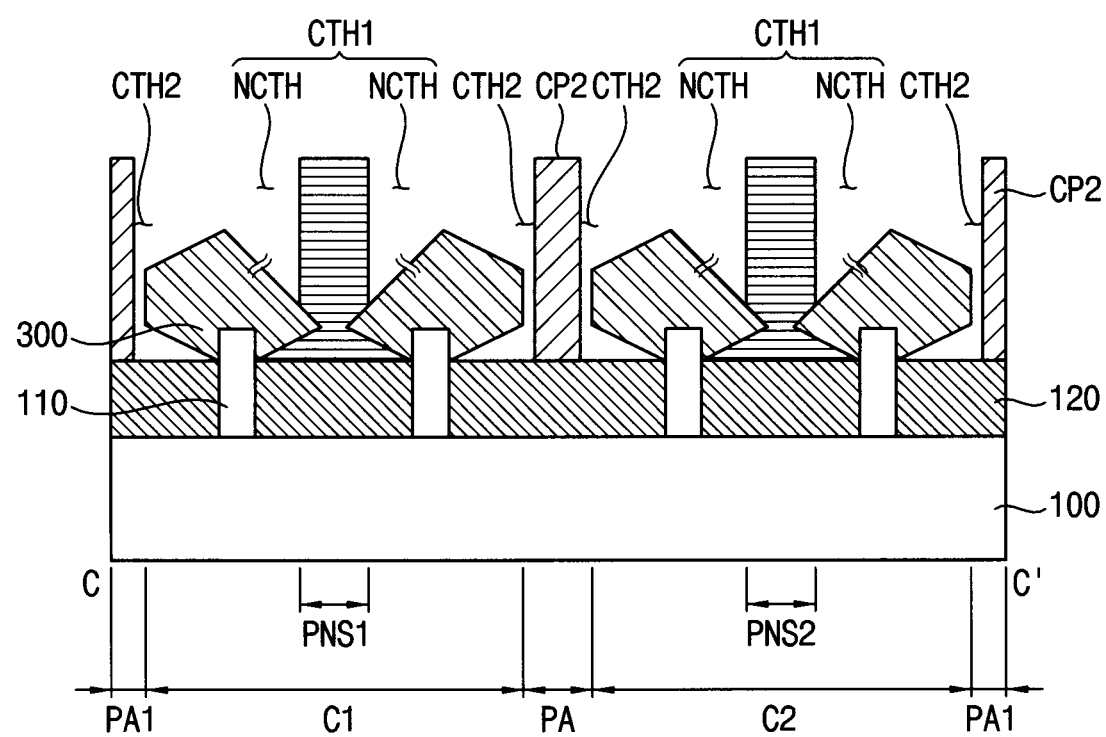
Figure 28D:
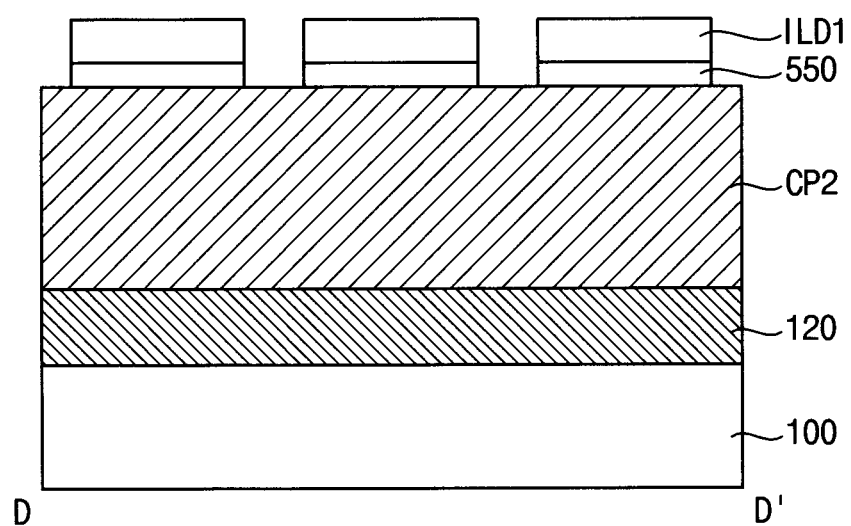
Figure 28E:
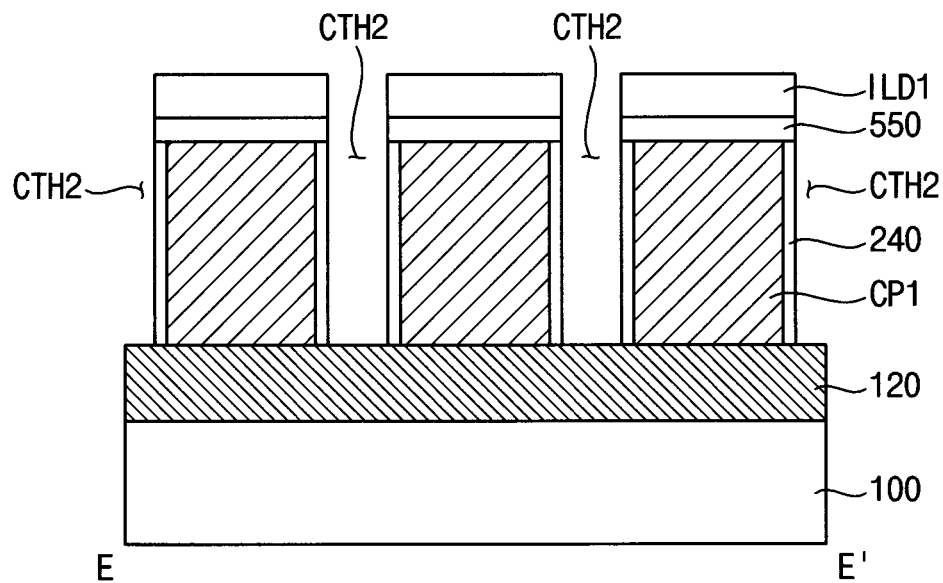
Figure 29:
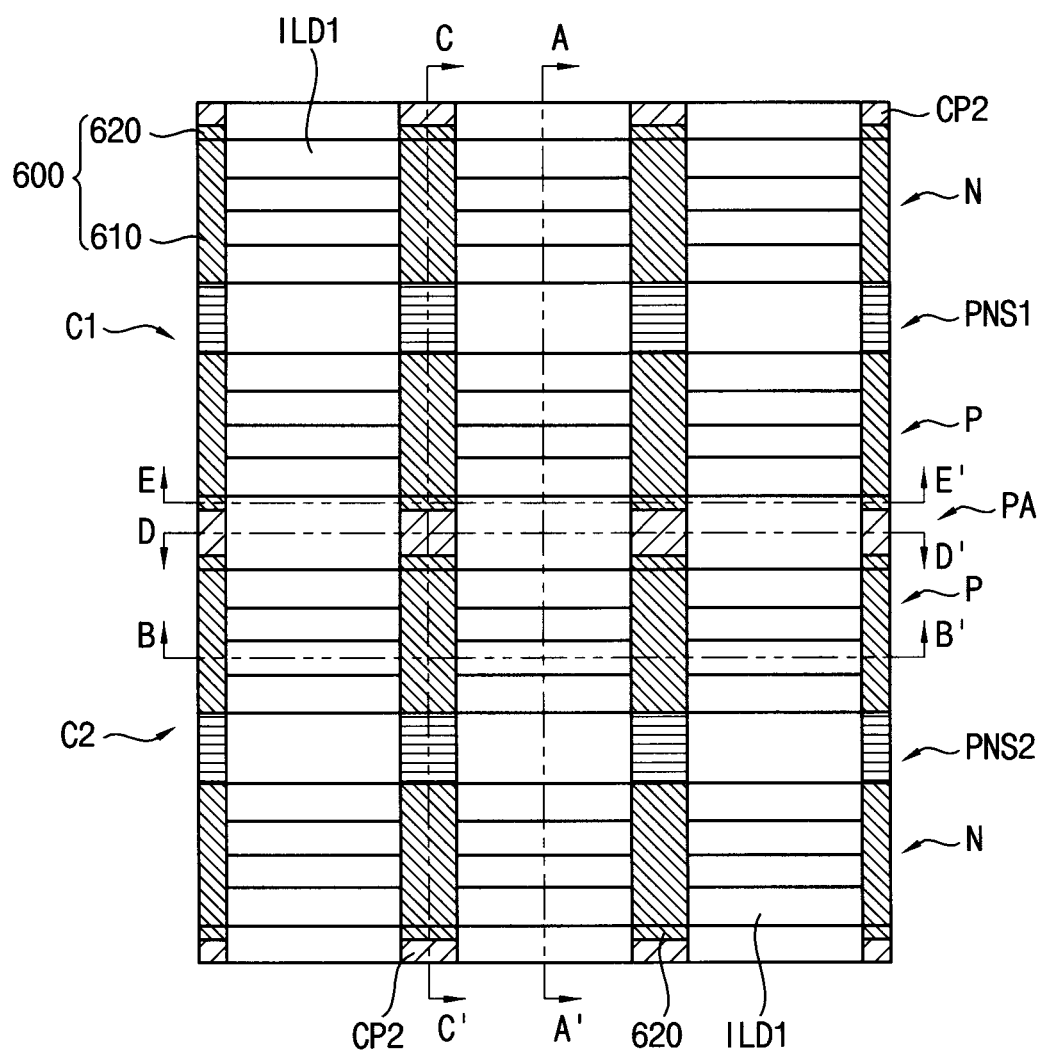
Figure 30A:
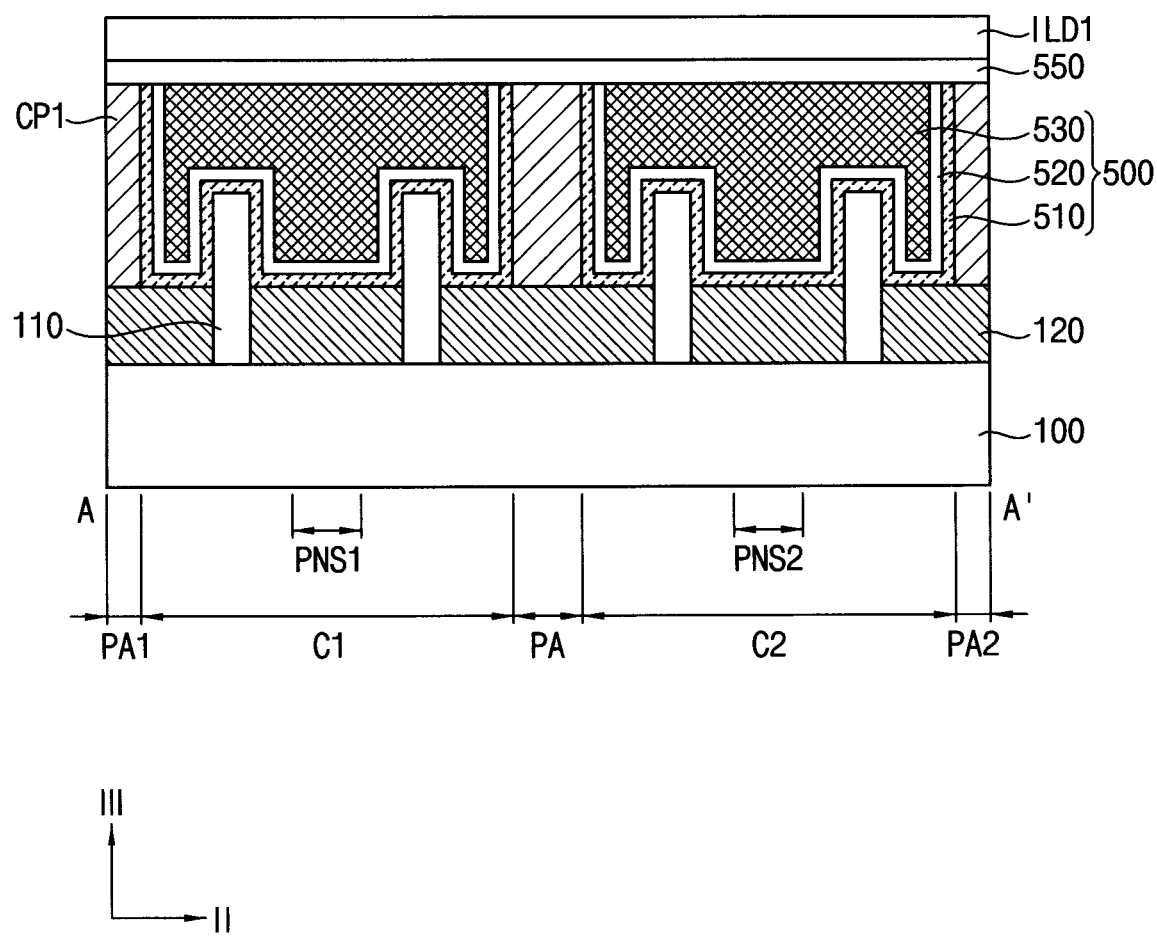
Figure 30B:
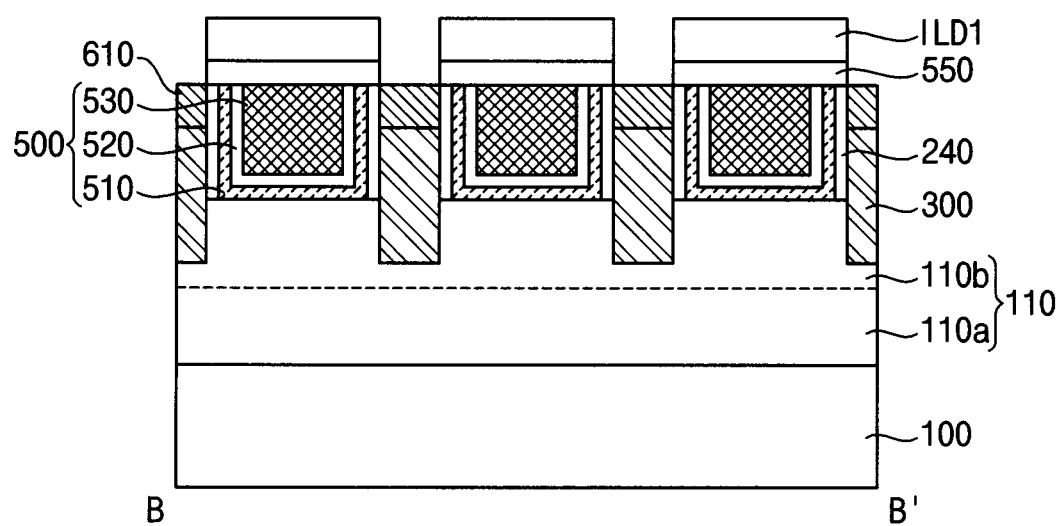
Figure 30B:
Figure 30C:
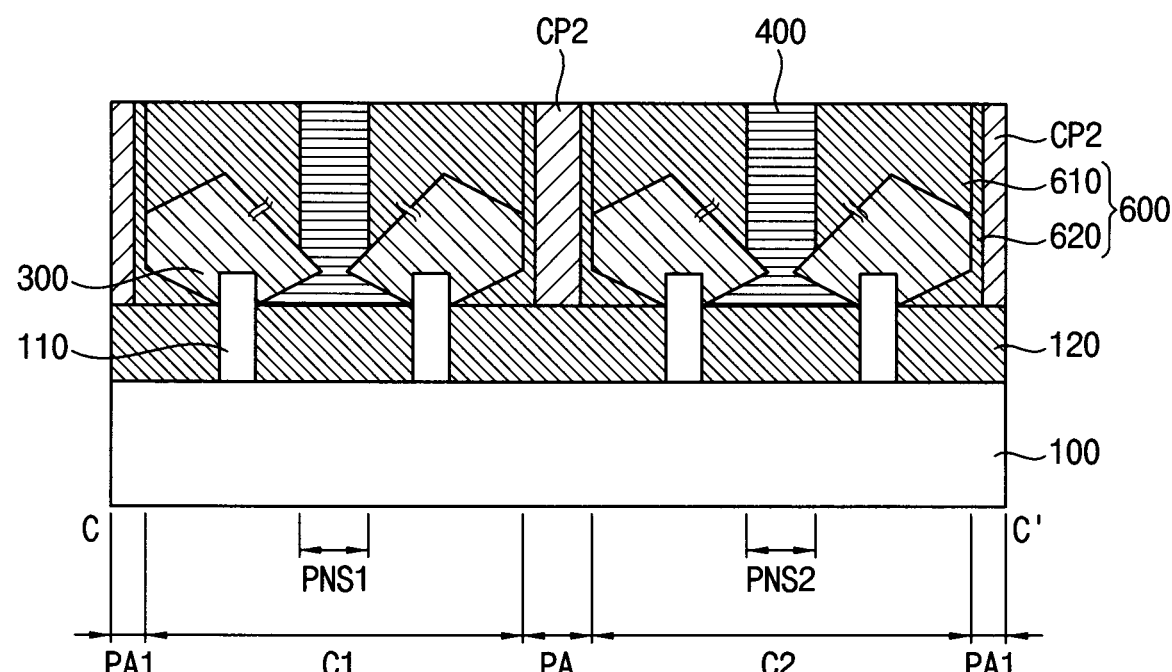
Figure 30D:
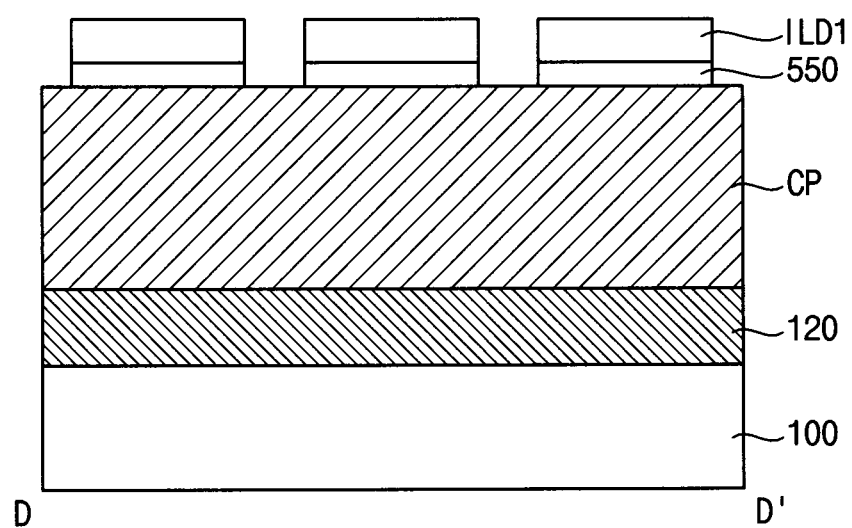
Figure 30E:
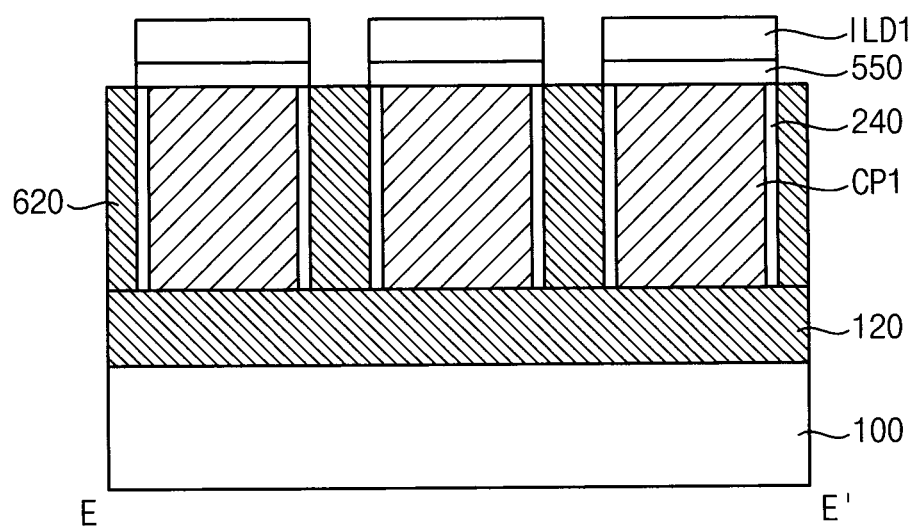
Figure 31:
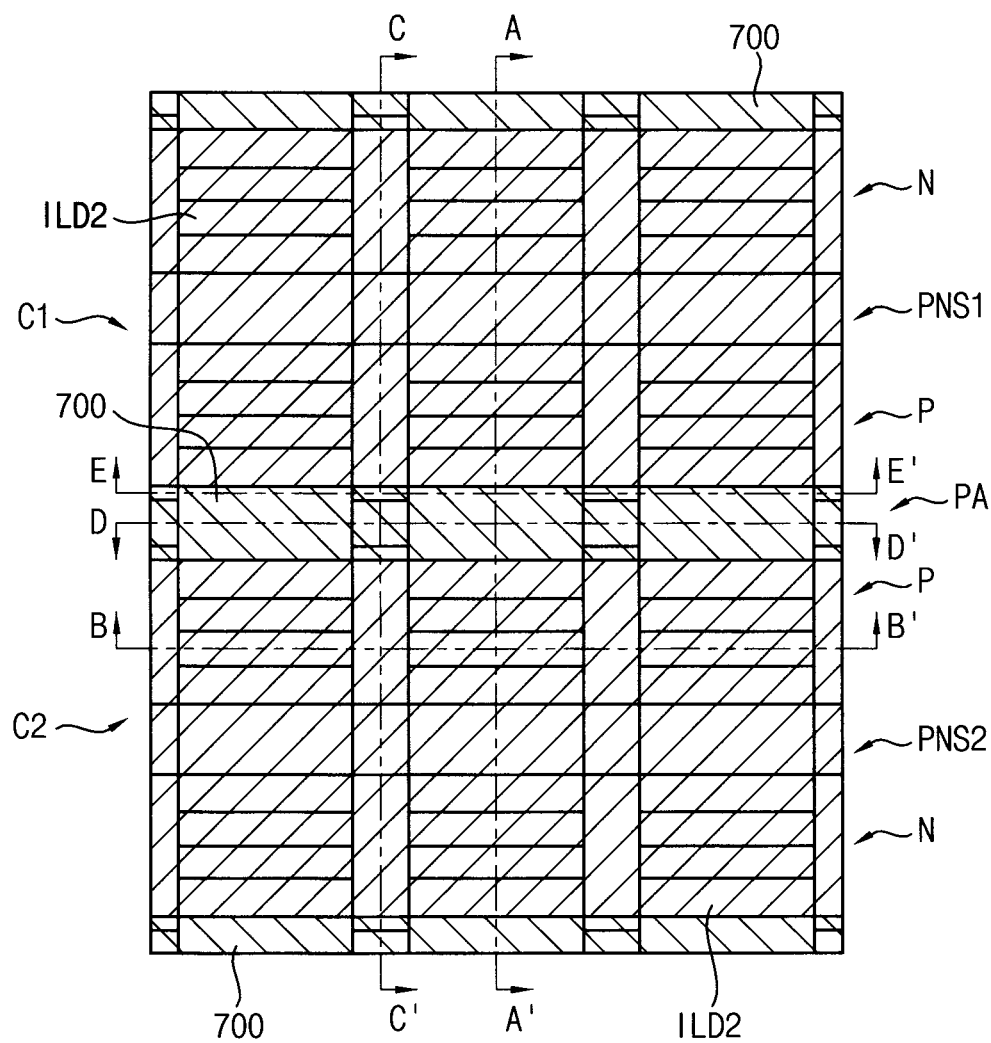
Figure 32A:
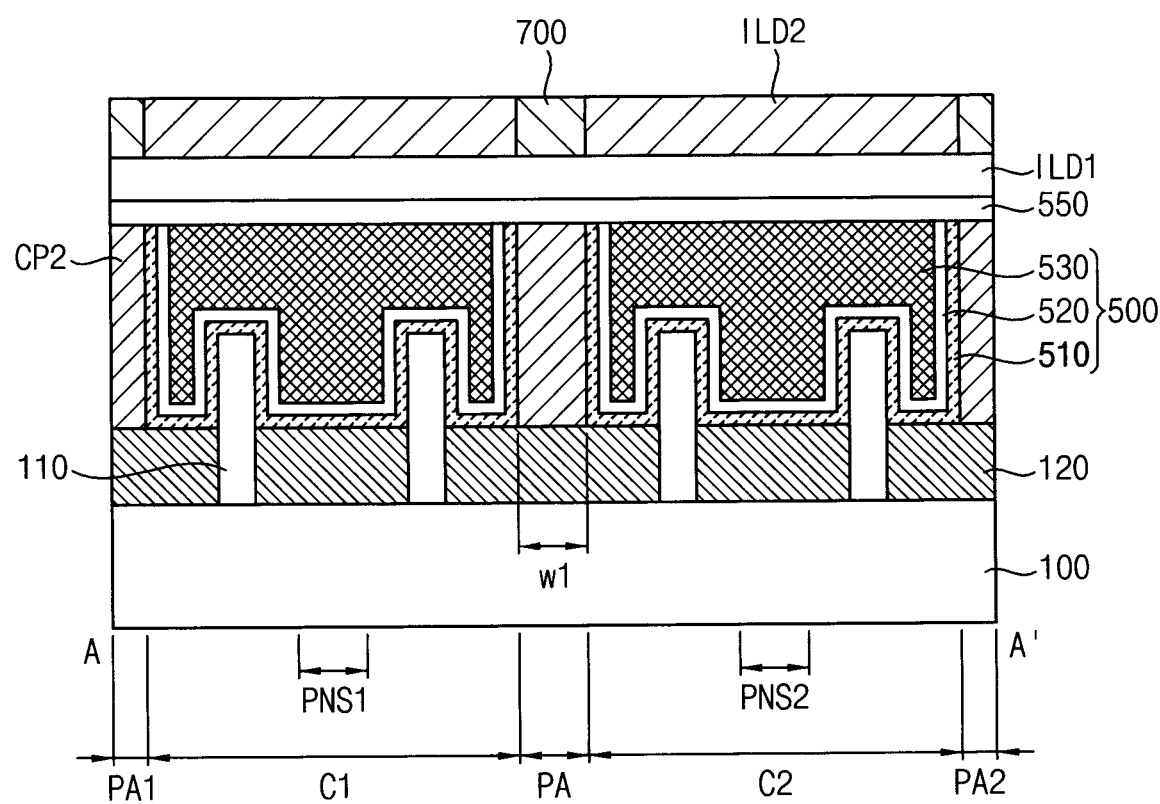
Figure 32B:
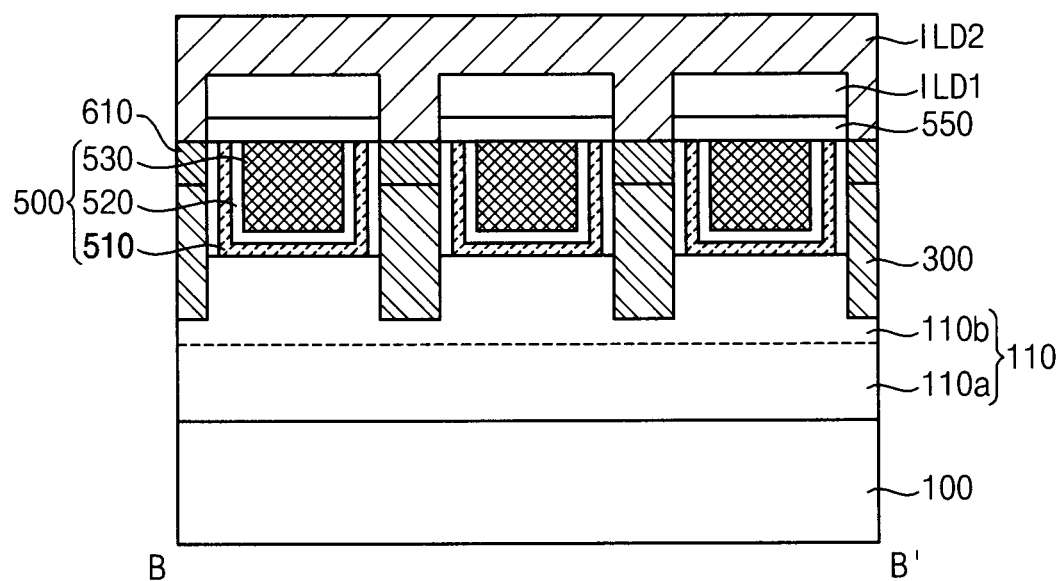
Figure 32C:
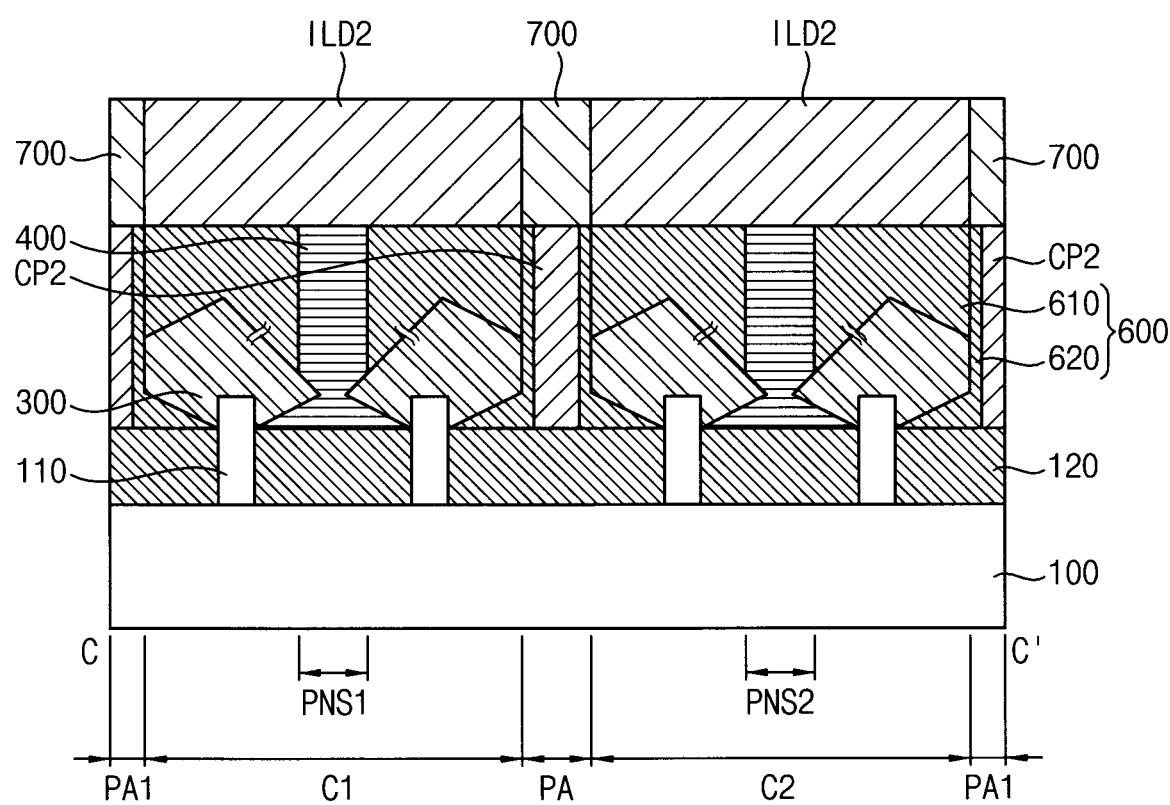
Figure 32C:
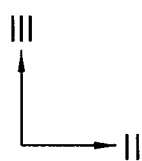
Figure 32D:
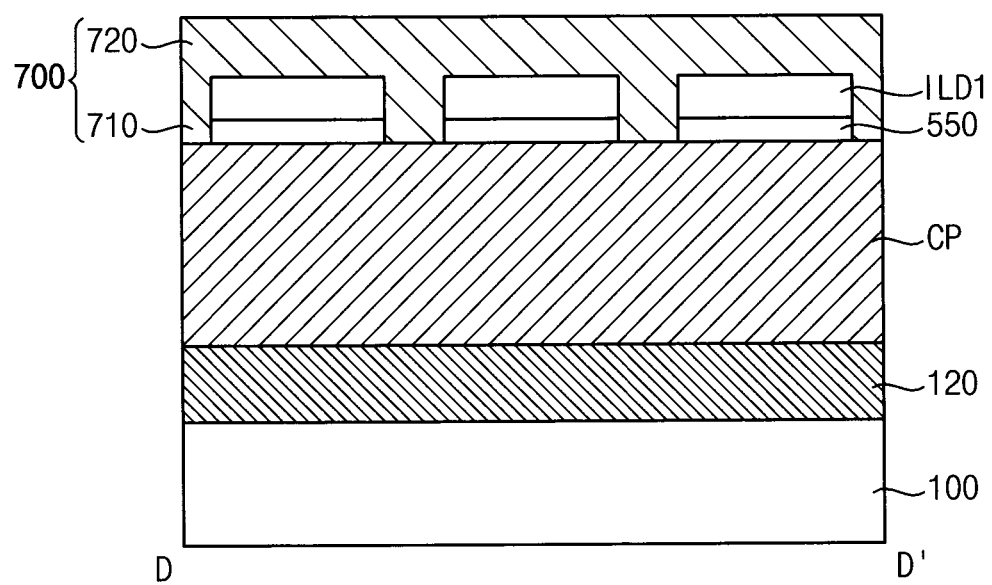
Figure 32D:
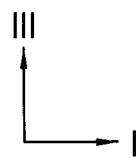
Figure 32E:
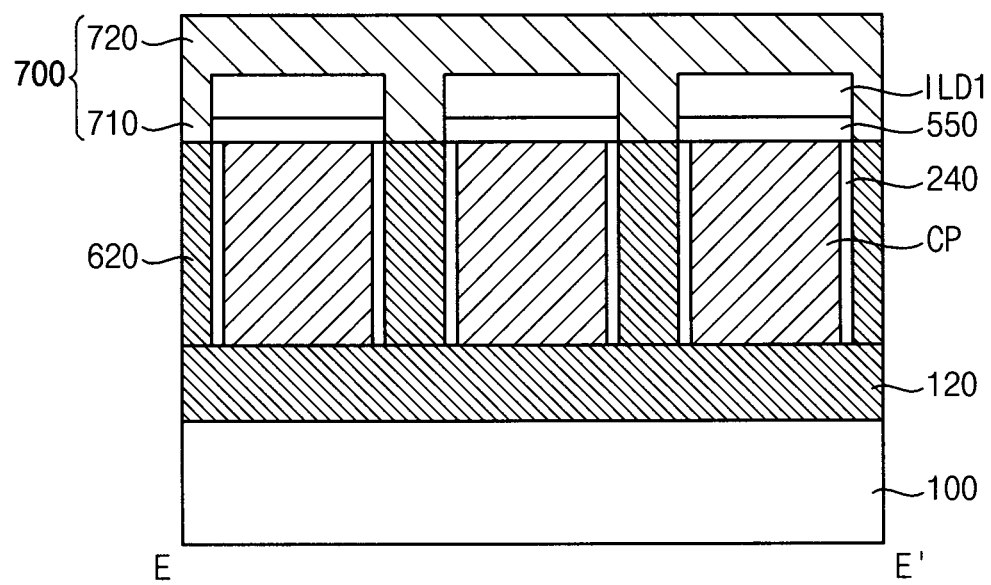
Figure 32E:
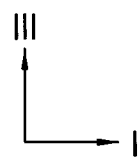

Referring to FIGS. 7 and 8A to 8B, the device isolation layer 120 may be formed on the substrate 100 in such a way that a lower portion of the active fin 110 (referred to as lower fin 110a) may be surrounded on two sides by the device isolation layer 120 and an upper portion of the active fin 110 (referred to as upper fin 110b) may protrude from the device isolation layer 120.

For example, an insulation layer may be formed on the substrate 100 to a sufficient thickness to fill up the recess R and the insulation layer may be planarized until a top surface of the active fin 110 may be exposed.

Then, a mask pattern may be formed on the substrate 110 having the insulation layer in such a way that the active fin 110 may be at least partially covered by the mask pattern. Then, the insulation pattern may be further removed by an etching process using the mask pattern as an etch mask until a top surface of the insulation layer may be lower than the top surface of the active fin 110, thereby forming the insulation layer 120 in a lower portion of the recess R. For example, the device isolation layer 120 may cover the field region F at the lower portion of the recess R and an upper surface of the device isolation layer 120 may be lower than the top surface of the active fin 110. For example, the device isolation layer 120 may include an insulation material such as silicon oxide (SiO).

Thus, an entire surface of the substrate 100 may be covered by the device isolation layer 120, except for the active fin 110. The lower fin 110a may be at least partially enclosed by the device isolation layer 120 and the upper fin 110b may be exposed to surroundings.

While the present exemplary embodiment discloses that the device isolation layer 120 may be formed through a deposition process, a planarization process and an etching process, the device isolation layer 120 may be formed through other processes. For example, the device isolation layer 120 may be formed through a selective epitaxial growth (SEG) process using the bottom of the recess R as a seed.

Referring to FIGS. 9 and 10A to 10C, a preliminary dummy gate structure 200a may be formed on the device isolation layer 120 as a line extending in the second direction II.

A dummy gate insulation layer may be formed on the device isolation layer 120 along a surface profile of the upper fin 110b and a dummy gate electrode layer may be formed on the dummy gate insulation layer to a sufficient thickness to fill up gap spaces between the neighboring upper fins 110b.

For example, the dummy gate insulation layer may include an oxide such as silicon oxide, and the dummy gate electrode layer may include polysilicon. A deposition process such as a chemical vapor deposition (CVD) process and an atomic layer deposition (ALD) process may be conducted for forming the dummy gate insulation layer and the dummy gate electrode layer.

Then, a mask layer may be formed on the dummy gate electrode layer and may be partially removed from the dummy gate electrode layer by a photolithography process, thereby forming a line-shaped mask pattern 230 extending in the second direction II on the dummy gate electrode layer.

The dummy gate insulation layer and the dummy gate electrode layer may be partially removed from the device isolation layer 120 by an etching process using the line-shaped mask pattern 230 as an etch mask, thereby forming a dummy gate insulation pattern 210 and a dummy gate electrode pattern 220 into a line pattern extending in the second direction II. The line-shaped dummy gate electrode pattern 220 and the dummy gate insulation pattern 210 may be formed into a preliminary dummy gate structure 200a extending in the second direction II. The neighboring preliminary dummy gate structures 200a may be spaced apart from each other by a gap distance in the first direction I.

Referring to FIGS. 11 and 12A to 12C, a gate spacer 240 may be formed on both sides of the preliminary dummy gate structure 200a and a dummy gate structure 200 defined by the gate spacer 240 may be formed on the device isolation layer 120.

A spacer layer may be formed on the preliminary dummy gate structure 200a and the device isolation layer 120. Then, the spacer layer may be partially removed from the device isolation layer 120 by an anisotropic etching process, thereby forming the gate spacer 240 at least partially covering the side surfaces of the dummy gate insulation pattern 210 and the dummy gate electrode pattern 220. For example, the gate spacer 240 may include a nitride such as silicon nitride (SiN) and silicon carbon oxynitride (SiOCN).

When the anisotropic etching process may be conducted to the spacer layer, the mask pattern 230 may also be removed from the dummy gate electrode pattern 220 and thus an upper surface of the gate spacer 240 may be coplanar with an upper surface of the dummy gate electrode pattern 220.

Thus, the preliminary dummy gate structure 200a may be formed into the line-shaped dummy gate structure 200 having the dummy gate insulation pattern 210 and the dummy gate electrode pattern 220 and extending in the second direction II and both sides of the dummy gate structure 200 may be at least partially covered by the gate spacer 240. The gate spacer 240 may be shaped into a line extending in the second direction II and the device isolation layer 120 and the active fin 110 may be alternately exposed in the second direction II through a gap space between the neighboring gate spacers 240. Hereinafter, the gap space between the neighboring gate spacers 240 is referred to as the inter-space trench IST, so the inter-space trench IST may extend in the second direction II.

Referring to FIGS. 13 and 14A to 14C, a gap-fill pattern 250 may be formed in the inter-space trench IST in such a way that the device isolation layer 120 and the active fin 110 may be at least partially covered by the gap-fill pattern 250.

For example, a gap-fill layer may be formed on a whole surface of the substrate 100 having the dummy gate structure 200 and the gate spacer 240 to a sufficient thickness for filling up the inter-space trench IST. Thus, the dummy gate structure 200 and the gate spacer 240 may be at least partially covered by the gap-fill layer. The gap-fill layer may include an oxide such as silicon oxide (SiO) and may be formed by a deposition process such as the CVD process and the ALD process.

Then, the gap-fill layer may be planarized by a planarization process such as a chemical mechanical polishing (CMP) process and an etch-back process until the upper surface of the dummy gate structure 200 may be exposed, and thus the gap-fill layer may remain exclusively in the inter-spacer trench IST as the gap-fill pattern 250. The gap fill pattern 250 may be shaped into a line extending in the second direction II and an upper surface of the gap fill pattern 250 may be substantially coplanar with the upper surface of the dummy gate electrode pattern 220.

Referring to FIGS. 15 and 16A to 16D, the dummy gate structure 200, the gate spacer 240 and the gap fill pattern 250 may be removed from the device isolation layer 120, thereby forming a cutting trench CT through which the device isolation layer 120 may be exposed in the power area PA along the first direction I.

For example, a power cutting mask may be formed on the gap fill pattern 250 and the dummy gate structure 200 in such a way that the cell area C may be at least partially covered by the power cutting mask and the power area PA may be exposed through the power cutting mask. Then, the dummy gate structure 200, the gate spacer 240 and the gap fill pattern 250 may partially be removed from the device isolation layer 120 in the power area PA by an etching process using the power cutting mask as an etch mask.

In the present exemplary embodiment, the gap fill pattern 250 may include silicon oxide and the gate spacer 240 may include silicon nitride and the dummy gate structure 200 may include silicon oxide and polysilicon. Thus, the process conditions of the etching process may be controlled in view of the oxide, the nitride and the polysilicon. The dummy gate structure 200, the gate spacer 240 and the gap fill pattern 250 may be removed by the etching process. For example, the dummy gate structure 200, the gate spacer 240 and the gap fill pattern 250 may be removed along the power area PA and the device isolation layer 120 may be exposed along the power area PA through a trench defined by the dummy gate structure 200, the gate spacer 240 and the gap fill pattern 250 in the cell area C in the first direction I. Thus, the cutting trench CT may be formed on the substrate 100 in the power area PA along the first direction I.

The cell area C may be separated into the first cell area C1 and the second cell area C2 by the cutting trench CT.

While the present exemplary embodiment discloses that the cutting trench CT may be formed in the whole power area PA, the cutting trench CT may be formed in a portion of the power area PA.

In such a case, the dummy gate structure 200, the gate spacer 240 and the gap fill pattern 250 may remain in a peripheral portion of the power area PA and the cutting trench CT may be formed exclusively in a central portion of the power area PA.

Referring to FIGS. 17 and 18A to 18D, the cutting pattern CP may be formed in the cutting trench CT.

For example, a cutting layer may be formed on the dummy gate structure 200, the gate spacer 240 and the gap fill pattern 250 to a sufficient thickness for filling up the cutting trench CT and then may be planarized until top surfaces of the dummy gate structure 200, the gate spacer 240 and the gap fill pattern 250 may be exposed. Therefore, the cutting layer may remain exclusively in the cutting trench CT, thereby forming the cutting pattern CP in the cutting trench CT.

The cutting layer may include a nitride such as silicon nitride (SiN), silicon oxynitride (SiON) and silicon carbon oxynitride (SiOCN). Thus, the cutting layer may have a sufficient etch selectivity with respect to the gap fill pattern 250 comprising an oxide and the dummy gate electrode pattern 220 comprising polysilicon.

The cutting layer may be planarized by one of the CMP process and the etch-back process until the top surfaces of the dummy gate structure 200, the gate spacer 240 and the gap fill pattern 250 may be exposed.

Accordingly, the cutting pattern CP may be exposed in the power area PA and the dummy gate electrode pattern 220, the gate spacer 240 and the gap fill pattern 250 may be exposed in the first and the second cell areas C1 and C2. The dummy gate structure 200, the gate spacer 240 and the gap fill pattern 250 may be broken by the cutting pattern CP and may be separated by a unit of the cell area C.

Referring to FIGS. 19 and 20A to 20D, the gap fill pattern 250 may be removed from the substrate 100 in the cell area C and the active fin 110 and the device isolation layer 120 may be exposed through an inter-spacer hole ISH.

For example, the gap fill pattern 250 may be removed from the substrate 100 by an etching process using the dummy gate electrode pattern 220, the gate spacer 240 as an etch mask. Since the dummy gate electrode pattern 220 may include polysilicon and the gate spacer 240 may include silicon nitride while the gap fill pattern 250 may include silicon oxide, the etching process may be conducted in such a way that the etch rate of the silicon oxide may be sufficiently higher than those of the polysilicon and the silicon nitride.

Therefore, the inter-spacer trench IST may be formed into the inter-spacer hole ISH that may be defined by the gate spacer 240 in the cell area C and the cutting pattern CP in the power area PA. The active fin 110 and the device isolation layer 120 may be exposed through the inter-spacer hole ISH.

For example, the active fin 110 in the inter-spacer hole ISH may be further etched away in the etching process for removing the gap fill pattern 250, so that an upper portion of the upper fin 110b may be removed to thereby form an active recess AR. Thus, the upper fin 110b of the inter-spacer hole ISH may have a height that is smaller than that of the upper fin 110b of the dummy gate structure 200.

Referring to FIGS. 21 and 22A to 22D, the junction layer 300 may be formed on the active fin 110 and the device isolation layer 120 in the inter-spacer hole ISH.

For example, a selective epitaxial growth (SEG) process may be conducted in the inter-spacer hole ISII by using the upper fin 110b as a seed, thereby forming an epitxial layer in the inter-spacer hole ISH as the junction layer 300.

In an exemplary embodiment, a silicon source gas such as a disilane ($Si_2H_6$) gas and a carbon source gas such as a SiH3CH3 gas may be provided for the SEG process and a single crystalline silicon carbide (SiC) layer may be formed on the active fin 110 and the device isolation layer 120 as the junction layer 300. Otherwise, the silicon source gas may be provided exclusively for the SEG process, and a single crystalline silicon (Si) layer may be formed on the active fin 110 and the device isolation layer 120 as the junction layer 300.

In such a case, an n-type impurity source gas such as a phosphine (PH3) gas may be provided in the SEG process together with the silicon source gas and/or the carbon source gas, and the single crystalline silicon carbide (SiC) layer and the single crystalline silicon (Si) layer may be doped with the n-type impurities. Therefore, the junction layer 300 doped with the n-type impurities may function as source/drain electrodes for the NMOS transistor in the NMOS area N.

In an exemplary embodiment, a silicon source gas such as a dichlorosilane ($H_2SiCl_2$) gas and a germanium source gas such as a germanium tetrahydride ($GeH_4$) gas may be provided for the SEG process and a single crystalline silicon germanium (SiGe) layer may be formed on the active fin 110 and the device isolation layer 120 as the junction layer 300.

In such a case, a p-type impurity source gas such as a diborane ($B_2H_6$) gas may be provided in the SEG process together with the silicon source gas and the germanium source gas, and the single crystalline silicon germanium (SiGe) layer may be doped with the p-type impurities. Therefore, the junction layer 300 doped with the p-type impurities may function as source/drain electrodes for the PMOS transistor in the PMOS area P.

The junction layer 300 may be grown in an isotropic behavior along horizontally and vertically, so that the junction layer 300 may substantially fill up the active recess AR as well as growing in the second direction II in the inter-spacer hole ISH. For example, the cross sectional surface of the junction layer 300 may be formed into a pentagonal/hexagonal shape.

When the neighboring active fins 110 may be sufficiently adjacent to each other in the PMOS area P and the NMOS area N, the neighboring junction layer 300 on the neighboring active fins 110 may be connected to each other in the second direction II. Thus, the junction layer 300 may be formed into broken line pieces in the PMOS area P and the NMOS area N.

As described above, the single active fin 110 in the PMOS area P and the NMOS area N represents a plurality of the active fins 110 that may be spaced apart from each other in the second direction II. Therefore, the junction layer 300 may be sparsely arranged on the active fin or may be arranged in a line across a plurality of the active fins 110 in the second direction II.

The junction layer 300 may be grown horizontally into the separation area PNS from the peripheral portion of the NMOS area N and the PMOS areas P in the second direction II. For example, the junction layer 300 in the first cell area C1 may be grown horizontally into the first separation area PNS1 and the junction layer 300 in the second cell area C2 may be grown horizontally into the second separation area PNS2 in the second direction II.

For example, when the junction layer 300 may be grown in the second direction II around the power area PA, the horizontal growth may be restricted by the cutting pattern CP and may be forced to transform into the vertical growth along the side surface of the cutting pattern CP in the third direction III.

Thus, the junction layer 300 around the power area PA may be grown vertically to a greater extent than the junction layer 300 that is farther from the power area PA, and as a result, the size of the junction layer 300 may be greater around the power area PA than around the power area PA. In addition, the junction layer 300 may have the flat portion A making surface contact with the cutting pattern CP.

For example, since the epitaxial growth may occur in the isotropic behavior, the junction layer 300 may be slanted upwards from the active fin 110 to the cutting pattern CP and an air gap AG may be generated between the cutting pattern CP and the junction layer 300 adjacent to the cutting pattern CP. The air gap may also be generated between the neighboring junction layers 300 in the PMOS area P and the NMOS area N due to the isotropic behavior of the SEG process.

The size of the flat portion A may be varied according to the process conditions of the SEG process. As described hereinafter, since the flat portion A may make contact with the power contact 620, the contact resistance between the junction layer 300 and the contact structure 600 may be reduced as the size of the flat portion A may increase.

When the vertical epitaxial growth of the junction layer 300 may be non-uniform or unstable along the side surface of the cutting pattern CP, the flat portion A of the junction layer 300 may be formed non-uniformly along the side surface of the cutting pattern CP. For example, when the vertical epitaxial growth may be insufficiently conducted on the side surface of the cutting pattern CP, the flat portion A may make point contact with the cutting pattern CP. In such a case, the flat portion A may be composed of all the contact points between the junction layer 300 and the cutting pattern CP.

Since the junction layer 300 that is farther from the cutting pattern CP may have no growth restrictor such as the cutting pattern CP in the second direction II, the junction layer 300 that is farther from the cutting pattern CP may be grown horizontally as well as grown vertically without any substantial limitations. Thus, the connecting portion between the neighboring junction layers 300 may have a smaller size than the flat portion A between the junction layer 300 and the cutting pattern CP. For example, when the neighboring active fins 110 may be sufficiently spaced apart from each other in the second direction or the active fin 110 may be arranged around the separation area PNS, the junction layer 300 may have a point portion B due to the non-restricted isotropic epitaxial growth behavior.

In addition, since the junction layer 300 around the cutting pattern CP may be connected to the power rail 700 via the power contact 620, which will be described in detail hereinafter, the size increase of the junction layer 300 around the cutting pattern CP may increase the process margin for forming the power contact 620.

When the conventional semiconductor devices are reduced in size according to the recent device trends, the power area PA may also be reduced in size, and as a result, the junction layers separated from each other by the power area PA may be interconnected to each other across the power area PA. However, according to an exemplary embodiment of the present invention, the junction layers 300 in the first and the second cell areas C1 and C2 may be sufficiently separated from each other by the cutting pattern CP in the power area PA although the size of the power area PA may be reduced in size. Accordingly, an electric short of the junction layer 300 between the first and the second cell areas C1 and C2 may be substantially prevented in the semiconductor device, thereby increasing the yield of the semiconductor device.

Referring to FIGS. 23 and 24A to 24D, the dummy gate structure 200 may be removed from the substrate 100, thereby forming a gate trench extending in the second direction II and defined by the gate spacer 240.

An insulation layer may be formed on the substrate 100 having the junction layer 300 to a sufficient thickness for filling up the inter-spacer hole ISH. Thus, the gate spacer 240 and the dummy gate structure 200 may be at least partially covered with the insulation layer. For example, the insulation layer may include an oxide such as silicon oxide (SiO).

Then, the insulation layer may be planarized by the CMP process or the etch-back process until the upper surfaces of the dummy gate electrode pattern 220 and the gate spacer 240. Thus, the insulation layer may exclusively remain in the inter-spacer hole ISH and may be formed into the insulation pattern 400. Thus, the junction layer 300 may be at least partially covered with the insulation pattern 400.

Due to the planarization process, an upper surface of the insulation pattern 400 may be coplanar with the upper surface of the dummy gate electrode pattern 220 and the gate spacer 240.

Thereafter, the dummy gate structure 200 may be removed from the substrate 100 and the device isolation layer 120 and the active fin 110 may be exposed through an opening defined by the gate spacer 240 and the cutting pattern CP, thereby forming the gate trench extending in the second direction 11 in the cell area C.

For example, since the dummy gate electrode pattern 220 may include polysilicon and the dummy gate insulation pattern 210 may include silicon oxide, a dry etching process or a wet etching process may be conducted for removing the dummy gate electrode pattern 220 and the dummy gate insulation pattern 210 by using the gate spacer 240 and the cutting pattern CP as an etch mask. In the etching process for removing the dummy gate electrode pattern 220 and the dummy gate insulation pattern 210, damage to the junction layer 300 may be prevented from occurring due to the insulation pattern 400.

The gate trench may be defined by the gate spacer 240 in the first direction I and by the cutting pattern CP in the second direction II. The device isolation layer 120 and the active fin 110 may be exposed through the gate trench.

Referring to FIGS. 25 and 26A to 26D, the gate structure 500 may be formed in the gate trench.

For example, a gate insulation layer and a work function control layer may be sequentially formed on the substrate 100 along a surface profile of the gate trench and a gate electrode layer may be formed on the work function control layer in such a way that the gate trench may be sufficiently filled with the gate electrode layer. In a modified exemplary embodiment, an interface layer may be further formed between the active fin 110 and the gate insulation layer.

The gate insulation layer may include a high dielectric metal oxide such as hafnium oxide ($HfO_2$), tantalum oxide ($Ta_2O_5$), zirconium oxide ($ZrO_2$). The work function control layer may include a metal nitride such as titanium nitride (TiN), titanium aluminum nitride (TiAlN), tantalum nitride (TaN), tantalum aluminum nitride (TaAlN) or a metal alloy such as titanium aluminide (TiAL). Further, the gate electrode layer may include a lower resistive metal and a nitride of the lower resistive metal. Examples of the low resistive metal may include aluminum (Al), copper (Cu), tantalum (Ta), titanium, (Ti), and other metals having similar electrical resistances. These may be used alone or in combinations thereof. The work function control layer and the gate electrode layer may be formed by one of the chemical vapor deposition (CVD) process, the atomic layer deposition (ALD) process and a physical vapor deposition (PVD) process. Thereafter, a heat treatment such as a rapid thermal annealing (RTA), a spike RTA, a flash RTA and a laser annealing may be further conducted to the gate electrode layer.

Then, the gate electrode layer, the work function control layer and the gate insulation layer may be planarized until the upper surfaces of the insulation pattern 400 and the cutting pattern CP may be exposed, thereby forming a gate insulation pattern 510, a work function control pattern 520 and a gate electrode 530 that may be sequentially formed on the active fin 110 and the device isolation layer 120 and may fill up the gate trench as the gate structure 500. The gate electrode 530 may be at least partially enclosed by the work function control pattern 520 in the gate trench. The gate structure 500 may be arranged in the gate trench and may be formed into the gate line GL extending in the second direction II in the cell area C.

The gate structure 500 and the junction layer 300 in the PMOS area P may constitute the PMOS transistor and the gate structure 500 and the junction layer 300 in the NMOS area N may constitute the NMOS transistor. In the present exemplary embodiment, the gate structure 500 may protrude from the device isolation layer 120 for enlarging the channel area of transistor, and thus the PMPS transistor and the NMOS transistor may be provided as finFET devices.

The gate structures 500 in the first and the second cell areas C1 and C2 may be separated from each other in the second direction II by the cutting pattern CP in the power area PA. As described above, the junction layer 300 in the first and the second cell areas C1 and C2 may also be separated from each other in the second direction II by the cutting pattern CP in the power area PA.

Therefore, an electric short of the gate structures 500 between the first and the second cell areas C1 and C2 may be substantially prevented by the cutting pattern CP and an electric short of the junction layers 300 between the first and the second cell areas C1 and C2 may also be substantially prevented by the same cutting pattern CP.

Referring to FIGS. 27 and 28A to 28E, a first contact hole CTH1 may be formed in the cell area C and a second contact hole CTH2 may be formed in the power area PA. The junction layer 300 in the PMOS area P and the NMOS area N may be exposed through the first contact hole CTH1 and the device isolation layer 200 may be exposed through the second contact hole CTH2.

A gate capping layer and a first interlayer dielectric layer may be sequentially formed on the insulation pattern 400, the gate structure 500 and the cutting pattern CP. Then, the gate capping layer and the first interlayer dielectric layer may be patterned into the gate capping pattern 550 and the first interlayer dielectric pattern ILD1 through which the insulation pattern 400 and the cutting pattern CP may be exposed. For example, the gate structure 500 and the gate spacer 240 may be at least partially covered by the gate capping pattern 550 and the gate capping pattern 500 may be at least partially covered with the first interlayer dielectric pattern ILD1.

In the present exemplary embodiment, the gate insulation pattern 510 may include a nitride such as silicon nitride (SiN) and the first interlayer dielectric pattern ILD1 may include substantially the same materials as the insulation pattern 400. However, the first interlayer dielectric pattern ILD1 may include insulation materials different from the insulation pattern 400.

Thereafter, a peripheral portion of the cutting pattern CP may be removed from a peripheral portion of the power area PA, thereby forming the second contact hole CTH2 through which the device isolation layer 120 may be exposed in the power area PA. Thus, the cutting pattern CP may be formed into the junction cutting pattern CP2 having a reduced width as much as the size of the second contact hole CTH2. The junction cutting pattern CP2 may be arranged at a central portion of the power area PA close to the insulation pattern 400. In contrast, the cutting pattern CP close to the gate structure 500 might not be removed from the power area PA and thus the width of cutting pattern CP may be unchanged. The unreduced cutting pattern CP close to the gate structure 500 may be referred to as the gate cutting pattern CP1 as compared with the junction cutting pattern CP2.

Thereafter, the insulation pattern 400 may be partially removed from the NMOS area N and the PMOS area P, thereby forming the first contact hole CTH1 through which the junction layer 300 may be exposed. Thus, the contact hole CTH1 may include a PMOS contact hole PCTH through which the junction layer 300 in the PMOS area P may be exposed and a NMOS contact hole NCTH through which the junction layer 300 in the NMOS area N may be exposed.

For example, the insulation pattern 400 might not be removed from the separation area PNS of the cell area C. For example, the insulation pattern 400 at least partially covering the separation area PNS may remain on the device isolation layer 120 of the separation area PNS. Therefore, the PMOS contact hole PCTH and the NMOS contact hole NCTH may be separated from each other by the insulation pattern 400 in the separation area PNS.

In addition, since the junction cutting pattern CP2 may remain in the central portion of the power area PA, the second contact hole CTH2 may be arranged at both sides of the junction cutting pattern CP2. For example, the second contact hole CTH2 in the first cell area C1 may be symmetrical to the second contact hole CTH2 in the second cell area C2 with respect to the junction cutting pattern CP2.

In a modified exemplary embodiment, a metal silicide layer may be further formed on the junction layer 300 exposed through the first contact hole CTH1.

Referring to FIGS. 29 and 30A to 30E, the first and the second contact holes CTH1 and CTH2 may be filled with conductive materials, thereby forming the contact structure 600 in the first and the second contact holes CTH1 and CTH2.

For example, a barrier layer may be formed on the insulation pattern 400, the first interlayer dielectric pattern ILD1 and bottom and side walls of the first and the second contact holes CTH1 and CTH2 along a surface profile of the first and the second contact holes CTH1 and CTH2. A conductive layer may be formed on the barrier layer to a sufficient thickness for filling up the first and the second contact holes CTH1 and CTH2.

The barrier layer may include a metal such as tantalum and titanium and a nitride thereof, and the conductive layer may include a low resistive metal such as tungsten (W), copper (Cu), and/or aluminum (Al).

The conductive layer and the barrier layer may be planarized until an upper surface of the first interlayer dielectric pattern ILD1 may be exposed, thereby forming a conductive line filling up the first and the second contact holes CTH1 and CTH2 and extending in the second direction II. Thus, the conductive line may pass the cell area C and the power area PA alternately with each other in the second direction II. Thereafter, the conductive line may be further planarized until upper surfaces of the insulation pattern 400 and the junction cutting pattern CP2 may be exposed, thereby forming the contact structure 600 in the PMOS area P and the NMOS area N in such a configuration that an upper surface of the contact structure 600 may be coplanar with the upper surfaces of the upper surfaces of the insulation pattern 400 and the junction cutting pattern CP2.

The contact structure 600 may include the cell contact 610 making contact with the junction layer 300 in the PMOS area P and the NMOS area N and the power contact 620 making contact with the device isolation layer 120 in the power area PA and connected to the cell contact 610 in one body.

The cell contact 610 may be connected to the junction layer 300 in the NMOS area N and the PMOS area P and the power contact 620 may extend to the power area PA from the cell contact 610. For example, a pair of the power contacts 620 may be formed at both sides of the junction cutting pattern CP2 symmetrically with respect to the junction cutting pattern CP2. Thus, the power contact 620 in the first cell area C1 may be separated from the power contact 620 in the second cell area C2, and the junction 300 in the first cell area C1 might not be connected to the power contact 620 in the second cell area C2 although the power area PA may be reduced in size.

As described hereinafter, the power contact 620 may make contact with the power rail 700 from which the power signal may be transferred to the NMOS transistors and the PMOS transistors.

Thus, the junction 300 in the first cell area C1 may be sufficiently separated from the power contact 620 in the second cell area C2 by the junction cutting pattern CP2 and a pair of the power contacts 620 may be arranged in the power area PA in such a configuration that the power contact in the first cell area C1 and the power contact in the second cell area C2 may be simultaneously in contact with the power rail 700. Thus, the power signal may be simultaneously transferred to the first cell area C1 and the second cell area C2 via a pair of the power contacts 620. For example, the transistors in the first cell area C1 and the second cell area C2 may be simultaneously operated through the single power rail 700.

Referring to FIGS. 31 and 32A to 32E, a second interlayer dielectric pattern ILD2 may be formed on the contact structure 600 and the first interlayer dielectric pattern ILD1 and the power rail 700 may be formed on the first interlayer dielectric pattern ILD1 and may make contact with the power contact 620 and the junction cutting pattern CP2.

For example, a second interlayer dielectric layer may be formed on the contact structure 600 and the first interlayer dielectric pattern ILD1 and may be partially removed from the power area PA in such a way that the first interlayer dielectric pattern ILD1, the power contact 620 and the junction cutting pattern CP2 may be exposed, thereby forming a second interlayer dielectric pattern ILD2 having a power trench through which the power contact 620 and the junction cutting pattern CP2 may be exposed.

In the present exemplary embodiment, the second interlayer dielectric pattern ILD2 may include silicon oxide. In a modified exemplary embodiment, the second interlayer dielectric pattern ILD2 may include a low dielectric material such as silicon oxide doped with carbon (C), silicon oxide doped with fluorine (F), porous silicon oxide, an organic polymer and an inorganic polymer such as HSSQ and MSSQ.

Then, a power conductive layer may be formed on the second interlayer dielectric pattern ILD2 to a sufficient thickness for filling up the power trench and may be planarized until an upper surface of the second interlayer dielectric pattern ILD2 may be exposed, thereby forming the power rail 700.

Thus, the power rail 700 may include a power line 720 extending in the first direction I and arranged on the first interlayer dielectric pattern ILD1 and a power plug 710 extending downwards from the power line 720 and making contact with the power contact 620 and the junction cutting pattern CP2.

The power plug 710 may be shaped into a vertical rod and an upper surface of the power plug 710 may have the same level as an upper surface of the first interlayer dielectric pattern ILD1. The power line 720 may be arranged on the first interlayer dielectric pattern ILD1 and the power plug 710 in the first direction I. An external power signal may be applied to the power line 720 and may be transferred to the NMOS and PMOS transistors in the cell area C via the power plug 710 and the power contact 620. For example, the transistors in both of the first cell area C1 and the second cell area C2 may be simultaneously operated by a pair of the power contacts 620.

A plurality of additional interlayer dielectric patterns may be further formed on the second interlayer dielectric pattern ILD2 and the power rail 700 and additional contact structures and wirings may be further formed on the additional interlayer dielectric patterns so as to connect to the transistors in the cell area C.

According to the method of manufacturing the semiconductor devices, the cutting pattern CP may be formed in the power area PA and thus the horizontal growth of the junction layer 300 may be restricted by the cutting pattern CP. Accordingly, the junction layer 300 in the first cell area C1 may be substantially prevented from being connected with the junction layer 300 in the second cell area C2 although the power area PA may be reduced in size, thereby preventing an electric short of the junction layer 300 between the first and the second cell areas C1 and C2.

In addition, the gate structure 500 in the first cell area C1 may also be sufficiently separated from the gate structure 500 in the second cell area C2 by the cutting pattern CP, so that the gate structure 500 in the first cell area C1 may be substantially prevented from being connected with the gate structure 500 in the second cell area C2 although the power area PA may be reduced in size, thereby preventing an electric short of the gate structure 500 between the first and the second cell areas C1 and C2.

Further, a pair of the power contacts 620 may be formed at both sides of the junction cutting pattern CP2, symmetrically with respect to the junction cutting pattern CP2, and thus the power contact 620 in the first cell area C1 may be sufficiently separated from the power contact 620 in the second cell area C2. Therefore, the power contact 620 in the first cell area C1 might not be connected to the power contact 620 in the second cell area C2 due to the junction cutting pattern CP, thereby preventing electric short of the power contacts 620.

Although the power area PA may be reduced in size in accordance with the size reduction of the recent semiconductor devices, the gate structure 500 and the junction layer 300 in different cell area may be sufficiently separated by a unit of the cell area. Thus, an electric short of the gate structure 500 and the junction layer 300 may be substantially prevented in spite of the size reduction of the power area PA.

While the present exemplary embodiment discloses the cutting pattern CP for sufficiently separating the gate structure 500 and the junction layer 300 by the cell area in spite of the size reduction of the power area PA, an electric short of the gate structure 500 and the junction layer 300 may also occur in the separation area PNS in the cell area C. Thus, the separation of the gate structure 500 and the junction layer 300 may also be used between the NMOS area N and the PMSO area P.

FIGS. 33 to 40F are views illustrating processing steps of a method of manufacturing a semiconductor device in accordance with an exemplary embodiment of the present inventive concept. In FIGS. 33 to 40F, odd-numbered figures are plan views illustrating each processing step for the manufacturing method and even-numbered figures are cross sectional views corresponding to the odd-numbered figure. Each figure designated by the subscript 'A' in the drawing number is a cross-sectional view cut along a line A-A' of the semiconductor device shown in FIG. 3, and each figure designated by the subscript 'B' in the drawing number is a cross-sectional view cut along a line B-B' of the semiconductor device shown in FIG. 3. In addition, each figure designated by the subscript 'C' in the drawing number is a cross-sectional view cut along a line C-C' of the semiconductor device shown in FIG. 3, and each figure designated by the subscript 'D' in the drawing number is a cross-sectional view cut along a line D-D' of the semiconductor device shown in FIG. 3. Each figure designated by the subscript 'E' in the drawing number is a cross-sectional view cut along a line E-E' of the semiconductor device shown in FIG. 3, and each figure designated by the subscript 'F' in the drawing number is a cross-sectional view cut along a line F-F' of the semiconductor device shown in FIG. 3.

Referring to FIGS. 33 and 34A to 34D, the gate trench may be formed on the substrate 100 by the same processes as described in detail with references to FIGS. 5 to 24D and then a separating opening SO may be formed in the separation area PNS.

For example, an additional mask pattern AMP may be formed on a whole surface of the substrate 100 having the gate trench in such a way that the PMOS area P, the NMOS area N and the power area PA may be at least partially covered with the additional mask pattern AMP and the separation area PNS may be partially or wholly exposed through the additional mask pattern AMP. In such a case, the gate trench may be filled with the additional mask pattern AMP.

Then, the gate spacer 240 and the insulation pattern 400 may be partially or wholly removed from the substrate 100 by a dry etching process using the additional mask pattern AMP as an etch mask, thereby forming the separating opening SO through which the device isolation layer 120 may be exposed.

For example, the separating opening SO may be disposed across the gate trench and the junction layer 300 in the first direction I. The junction layer 300 in the PMOS area P may extend in the separation area PNS and the junction layer 300 in the NMOS area N may extend in the separation area PNS, and the separating opening SO may be formed in the gap space between a pair of the junction layers 300.

When the size of the cell area C may be reduced, the gate structures 500 of the PMOS area P and the NMOS area N may be connected to each other in the separation area PNS and the junction layers 300 of the PMOS area P and the NMOS area N may be connected to each other in the separation area PNS. Thus, when the cell area C may be reduced in size, an electric short of the gate structure 500 and the junction layer 300 may occur in the separation area PNS.

However, according to exemplary embodiments of the present invention, a separation pattern SP may be provided in the separation area PNS for sufficiently separating the gate structure 500 and the junction layer 300 in the PMOS area P from the gate structure 500 and the junction layer 300 in the NMOS area N, thereby preventing an electric short between the gate structures 500 and the junction layers 300 in different cell area C.

Referring to FIGS. 35 and 36A to 36D, a separating pattern SP may be formed in the separating opening SO for separating the PMOS area P and the NMOS area N in the cell area C.

For example, an additional gap fill layer may be formed on the additional mask pattern AMP to a sufficient thickness for filling the separating opening SO, and then the additional gap fill layer may be planarized until upper surfaces of the insulation pattern 400 and the cutting pattern CP may be exposed. Thus, the additional gap fill layer may remain exclusively in the separating opening SO, thereby forming the separating pattern SP in the separating opening SO and the PMOS area P and the NMOS area N may be sufficiently separated from each other by the separating pattern SP.

The separating pattern SP may include the same materials as the cutting pattern CP. Thus, the separating pattern SP may include silicon nitride (SiN), silicon oxynitride (SiON), and/or silicon carbon oxynitride (SiOCN).

Thereafter, the additional mask pattern AMP may be removed from the substrate 100 and the gate trench may be exposed again.

Referring to FIGS. 37 and 38A to 38D, the gate structure 500 may be formed in the gate trench.

For example, a gate insulation layer and a work function control layer may be sequentially formed on the substrate 100 along a surface profile of the gate trench and a gate electrode layer may be formed on the work function control layer in such a way that the gate trench may be sufficiently filled with the gate electrode layer. Thus, the active fin 110, the device isolation layer 120, the gate spacer 240, the insulation pattern 400, the cutting pattern CP and the separating pattern SP may be at least partially covered by the gate insulation layer, work function control layer, and the gate electrode layer. In a modified exemplary embodiment, an interface layer may be further formed between the active fin 110 and the gate insulation layer.

Then, the gate electrode layer, the work function control layer and the gate insulation layer may be planarized until the upper surfaces of the insulation pattern 400, the separating pattern SP and the cutting pattern CP may be exposed, thereby forming a gate insulation pattern 510, a work function control pattern 520 and a gate electrode 530 that may be sequentially formed on the active fin 110 and the device isolation layer 120 and may fill up the gate trench as the gate structure 500. The gate electrode 530 may be at least partially enclosed by the work function control pattern 520 in the gate trench. The gate structure 500 may be arranged in the gate trench and may be formed into the gate line GL extending in the second direction II in the cell area C.

For example, the gate structure 500, extending from the PMOS area P, may be sufficiently separated from the gate structure 500, extending from the NMOS area N, by the separation pattern SP. Thus, an electric short of the gate structures 500 in the separation area PNS may be substantially prevented by the separating pattern SP.

The gate structure 500 may be formed substantially by the same processes as described above in detail with references to FIGS. 23 to 24D, so to the extent that any further detailed descriptions of various elements is omitted, it may be assumed that these elements are at least similar to corresponding elements that have already been described.

Thereafter, as illustrated in FIGS. 39 and 40A to 40F, the contact structure 600, the first interlayer dielectric pattern ILD1, the second interlayer dielectric pattern ILD2 and the power rail 700 may be formed substantially by the same processes as described in detail with references to FIGS. 27 to 32E, so to the extent that any further detailed descriptions on the method of forming the contact structure 600, the first interlayer dielectric pattern ILD1, the second interlayer dielectric pattern ILD2 and the power rail 700, is omitted, it may be assumed that these elements are at least similar to corresponding elements that have already been described.

Therefore, the gate structure 500 and the junction layer 300 may be sufficiently separated from each other in the separation area PNS by the separating pattern SP. Thus, the NMOS transistor and the PMOS transistor may be sufficiently separated from each other in the separation area PNS by the separating pattern SP in spite of the size reduction of the cell area C.

According to the exemplary embodiments of the present inventive concept, the cutting pattern CP may be formed in the power area PA and thus the horizontal growth of the junction layer 300 may be restricted by the cutting pattern CP. Accordingly, the junction layer 300 in the first cell area C1 may be sufficiently separated from the junction layer 300 in the second cell area C2 although the power area PA may be reduced in size, thereby preventing an electric short of the junction layer 300 between the first and the second cell areas C1 and C2.

In addition, the gate structure 500 in the first cell area C1 may also be sufficiently separated from the gate structure 500 in the second cell area C2 by the cutting pattern CP, so that the gate structure 500 in the first cell area C1 may be substantially prevented from being connected with the gate structure 500 in the second cell area C2 although the power area PA may be reduced in size, thereby preventing an electric short of the gate structure 500 between the first and the second cell areas C1 and C2.

Further, the gate structure 500 and the junction layer 300 may be sufficiently separated from each other in the separation area PNS by the separating pattern SR Thus, the NMOS transistor and the PMOS transistor may be sufficiently separated from each other in the separation area PNS by the separating pattern SP in spite of the size reduction of the cell area C. The semiconductor device may be formed into a CMOS device with high reliability and stability.

Furthermore, a pair of the power contacts 620 may be formed at both sides of the junction cutting pattern CP2 symmetrically with respect to the junction cutting pattern CP2, and thus the power contact 620 in the first cell area C1 may be sufficiently separated from the power contact 620 in the second cell area C2. Therefore, the power contact 620 in the first cell area C1 might not be connected to the power contact 620 in the second cell area C2 due to the junction cutting pattern CP, thereby preventing electric short of the power contacts 620.

Although the power area PA may be reduced in size in accordance with the size reduction of the recent semiconductor devices, the gate structure 500 and the junction layer 300 in different cell area may be sufficiently separated by a unit of the cell area. Thus, an electric short of the gate structure 500 and the junction layer 300 may be substantially prevented in spite of the size reduction of the power area PA.

For example, when the CMOS device having the cutting pattern in the power area PA and/or the separating pattern SP in the separation area PNS may be stored into a standard cell library as a CMOS standard cell, the logic device requiring CMOS cells may be stably manufactured with high reliability by using the CMOS standard cell and electric shorts in the power area PA and the separation area PNS may be sufficiently reduced in the logic device.

The foregoing is illustrative of exemplary embodiments of the present invention and the present invention should not be construed as being limited to the embodiments shown. Although a few exemplary embodiments have been described, those skilled in the art will readily appreciate that many modifications are possible in the exemplary embodiments shown without materially departing from the novel teachings and aspects of the present invention. Accordingly, all such modifications are intended to be included within the scope of the present disclosure.

What is claimed is:

1. A semiconductor device comprising:
   a substrate including a first region, a second region and a third region, the second region being disposed between the first region and the third region;
   a first fin disposed on the first region of the substrate;
   a second fin disposed on the first region of the substrate;
   a third fin disposed on the third region of the substrate;
   a fourth fin disposed on the third region of the substrate;
   a first isolation disposed on the first region of the substrate, and disposed between the first fin and the second fin;
   a second isolation disposed on the substrate, and disposed between the second fin and the third fin;
   a third isolation disposed on the third region of the substrate, and disposed between the third fin and the fourth fin;
   a first gate disposed on the first fin, the second fin, the first isolation and the second isolation;
   a second gate disposed on the third fin, the fourth fin, the second isolation and the third isolation;
   a third gate disposed on the first fin, the second fin, the first isolation and the second isolation;

a fourth gate disposed on the third fin, the fourth fin, the second isolation and the third isolation;
a first epitaxial source/drain disposed on the first fin, and disposed between the first gate and the third gate;
a second epitaxial source/drain disposed on the second fin, and disposed between the first gate and the third gate;
a third epitaxial source/drain disposed on the third fin, and disposed between the second gate and the fourth gate;
a fourth epitaxial source/drain disposed on the fourth fin, and disposed between the second gate and the fourth gate;
a first contact disposed on the first epitaxial source/drain;
a second contact disposed on the second epitaxial source/drain;
a third contact disposed on the third epitaxial source/drain;
a fourth contact disposed on the fourth epitaxial source/drain;
a first insulation pattern disposed on the first isolation, and disposed between the first contact and the second contact, and between the first epitaxial source/drain and the second epitaxial source/drain;
a second insulation pattern disposed on the third isolation, and disposed between the third contact and the fourth contact, and between the third epitaxial source/drain and the fourth epitaxial source/drain;
a cutting pattern disposed on the second isolation; and
a power rail disposed on the cutting pattern,
wherein the cutting pattern is disposed between the first gate and the second gate, between the third gate and the fourth gate, between the second epitaxial source/drain and the third epitaxial source/drain, and between the second contact and the third contact,
the cutting pattern is disposed on the second region of the substrate,
each of the first epitaxial source/drain, the second epitaxial source/drain, the third epitaxial source/drain and the fourth epitaxial source/drain is asymmetrically shaped with respect to a vertical central line perpendicular to the substrate, and
a bottom surface of the power rail is disposed higher than a top surface of the first gate.

2. The semiconductor device of claim 1, wherein each of the first region of the substrate and the third region of the substrate is a cell region, and the second region of the substrate is a power region.

3. The semiconductor device of claim 1, wherein the first gate and the second gate are aligned in a first direction, and
the third gate and the fourth gate are aligned in a second direction.

4. The semiconductor device of claim 1, wherein a first sidewall of the first insulation pattern includes a concave portion that contacts the first epitaxial source/drain.

5. The semiconductor device of claim 1, further comprising a fifth contact disposed on the second isolation and on a first sidewall of the cutting pattern, the fifth contact contacting the second contact and the second epitaxial source/drain.

6. The semiconductor device of claim 5, wherein the power rail contacts the fifth contact.

7. The semiconductor device of claim 5, wherein a sidewall of the fifth contact includes a protruding portion that contacts the second epitaxial source/drain.

8. The semiconductor device of claim 1, wherein the cutting pattern completely separates the first gate and the second gate such that a top portion of the first gate is separated from a top portion of the second gate by the cutting pattern, and a bottom portion of the first gate is separated from a bottom portion of the second gate by the cutting pattern.

9. The semiconductor device of claim 1, further comprising an interlayer dielectric pattern disposed on the first gate, the second gate and the cutting pattern,
wherein the power rail is disposed on the interlayer dielectric pattern.

10. A semiconductor device comprising:
a substrate including a first region, a second region and a third region, the second region being disposed between the first region and the third region;
a first fin disposed on the first region of the substrate;
a second fin disposed on the first region of the substrate;
a third fin disposed on the third region of the substrate;
a fourth fin disposed on the third region of the substrate;
a first isolation disposed on the first region of the substrate, and disposed between the first fin and the second fin;
a second isolation disposed on the substrate, and disposed between the second fin and the third fin;
a third isolation disposed on the third region of the substrate, and disposed between the third fin and the fourth fin;
a first gate disposed on the first fin, the second fin, the first isolation and the second isolation;
a second gate disposed on the third fin, the fourth fin, the second isolation and the third isolation;
a third gate disposed on the first fin, the second fin, the first isolation and the second isolation;
a fourth gate disposed on the third fin, the fourth fin, the second isolation and the third isolation;
a first epitaxial source/drain disposed on the first fin, and disposed between the first gate and the third gate;
a second epitaxial source/drain disposed on the second fin, and disposed between the first gate and the third gate;
a third epitaxial source/drain disposed on the third fin, and disposed between the second gate and the fourth gate;
a fourth epitaxial source/drain disposed on the fourth fin, and disposed between the second gate and the fourth gate;
a first contact disposed on the first epitaxial source/drain;
a second contact disposed on the second epitaxial source/drain;
a third contact disposed on the third epitaxial source/drain;
a fourth contact disposed on the fourth epitaxial source/drain;
a fifth contact disposed on the second isolation and on a first sidewall of the cutting pattern, the fifth contact contacting the second contact and the second epitaxial source/drain;
a sixth contact disposed on the second isolation and on a second sidewall of the cutting pattern, the sixth contact contacting the third contact and the third epitaxial source/drain;
a first insulation pattern disposed on the first isolation, and disposed between the first contact and the second contact, and between the first epitaxial source/drain and the second epitaxial source/drain;
a second insulation pattern disposed on the third isolation, and disposed between the third contact and the fourth contact, and between the third epitaxial source/drain and the fourth epitaxial source/drain;

a cutting pattern disposed on the second isolation and including an insulation material; and a power rail disposed on the cutting pattern, and contacting the fifth contact and the sixth contact, wherein the cutting pattern is disposed between the first gate and the second gate, between the third gate and the fourth gate, between the second epitaxial source/drain and the third epitaxial source/drain, and between the second contact and the third contact, the cutting pattern is disposed on the second region of the substrate, the cutting pattern completely separates the first gate and the second gate such that a top portion of the first gate is separated from a top portion of the second gate by the cutting pattern, and a bottom portion of the first gate is separated from a bottom portion of the second gate by the cutting pattern, and the first region of the substrate includes a p-type metal oxide semiconductor (PMOS) region and an n-type metal oxide semiconductor (NMOS) region.

11. The semiconductor device of claim 10, wherein each of the first epitaxial source/drain, the second epitaxial source/drain, the third epitaxial source/drain and the fourth epitaxial source/drain is asymmetrically shaped with respect to a vertical central line perpendicular to the substrate.

12. The semiconductor device of claim 10, wherein a bottom surface of the power rail is disposed higher than a top surface of the first gate.

13. The semiconductor device of claim 10, further comprising an interlayer dielectric pattern disposed on the first gate, the second gate and the cutting pattern, wherein the power rail is disposed on the interlayer dielectric pattern.

14. The semiconductor device of claim 10, wherein a first sidewall of the first insulation pattern includes a concave portion that contacts the first epitaxial source/drain, and a first sidewall of the fifth contact includes a protruding portion that contacts the second epitaxial source/drain.

15. A semiconductor device comprising:

a substrate including a first region, a second region and a third region, the second region being disposed between the first region and the third region;

a first fin disposed on the first region of the substrate;

a second fin disposed on the first region of the substrate;

a third fin disposed on the third region of the substrate;

a fourth fin disposed on the third region of the substrate;

a first isolation disposed on the first region of the substrate, and disposed between the first fin and the second fin;

a second isolation disposed on the substrate, and disposed between the second fin and the third fin;

a third isolation disposed on the third region of the substrate, and disposed between the third fin and the fourth fin;

a first gate disposed on the first fin, the second fin, the first isolation and the second isolation;

a second gate disposed on the third fin, the fourth fin, the second isolation and the third isolation;

a third gate disposed on the first fin, the second fin, the first isolation and the second isolation;

a fourth gate disposed on the third fin, the fourth fin, the second isolation and the third isolation;

a first epitaxial source/drain disposed on the first fin, and disposed between the first gate and the third gate;

a second epitaxial source/drain disposed on the second fin, and disposed between the first gate and the third gate;

a third epitaxial source/drain disposed on the third fin, and disposed between the second gate and the fourth gate;

a fourth epitaxial source/drain disposed on the fourth fin, and disposed between the second gate and the fourth gate;

a first contact disposed on the first epitaxial source/drain;

a second contact disposed on the second epitaxial source/drain;

a third contact disposed on the third epitaxial source/drain;

a fourth contact disposed on the fourth epitaxial source/drain;

a fifth contact disposed on the second isolation and on a first sidewall of a cutting pattern, the fifth contact contacting the second contact and the second epitaxial source/drain;

a sixth contact disposed on the second isolation and on a second sidewall of the cutting pattern, the sixth contact contacting the third contact and the third epitaxial source/drain;

a first insulation pattern disposed on the first isolation, and disposed between the first contact and the second contact, and between the first epitaxial source/drain and the second epitaxial source/drain;

a second insulation pattern disposed on the third isolation, and disposed between the third contact and the fourth contact, and between the third epitaxial source/drain and the fourth epitaxial source/drain;

the cutting pattern disposed on the second isolation and including an insulation material;

an interlayer dielectric pattern disposed on the first gate, the second gate and the cutting pattern; and a power rail disposed on the interlayer dielectric pattern, and contacting the fifth contact and the sixth contact, the power rail being disposed on the cutting pattern, wherein the cutting pattern is disposed between the first gate and the second gate, between the third gate and the fourth gate, between the second epitaxial source/drain and the third epitaxial source/drain, and between the second contact and the third contact, the cutting pattern is disposed on the second region of the substrate, a first sidewall of the first insulation pattern includes a concave portion that contacts the first epitaxial source/drain, a first sidewall of the fifth contact includes a protruding portion that contacts the second epitaxial source/drain, the first gate and the second gate are aligned in a first direction, and the third gate and the fourth gate are aligned in a second direction.

16. The semiconductor device of claim 15, wherein a bottom surface of the power rail is disposed higher than a top surface of the first gate.

17. The semiconductor device of claim 15, wherein the cutting pattern completely separates the first gate and the second gate such that a top portion of the first gate is separated from a top portion of the second gate by the cutting pattern, and a bottom portion of the first gate is separated from a bottom portion of the second gate by the cutting pattern.

18. The semiconductor device of claim 15, wherein each of the first epitaxial source/drain, the second epitaxial source/drain, the third epitaxial source/drain and the fourth epitaxial source/drain is asymmetrically shaped with respect to a vertical central line perpendicular to the substrate.

19. The semiconductor device of claim 15, wherein the cutting pattern includes nitride.

\* \* \* \* \*